US012652875B2

(12) United States Patent
Yun et al.

(10) Patent No.: US 12,652,875 B2
(45) Date of Patent: Jun. 9, 2026

(54) IMAGE SENSOR INCLUDING PLANAR NANO-PHOTONIC MICROLENS ARRAY AND ELECTRONIC DEVICE INCLUDING THE IMAGE SENSOR

(71) Applicant: SAMSUNG ELECTRONICS CO., LTD., Suwon-si (KR)

(72) Inventors: Seokho Yun, Seoul (KR); Sookyoung Roh, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 845 days.

(21) Appl. No.: 17/566,123

(22) Filed: Dec. 30, 2021

(65) Prior Publication Data

US 2022/0208822 A1 Jun. 30, 2022

(30) Foreign Application Priority Data

Dec. 31, 2020 (KR) ........................ 10-2020-0189862

(51) Int. Cl.
  *H10F 39/00* (2025.01)
  *H04N 25/00* (2023.01)
(52) U.S. Cl.
  CPC ......... *H10F 39/8063* (2025.01); *H04N 25/00* (2023.01); *H10F 39/8053* (2025.01)
(58) Field of Classification Search
  CPC .............................. H04N 23/55; H10F 39/063
  (Continued)

(56) References Cited

U.S. PATENT DOCUMENTS 6,327,086 B1 * 12/2001 Unno .................. G03F 7/70058
                                                                 359/569
7,202,896 B2 4/2007 Wako et al.
(Continued)

FOREIGN PATENT DOCUMENTS

CN        1881605 A    12/2006
CN        1938615 A     3/2007
          (Continued)

OTHER PUBLICATIONS

Chen et al., "GaN Metalens for Pixel-Level Full-Color Routing at Visible Light," 2017, American Chemical Society (ACS) Publications—NANO Letters, 17, 6345-6352, https://pubs.acs.org/doi/10.1021/acs.nanolett.7b03135 (Year: 2017) (Year: 2017).*
(Continued)

*Primary Examiner* — Anthony J Daniels
(74) *Attorney, Agent, or Firm* — Sughrue Mion, PLLC

(57) ABSTRACT

Provided is an image sensor including a planar nanophotonic microlens array, and an electronic device including the image sensor. The image sensor includes a planar nanophotonic microlens array including a plurality of planar nanophotonic microlenses, wherein each of the plurality of planar nanophotonic microlenses includes a high refractive index nanostructure including a dielectric material having a first refractive index and a low refractive index nanostructure including a dielectric material having a second refractive index lower than the first refractive index, and wherein each of the plurality of planar nanophotonic microlenses is shifted toward a center portion of the planar nanophotonic microlens array and positioned at a periphery of the planar nanophotonic microlens array.

29 Claims, 44 Drawing Sheets

(58) Field of Classification Search

USPC .......................................................... 348/335

See application file for complete search history.

(56) References Cited

U.S. PATENT DOCUMENTS

| | | | |
|---|---|---|---|
| 7,667,286 B2 | 2/2010 | Toshikiyo et al. | |
| 8,018,508 B2 | 9/2011 | Toshikiyo | |
| 8,076,745 B2 | 12/2011 | Nishiwaki | |
| 9,159,761 B2* | 10/2015 | Kokubun | H01L 25/167 |
| 9,391,105 B2 | 7/2016 | Usuda et al. | |
| 9,466,626 B2* | 10/2016 | Kouyama | H01L 27/14627 |
| 9,860,491 B2 | 1/2018 | Park et al. | |
| 10,136,109 B2 | 11/2018 | Yun et al. | |
| 11,336,851 B2* | 5/2022 | Byun | H01L 27/14627 |
| 2009/0020840 A1* | 1/2009 | Toshikiyo | H01L 27/14685 257/432 |
| 2014/0103478 A1 | 4/2014 | Usuda et al. | |
| 2015/0115383 A1 | 4/2015 | Kokubun | |
| 2017/0077164 A1* | 3/2017 | Kawabata | H01L 27/14625 |
| 2019/0049235 A1 | 2/2019 | Han et al. | |
| 2020/0072668 A1 | 3/2020 | Han et al. | |
| 2020/0098814 A1 | 3/2020 | Yang | |
| 2020/0219925 A1* | 7/2020 | Jang | H01L 27/14627 |
| 2020/0264343 A1 | 8/2020 | Han et al. | |
| 2020/0266230 A1 | 8/2020 | Miyata et al. | |
| 2020/0301053 A1 | 9/2020 | Wang et al. | |
| 2020/0319316 A1 | 10/2020 | Jang et al. | |
| 2021/0124179 A1 | 4/2021 | Yun et al. | |
| 2021/0126030 A1 | 4/2021 | Yun et al. | |
| 2021/0126035 A1 | 4/2021 | Roh et al. | |
| 2021/0270601 A1 | 9/2021 | Han et al. | |
| 2022/0137259 A1* | 5/2022 | Greco | G02B 1/002 359/642 |
| 2022/0137424 A1 | 5/2022 | Lee et al. | |
| 2023/0020980 A1 | 1/2023 | Mun et al. | |
| 2023/0375400 A1 | 11/2023 | Nam et al. | |

FOREIGN PATENT DOCUMENTS

| | | | | | |
|---|---|---|---|---|---|
| CN | 103620782 A | 3/2014 | | | |
| CN | 111095561 A | 5/2020 | | | |
| CN | 113614580 A | 11/2021 | | | |
| EP | 1 736 803 A1 | 12/2006 | | | |
| EP | 1 785 750 A1 | 5/2007 | | | |
| JP | 2006-196503 A | 7/2006 | | | |
| JP | 2008-21866 A | 1/2008 | | | |
| JP | 2009-157390 A | 7/2009 | | | |
| JP | 4733030 B2 | 7/2011 | | | |
| JP | 5950126 B2 | 7/2016 | | | |
| JP | 2017-59589 A | 3/2017 | | | |
| JP | 2018082002 A | * | 5/2018 | | G02B 3/00 |
| KR | 10-2016-0004641 A | 1/2016 | | | |
| KR | 10-2017-0105877 A | 9/2017 | | | |
| KR | 10-2019-0018351 A | 2/2019 | | | |
| KR | 10-2020-0067748 A | 6/2020 | | | |
| KR | 10-2020-0099832 A | 8/2020 | | | |
| KR | 10-2021-0048400 A | 5/2021 | | | |
| KR | 10-2021-0048401 A | 5/2021 | | | |
| WO | 2020/200931 A1 | 10/2020 | | | |

OTHER PUBLICATIONS

Communication dated Feb. 24, 2024, issued by the Korean Patent Office in Korean Application No. 10-2020-0189862.

Communication dated May 2, 2024 issued by the European Patent Office in European Application No. 21218436.0.

Communication dated May 17, 2022, issued by the European Patent Office in European Application No. 21218436.0.

Communication issued Oct. 24, 2023 by the Korean Intellectual Property Office in Korean Patent Application No. 10-2022-0079261.

Communication dated Dec. 22, 2025 issued by the State Intellectual Property Office of P.R. China in counterpart Chinese application No. 202111608221.3.

\* cited by examiner

CENTER DIRECTION                    EDGE DIRECTION

CENTER DIRECTION                    EDGE DIRECTION

CENTER DIRECTION                    EDGE DIRECTION

CENTER DIRECTION                    EDGE DIRECTION

1100

| G | B | G | B | G | B | G | B |
| R | G | R | G | R | G | R | G |
| G | B | G | B | G | B | G | B |
| R | G | R | G | R | G | R | G |
| G | B | G | B | G | B | G | B |
| R | G | R | G | R | G | R | G |

FIG. 24B

| C | M | C | M | C | M | C | M |
|---|---|---|---|---|---|---|---|
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |

FIG. 24C

| R | G | R | G | R | G | R | G |
|---|---|---|---|---|---|---|---|
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |

110

| 111 | 112 | 111 | 112 | 111 | 112 | 111 | 112 |
| 113 | 114 | 113 | 114 | 113 | 114 | 113 | 114 |
| 111 | 112 | 111 | 112 | 111 | 112 | 111 | 112 |
| 113 | 114 | 113 | 114 | 113 | 114 | 113 | 114 |
| 111 | 112 | 111 | 112 | 111 | 112 | 111 | 112 |
| 113 | 114 | 113 | 114 | 113 | 114 | 113 | 114 |

130

ML1

| 131 | 132 | 131 | 132 | 131 | 132 | 131 | 132 |
| 133 | 134 | 133 | 134 | 133 | 134 | 133 | 134 |
| 131 | 132 | 131 | 132 | 131 | 132 | 131 | 132 |
| 133 | 134 | 133 | 134 | 133 | 134 | 133 | 134 |
| 131 | 132 | 131 | 132 | 131 | 132 | 131 | 132 |
| 133 | 134 | 133 | 134 | 133 | 134 | 133 | 134 |

2000

2100

2200

2300

[Security]                2600

2700

IMAGE SENSOR INCLUDING PLANAR NANO-PHOTONIC MICROLENS ARRAY AND ELECTRONIC DEVICE INCLUDING THE IMAGE SENSOR

CROSS-REFERENCE TO RELATED APPLICATION

This application is based on and claims priority under 35 U.S.C. § 119 to Korean Patent Application No. 10-2020-0189862, filed on Dec. 31, 2020, in the Korean Intellectual Property Office, the disclosure of which is incorporated by reference herein in its entirety.

BACKGROUND

1. Field

Example embodiments of the present disclosure relate to an image sensor including a planar nanophotonic microlens array capable of determining an optical curvature profile of a lens surface by using a planar nanostructure, and an electronic device including the image sensor.

2. Description of the Related Art

As an image sensor and an image capturing module are gradually miniaturized, a chief ray angle (CRA) tends to increase at edges of the image sensor. When the CRA increases at the edges of the image sensor, the sensitivity of pixels positioned at the edges of the image sensor is reduced. As a result, the edges of the image may become dark. Further, additional complex color operations for compensating for the darkness of the edges put an additional load on a processor that processes images and deteriorate image processing speed.

SUMMARY

One or more example embodiments provide an image sensor including a planar nanophotonic microlens array configured to more easily determine an optical curvature profile of a lens surface by using a planar nanostructure, and an electronic device including the image sensor.

One or more example embodiments also provide an image sensor including a planar nanophotonic microlens array configured to change an incident angle of incident light incident at a great chief ray angle (CRA) to be close to 90 degrees at an edge of the image sensor.

Additional aspects will be set forth in part in the description which follows and, in part, will be apparent from the description, or may be learned by practice of example embodiments of the disclosure.

According to an aspect of an example embodiment, there is provided an image sensor including a sensor substrate including a plurality of light sensing cells respectively configured to sense light, and a planar nanophotonic microlens array including a plurality of planar nanophotonic microlenses having a nanopattern structure respectively configured to condense light to a corresponding light sensing cell among the plurality of light sensing cells, wherein each of the plurality of planar nanophotonic microlenses includes a high refractive index nanostructure including a first dielectric material having a first refractive index and a low refractive index nanostructure including a second dielectric material having a second refractive index that is lower than the first refractive index, wherein an effective refractive index of each of the plurality of planar nanophotonic microlenses corresponding to a ratio of the high refractive index nanostructure to the low refractive index nanostructure is greatest in a refractive index peak region of each of the plurality of planar nanophotonic microlenses and gradually decreases toward a periphery of the refractive index peak region, and wherein each of the plurality of planar nanophotonic microlenses at a periphery of the planar nanophotonic microlens array is shifted toward a center portion of the planar nanophotonic microlens array.

A boundary between the plurality of planar nanophotonic microlenses may coincide with a boundary between corresponding light sensing cells at the center portion of the planar nanophotonic microlens array.

A distance at which each of the plurality of planar nanophotonic microlenses is shifted toward the center portion of the planar nanophotonic microlens array may increase as a distance of each of the plurality of planar nanophotonic microlenses from the center portion of the planar nanophotonic microlens array increases at the periphery of the planar nanophotonic microlens array.

The refractive index peak region of each of the plurality of planar nanophotonic microlenses at the center portion of the planar nanophotonic microlens array may be provided at the center portion of each of the plurality of planar nanophotonic microlenses.

The refractive index peak region of each of the plurality of planar nanophotonic microlenses at the periphery of the planar nanophotonic microlens array may be shifted toward the center portion of the planar nanophotonic microlens array.

A distance at which the refractive index peak region of each of the plurality of planar nanophotonic microlenses at the periphery of the planar nanophotonic microlens array may be shifted toward the center portion of the planar nanophotonic microlens array increases as a distance of each of the plurality of planar nanophotonic microlenses from the center portion of the planar nanophotonic microlens array increases.

Each of the plurality of planar nanophotonic microlenses may include a first region having a first effective refractive index, a second region provided adjacent to the first region and having a second effective refractive index that is lower than the first effective refractive index of the first region, and a third region provided adjacent to the second region and having a third effective refractive index that is lower than the second effective refractive index of the second region, wherein the first region, the second region, and the third region are provided in concentric circle shapes.

Each of the plurality of planar nanophotonic microlenses at the center portion of the planar nanophotonic microlens array may have a symmetrical effective refractive index distribution with respect to the center portion, and each of the plurality of planar nanophotonic microlenses at the periphery of the planar nanophotonic microlens array may have an asymmetrical effective refractive index distribution with respect to the center portion.

A total area of the plurality of planar nanophotonic microlenses may be less than a total area of the sensor substrate.

Each of the plurality of planar nanophotonic microlenses may include a plurality of high refractive index nanostructures and a plurality of low refractive index nanostructures alternately provided with each other in a concentric circle shape, and a width of each of the plurality of high refractive index nanostructures in a diameter direction may be greatest in the refractive index peak region.

Each of the plurality of planar nanophotonic microlenses may include a plurality of high refractive index nanostructures having a nanopost shape, and a proportion of the plurality of high refractive index nanostructures may be greatest in the refractive index peak region.

Each of the plurality of planar nanophotonic microlenses may include a plurality of high refractive index nanostructures having an arc shape split in a circumferential direction.

Each of the plurality of planar nanophotonic microlenses may include one high refractive index nanostructure having a flat plate shape and a plurality of low refractive index nanostructures having a hole shape.

Each of the plurality of planar nanophotonic microlenses may include a first layer and a second layer provided on the first layer, and a pattern of a high refractive index nanostructure and a pattern of a low refractive index nanostructure in the first layer may be different from a pattern of a high refractive index nanostructure and a pattern of a low refractive index nanostructure in the second layer.

A width of the high refractive index structure in the first layer and a width of the high refractive index nanostructure in the second layer may be the same in the refractive index peak region of each of the plurality of planar nanophotonic microlenses, and a width of the high refractive index nanostructure in the second layer may be less than a width of the high refractive index nanostructure of the first layer in a region other than the refractive index peak region.

The image sensor may further include a spherical microlens provided on each of the plurality of planar nanophotonic microlenses.

A refractive index peak region of each of the plurality of planar nanophotonic microlenses and an optical axis of a spherical microlens that correspond to each other may be aligned to coincide with each other at the center portion of the planar nanophotonic microlens array.

The spherical microlens at the periphery of the planar nanophotonic microlens array may be shifted toward center portion of the planar nanophotonic microlens array with respect to a corresponding planar nanophotonic microlens.

The refractive index peak region of the planar nanophotonic microlens at the periphery of the planar nanophotonic microlens array may be positioned at a center of the planar nanophotonic microlens.

The image sensor may further include a transparent dielectric layer provided between the sensor substrate and the planar nanophotonic microlens array, a thickness of the transparent dielectric layer increasing from the center portion of the planar nanophotonic microlens array to the periphery of the planar nanophotonic microlens array.

The transparent dielectric layer may have an inclined upper surface such that the thickness of the transparent dielectric layer gradually increases from the center portion of the planar nanophotonic microlens array to the periphery of the planar nanophotonic microlens array, and the plurality of planar nanophotonic microlenses may be provided at an angle on the inclined upper surface of the transparent dielectric layer.

The transparent dielectric layer may have a stair shape in which the thickness of the transparent dielectric layer discontinuously increases from the center portion of the planar nanophotonic microlens array to the periphery of the planar nanophotonic microlens array.

The image sensor may further include a transparent dielectric layer provided on the planar nanophotonic microlens array, a thickness of the transparent dielectric layer increasing from the center portion of the planar nanophotonic microlens array to the periphery of the planar nanophotonic microlens array.

The image sensor may further include a spherical microlens array including a plurality of spherical microlenses provided at a center portion of the planar nanophotonic microlens array, wherein the plurality of planar nanophotonic microlens may not be provided at the center portion of the planar nanophotonic microlens array.

The spherical microlens array and the planar nanophotonic microlens array may be provided on a same plane.

A low refractive index nanostructure may be provided at the center portion of the planar nanophotonic microlens array, and the spherical microlens array may be provided on the low refractive index nanostructure at the center portion of the planar nanophotonic microlens array.

The image sensor may further include a color filter layer provided on the sensor substrate, wherein the color filter layer may include a plurality of color filters configured to transmit light of a specific wavelength band and absorb or reflect light of wavelength bands other than the specific wavelength band, and the planar nanophotonic microlens array may be provided on the color filter layer.

The image sensor may further include a transparent spacer layer provided on the planar nanophotonic microlens array, and a color separating lens array provided on the transparent spacer layer, wherein the color separating lens array is configured to change a phase of a first light of a first wavelength and a phase of a second light of a second wavelength of incident light, the first light and the second light being different from each other, such that the light of the first wavelength and the light of the second wavelength propagate in different directions to condense the light of the first wavelength to a first light sensing cell among the plurality of light sensing cells and condense the light of the second wavelength to a second light sensing cell different from the first light sensing cell among the plurality of light sensing cells.

According to another aspect of an example embodiment, there is provided an electronic device including an image sensor configured to convert an optical image into an electrical signal, and a processor configured to control an operation of the image sensor, and to store and output a signal generated by the image sensor, wherein the image sensor includes a sensor substrate including a plurality of light sensing cells respectively configured to sense light, and a planar nanophotonic microlens array including a plurality of planar nanophotonic microlenses having a nanopattern structure respectively configured to condense light a corresponding light sensing cell among the plurality of light sensing cells, wherein each of the plurality of planar nanophotonic microlenses includes a high refractive index nanostructure including a first dielectric material having a first refractive index and a low refractive index nanostructure including a second dielectric material having a second refractive index that is lower than the first refractive index, wherein an effective refractive index of each of the plurality of planar nanophotonic microlenses corresponding to a ratio of the high refractive index nanostructure to the low refractive index nanostructure is greatest in a refractive index peak region of each of the plurality of planar nanophotonic microlenses and gradually decreases toward a periphery of the refractive index peak region, and wherein each of the plurality of planar nanophotonic microlenses at a periphery of the planar nanophotonic microlens array is shifted toward a center portion of the planar nanophotonic microlens array.

According to yet another aspect of an example embodiment, there is provided an image sensor including a sensor substrate including a plurality of light sensing cells respectively configured to sense light, and a planar nanophotonic microlens array including a plurality of planar nanophotonic microlenses having a nanopattern structure respectively configured to condense light to a corresponding light sensing cell among the plurality of light sensing cells, wherein each of the plurality of planar nanophotonic microlenses includes a high refractive index nanostructure including a first dielectric material having a first refractive index and a low refractive index nanostructure including a second dielectric material having a second refractive index that is lower than the first refractive index, wherein an effective refractive index of each of the plurality of planar nanophotonic microlenses corresponding to a ratio of the high refractive index nanostructure to the low refractive index nanostructure is greatest in a refractive index peak region of each of the plurality of planar nanophotonic microlenses and gradually decreases toward a periphery of the refractive index peak region, wherein each of the plurality of planar nanophotonic microlenses at a periphery of the planar nanophotonic microlens array is shifted toward a center portion of the planar nanophotonic microlens array, and wherein the refractive index peak region of each of the plurality of planar nanophotonic microlenses at the periphery of the planar nanophotonic microlens array is shifted toward the center portion of the planar nanophotonic microlens array.

BRIEF DESCRIPTION OF THE DRAWINGS

The above and/or other aspects, features, and advantages of certain example embodiments of the disclosure will be more apparent from the following description taken in conjunction with the accompanying drawings, in which:

FIGS. 24A, 24B, and 24C show examples of various pixel arrangements of a pixel array;

DETAILED DESCRIPTION

Figure 1:
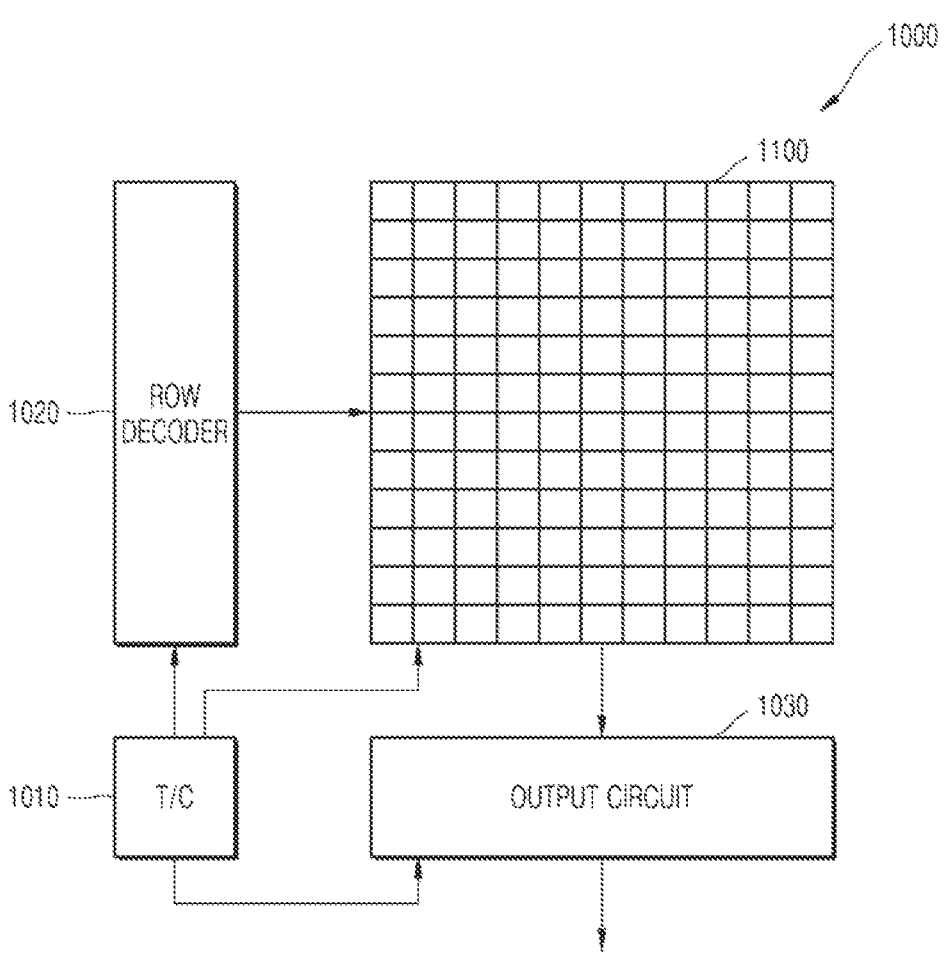
FIG. 1 is a block diagram of an image sensor according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, an image sensor including a planar nanophotonic microlens array and an electronic device including the image sensor will be described in detail with reference to accompanying drawings. The embodiments of the disclosure are capable of various modifications and may be embodied in many different forms. In the drawings, like reference numerals denote like components, and sizes of components in the drawings may be exaggerated for convenience of explanation.

When a layer, a film, a region, or a panel is referred to as being "on" another element, it may be directly on/under/at left/right sides of the other layer or substrate, or intervening layers may also be present.

It will be understood that although the terms "first," "second," etc. may be used herein to describe various components, these components should not be limited by these terms. These components are only used to distinguish one component from another. These terms do not limit that materials or structures of components are different from one another.

An expression used in the singular encompasses the expression of the plural, unless it has a clearly different meaning in the context. It will be further understood that when a portion is referred to as "comprises" another component, the portion may not exclude another component but may further comprise another component unless the context states otherwise.

In addition, the terms such as " . . . unit", "module", etc. provided herein indicates a unit performing a function or operation, and may be realized by hardware, software, or a combination of hardware and software.

The use of the terms of "the above-described" and similar indicative terms may correspond to both the singular forms and the plural forms.

The steps of all methods described herein may also be performed in any suitable order unless otherwise indicated herein or otherwise clearly contradicted by context. The use of all exemplary terms (for example, etc.) is only to describe a technical spirit in detail, and the scope of rights is not limited by these terms unless the context is limited by the claims.

FIG. 1 is a block diagram of an image sensor 1000 according to an example embodiment. Referring to FIG. 1, the image sensor 1000 may include a pixel array 1100, a timing controller 1010, a row decoder 1020, and an output circuit 1030. The image sensor 1000 may include a charge coupled device (CCD) image sensor or a complementary metal oxide semiconductor (CMOS) image sensor.

The pixel array 1100 includes pixels that are two-dimensionally arranged along a plurality of rows and columns. The row decoder 1020 selects one of the rows in the pixel array 1100 in response to a row address signal output from the timing controller 1010. The output circuit 1030 outputs a light sensing signal, in a column unit, from the plurality of pixels arranged in the selected row. To this end, the output circuit 1030 may include a column decoder and an analog-to-digital converter (ADC). For example, the output circuit 1030 may include a plurality of ADCs arranged respectively according to the columns between the column decoder and the pixel array 1100 or one ADC disposed at an output end of the column decoder. The timing controller 1010, the row decoder 1020, and the output circuit 1030 may be implemented as one chip or separate chips. A processor for processing an image signal output from the output circuit 1030 may be implemented as one chip with the timing controller 1010, the row decoder 1020, and the output circuit 1030.

The image sensor 1000 may be applied to various optical devices such as a camera module. For example, FIG. 2 is a conceptual diagram schematically showing a camera module 1880 according to an example embodiment.

Figure 2:
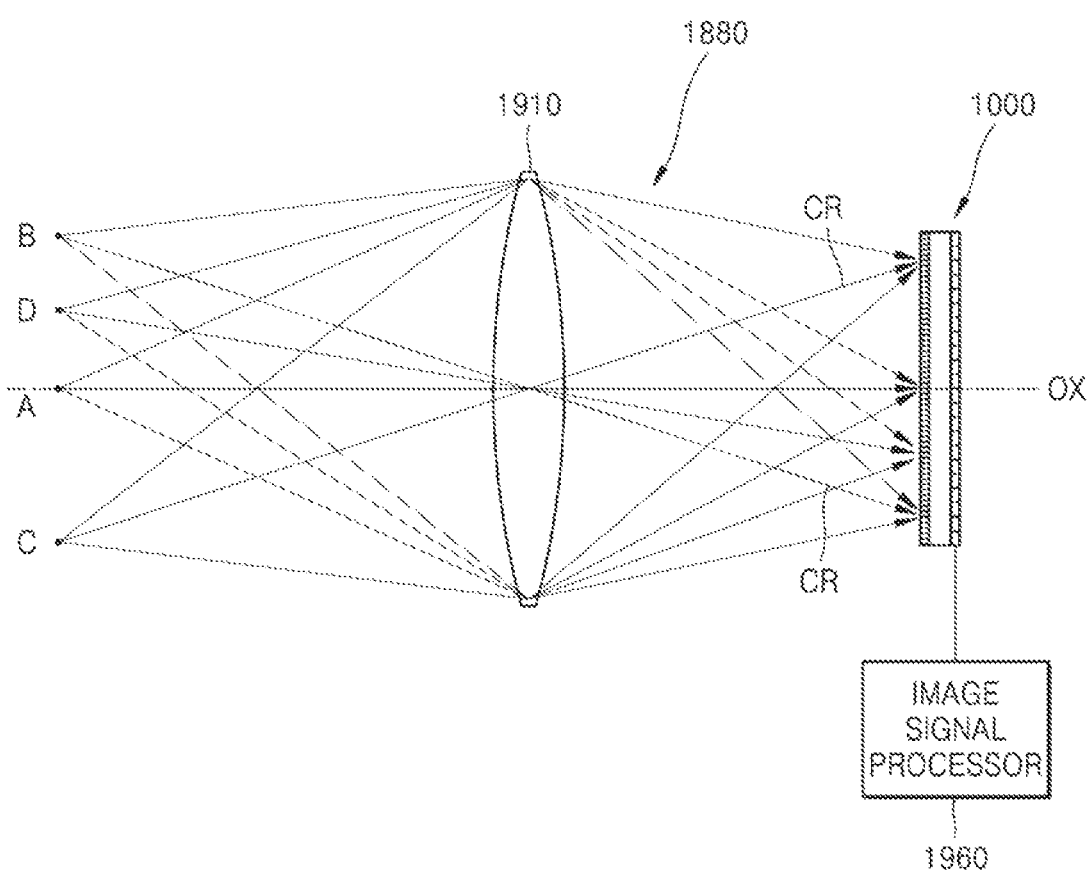
FIG. 2 is a conceptual diagram showing a camera module according to an example embodiment.

Referring to FIG. 2, the camera module 1880 may include a lens assembly 1910 forming an optical image by focusing light reflected from an object, the image sensor 1000 converting the optical image formed by the lens assembly 1910 into an electrical image signal, and an image signal processor 1960 processing the electrical image signal output from the image sensor 1000 as an image signal. The camera module 1880 may further include an infrared ray blocking filter disposed between the image sensor 1000 and the lens assembly 1910, a display panel displaying an image formed by the image signal processor 1960, and a memory storing image data formed by the image signal processor 1960. Such a camera module 1880 may be mounted in a mobile electronic device such as, a cell phone, a laptop, a tablet personal computer (PC), etc.

The lens assembly 1910 serves to focus an image of an object on the outside of the camera module 1880 on the image sensor 1000, more precisely, on the pixel array 1100 of the image sensor 1000. In FIG. 2, one lens is shown as the lens assembly 1910 for convenience, but the lens assembly 1910 may include a plurality of lenses. When the pixel array 1100 precisely positioned on a focus plane of the lens assembly 1910, light starting from any one point of the object is again collected to a point on the pixel array 1100 through the lens assembly 1910. For example, light starting from any one point A on an optical axis OX passes through the lens assembly 1910 and then is collected at the center of the pixel array 1100 on the optical axis OX. Light starting from any one point B, C, or D deviating from the optical axis OX is collected at a point of the periphery of the pixel array 1100 across the optical axis OX by the lens assembly 1910. For example, the light starting from the point B above the optical axis OX is collected at a lower edge of the pixel array 1100 across the optical axis OX, and the light starting from the point C below the optical axis OX is collected at an upper edge of the pixel array 1100 across the optical axis OX. Further, the light starting from the point D positioned between the optical axis OX and the point B is collected between the center and the lower edge of the pixel array 1100.

Thus, the light starting from the different points A, B, C, and D is incident on the pixel array 110 at different angles according to distances between the points A, B, C, and D and the optical axis OX. An incident angle of light incident on the pixel array 1100 is usually defined as a chief ray angle (CRA). A chief ray is a ray incident on the pixel array 1100 from one point of the object across the center of the lens assembly 1910, and the CRA is an angle formed by the chief ray and the optical axis OX. The light starting from the point A on the optical axis OX has a CRA of 0 degree, and is vertically incident on the pixel array 1100. The farther the starting point is from the optical axis OX, the greater the CRA is.

From the viewpoint of the image sensor 1000, the CRA of the light incident on the center portion of the pixel array 1100 is 0 degree, and the CRA of the incident light increases toward the edge of the pixel array 1100. For example, a CRA of light starting from the points B and C and incident on the very edge of the pixel array 1100 may be the greatest, and a CRA of light starting from the point A and incident on the center portion of the pixel array 1100 is 0 degree. Further, a CRA of light starting from the point D and incident between the center and the edge of the pixel array 1100 is less than CRA of light starting from the points B and C and greater than 0 degree.

Therefore, a CRA of incident light incident on pixels varies according to positions of the pixels in the pixel array 1100. In particular, the CRA gradually increases from the center portion to the edge of the pixel array 1100. When the CRA of the incident light incident on the pixels increases, the sensitivity of the pixels may be degraded. According to an example embodiment, in order to prevent or reduce the sensitivity of the pixels positioned at the edge of the pixel array 1100 from being degraded, a planar nanophotonic microlens array may be disposed in the pixel array 1100 of the image sensor 1000.

Figure 3:
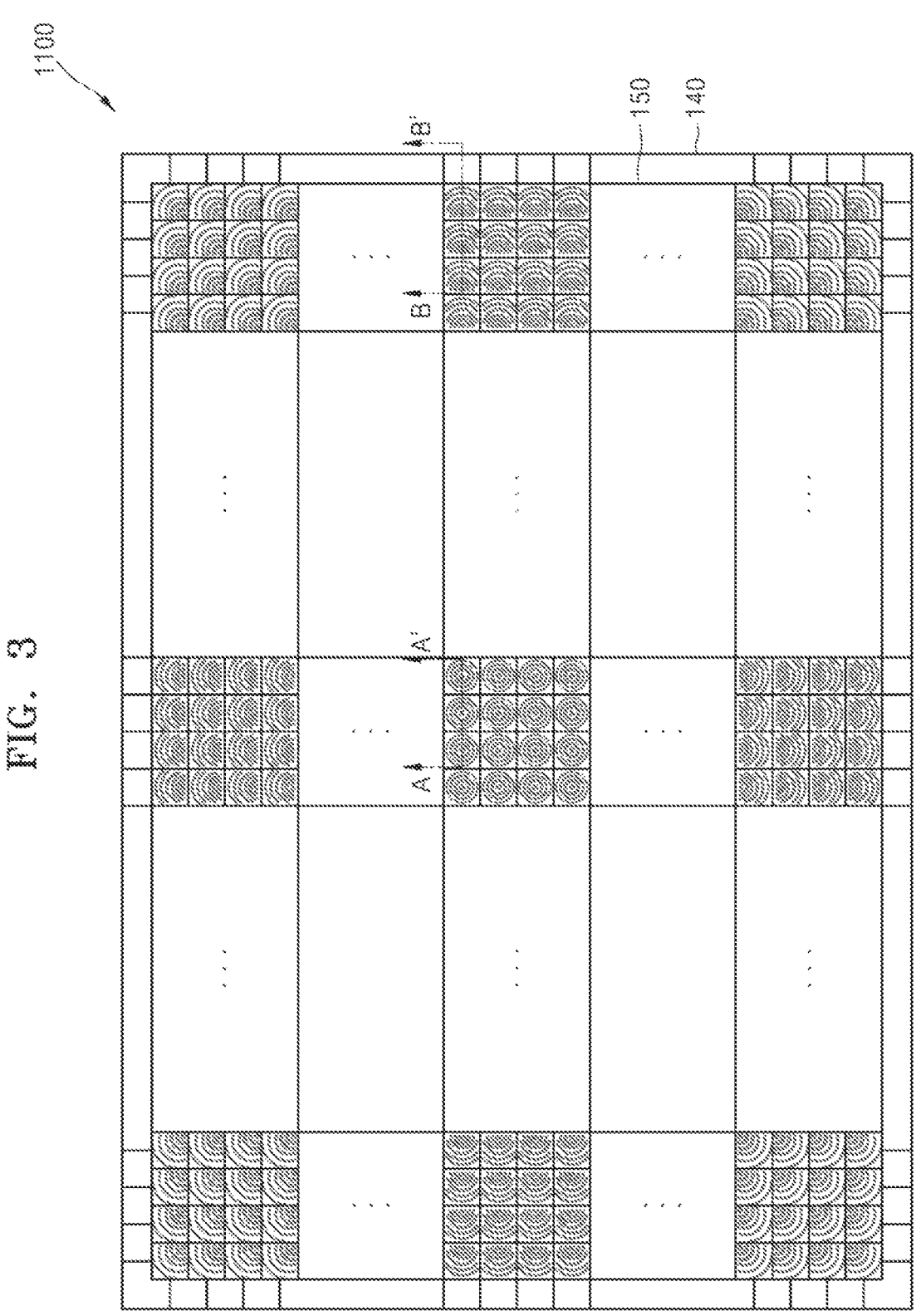
FIG. 3 is a plan view illustrating a pixel array of an image sensor according to an example embodiment.
Figure 4A:
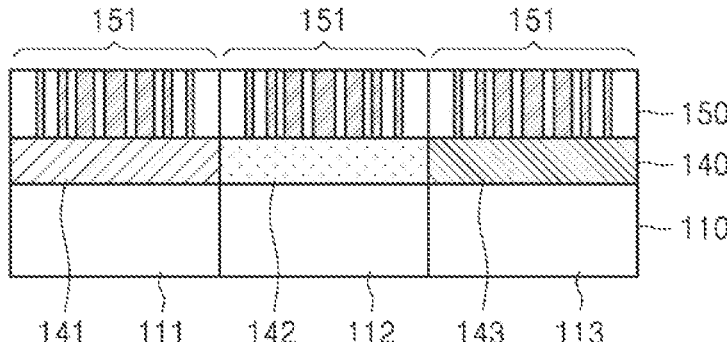
FIG. 4A is a schematic cross-sectional view taken along line A-A' with respect to the center portion of the pixel array of the image sensor shown in FIG. 3.

FIG. 3 is a plan view illustrating the pixel array 1100 of the image sensor 1000 according to an example embodiment. FIG. 4A is a schematic cross-sectional view taken along line A-A' with respect to the center portion of the pixel array 1100 of the image sensor 1000 shown in FIG. 3. Referring to FIGS. 3 and 4A, the pixel array 1100 of the image sensor 1000 may include a sensor substrate 110, a color filter layer 140 disposed on the sensor substrate 110, and a planar nanophotonic microlens array 150 disposed on the color filter layer 140.

Referring to FIG. 4A, the sensor substrate 110 may include a plurality of light sensing cells 111, 112, and 113 sensing light. For example, the sensor substrate 110 may include a first light sensing cell 111, a second light sensing cell 112, and a third light sensing cell 113 converting light into an electrical signal. FIG. 4A shows that the first light sensing cell 111, the second light sensing cell 112, and the third light sensing cell 113 are sequentially arranged in a horizontal direction as an example, but embodiments are not limited thereto. The plurality of light sensing cells 111, 112, and 113 of the sensor substrate 110 may be two-dimensionally arranged in various ways.

The color filter layer 140 may include a plurality of color filters 141, 142, and 143 that transmit only light of a specific wavelength band and absorb or reflect light of another wavelength band. For example, the color filter layer 140 may include a first color filter 141 disposed on the first light sensing cell 111 and configured to transmit only light of a first wavelength band, a second color filter 142 disposed on the second light sensing cell 112 and configured to transmit only light of a second wavelength band different from the first wavelength band, and a third color filter 143 disposed on the light sensing cell 113 and configured to transmit only light of a third wavelength band different from the first and second wavelength bands. FIG. 4A illustrates that the first color filter 141, the second color filter 142, and the third color filter 143 are sequentially arranged in a horizontal direction as an example, but embodiments are not limited thereto. The plurality of color filters 141, 142, and 143 of the color filter layer 140 may be two-dimensionally arranged in various ways.

The planar nanophotonic microlens array 150 disposed on the color filter layer 140 may include a plurality of planar nanophotonic microlenses 151 that are two-dimensionally arranged. The plurality of planar nanophotonic microlenses 151 may correspond one-to-one to the plurality of color filters 141, 142, and 143, and may also correspond one-to-one to the plurality of light sensing cells 111, 112, and 113. Each of the plurality of planar nanophotonic microlenses 151 may be configured to focus light on a corresponding light sensing cell among the plurality of light sensing cells 111, 112, and 113. To this end, the plurality of planar nanophotonic microlenses 151 may have a nanopattern structure configured to condense light.

Figure 5:
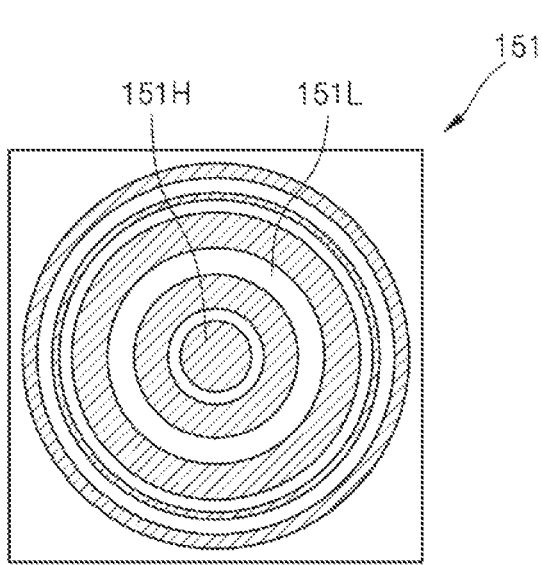
FIG. 5 is a plan view showing an example of a shape of the planar nanophotonic microlens shown in FIG. 4A.

FIG. 5 is a plan view showing an example of a shape of the planar nanophotonic microlens 151 shown in FIG. 4A. Referring to FIG. 5, the planar nanophotonic microlens 151 may include high refractive index nanostructures 151H and low refractive index nanostructures 151L filled between the high refractive index nanostructures 151H. The high refractive index nanostructure 151H may include a dielectric material having a relatively high refractive index such as titanium oxide ($TiO_2$), gallium nitride (GaN, silicon nitride ($SiN_3$), zinc sulfide (ZnS), zinc selenide (ZnSe), silicon nitride ($Si_3N_4$), etc. and having a low absorption coefficient in a visible light band. The low refractive index nanostructure 151L may include a dielectric material having a relatively low refractive index such as, for example, silicon oxide ($SiO_2$), siloxane-based spin on glass (SOG), air, etc. and having a low absorption coefficient in the visible light band.

An effective refractive index of the planar nanophotonic microlens 151 may be the greatest in any one region of the planar nanophotonic microlens 151 and may gradually decrease toward the periphery of the region such that the planar nanophotonic microlens 151 may be configured to operate as a convex lens converging light. For example, a ratio of the high refractive index nanostructure 151H to the low refractive index nanostructure 151L may be the greatest in any one region of the planar nanophotonic microlens 151 and may gradually decrease toward the periphery of the region. Hereinafter, the region having the greatest effective refractive index within the planar nanophotonic microlens 151 is referred to as a refractive index peak region. In order to satisfy these conditions, widths and pitches of the low refractive index nanostructure 151L and the high refractive index nanostructure 151H may be differently selected in the refractive index peak region of the planar nanophotonic microlens 151 and the periphery thereof. For example, the plurality of high refractive index nanostructures 151H and the plurality of low refractive index nanostructures 151L may be alternately arranged in a concentric circle shape with respect to the refractive index peak region, and a width of the high refractive index nanostructures 151H in a diameter direction may be greatest in the refractive index peak region.

In addition, the planar nanophotonic microlens 151 may be configured to change an incident angle of incident light so that the light is incident at almost 90 degrees on the center portion of a light sensing cell corresponding to the planar nanophotonic microlens 151. As described above, a CRA of the incident light varies according to a position on the pixel array 1100. Accordingly, the position of the refractive index peak region in the planar nanophotonic microlens 151 may vary according to the position of the planar nanophotonic microlens 151 in the pixel array 1100.

Figure 6:
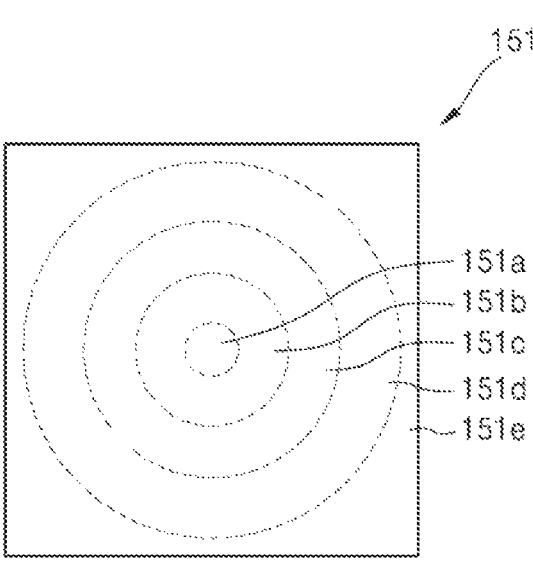
FIG. 6 illustrates an example of an effective refractive index distribution of the planar nanophotonic microlens shown in FIG. 4A.

When the light is disposed at the center portion of the pixel array 1100 where the light is incident at almost 90 degrees, the planar nanophotonic microlens 151 does not need to change an angle at which the light travels. Accordingly, as shown in FIG. 4A, the refractive index peak region of the planar nanophotonic microlens 151 disposed at the center portion of the pixel array 1100 may be positioned at the center of the planar nanophotonic microlens 151. FIG. 6 illustrates an example of an effective refractive index distribution of the planar nanophotonic microlens 151 shown in FIG. 4A. Referring to FIG. 6, the planar nanophotonic microlens 151 disposed at the center portion of the pixel array 1100 may include a first region 151a disposed at the center, a second region 151b surrounding the first region 151a, a third region 151c surrounding the second region 151b, a fourth region 151d surrounding the third region 151c, and a fifth region 151e surrounding the fourth region 151d. The first region 151a to the fifth region 151e may be arranged in a concentric circle shape with the center of the planar nanophotonic microlens 151 as the origin.

The first region 151a positioned at the very center may have a greatest effective refractive index. For example, a ratio of the high refractive index nanostructure 151H to the low refractive index nanostructure 151L may be the greatest in the first region 151a. The planar nanophotonic microlens 151 may have the effective refractive index distribution in which an effective refractive index gradually decreases from the first region 151a to the fifth region 151e. An effective refractive index of the second region 151b is lower than that of the first region 151a, an effective refractive index of the third region 151c is lower than that of the second region 151b, and an effective refractive index of the fourth region 151d is lower than that of the third region 151c. In addition, an effective refractive index of the fifth region 151e is the lowest. To this end, at least one of a width and a pitch of each of the low refractive index nanostructure 151L and the high refractive index nanostructure 151H in the first region 151a to the fifth region 151e may be selected differently.

In this structure, the planar nanophotonic microlens 151 may have a symmetrical effective refractive index distribution with respect to the center. In addition, a refractive index peak region of the planar nanophotonic microlens 151 is positioned at the center of the planar nanophotonic microlens 151, in particular, the first region 151a. FIG. 6 illustrates that the planar nanophotonic microlens 151 has five concentric circles, but embodiments are not limited thereto. For example, the number of concentric circles may be differently selected according to the size of the planar nanophotonic microlens 151, an effective refractive index distribution profile required for the planar nanophotonic microlens 151, etc.

Figure 4B:
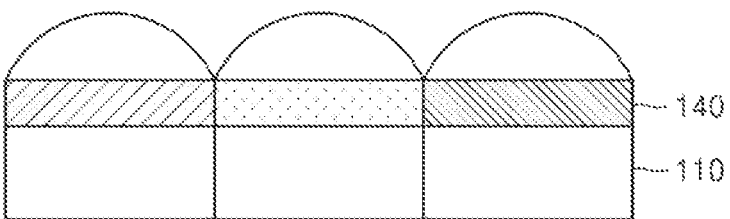
FIG. 4B illustrates an example of a spherical microlens equivalent to the planar nanophotonic microlens shown in FIG. 4A.

FIG. 4B illustrates an example of a spherical microlens equivalent to the planar nanophotonic microlens 151 shown in FIG. 4A. When the planar nanophotonic microlens 151 shown in FIG. 4A has the effective refractive index distribution shown in FIG. 6, the same optical effect as that of an optical axis positioned at the center of the equivalent spherical microlens coinciding with the center of a light sensing cell and a color filter corresponding to the spherical microlens may be obtained. In addition, the equivalent spherical microlens may have a symmetrical lens surface with respect to the optical axis. In this case, light that is perpendicularly incident on the pixel array 1100 may pass through the planar nanophotonic microlens 151 and the color filter layer 140 to be perpendicularly incident on the sensor substrate 110. Therefore, at the center portion of the pixel array 1100, a refractive index peak region may be positioned at the center of the planar nanophotonic microlens 151, and the planar nanophotonic microlens 151 may be disposed such that the refractive index peak region may coincide with the center of the corresponding light sensing cell and color filter.

Referring to FIG. 4A, at the center portion of the pixel array 1100, a boundary between the planar nanophotonic microlenses 151 may coincide with a boundary between the corresponding light sensing cells and a boundary between the corresponding color filters. Accordingly, a region in which the planar nanophotonic microlens 151 is disposed may coincide with a region in which the corresponding light sensing cell and color filter are arranged.

Figure 7A:
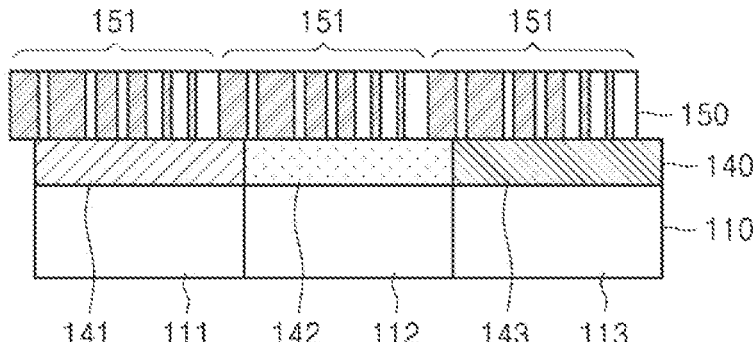
FIG. 7A is a cross-sectional view taken along line B-B' of an edge of the pixel array of the image sensor shown in FIG. 3.

FIG. 7A is a cross-sectional view taken along line B-B' of an edge of the pixel array 1100 of an image sensor. Referring to FIGS. 3 and 7A, in the edge of the pixel array 1100, the planar nanophotonic microlens 151 may be shifted in a direction in which light is incident, and a refractive index peak region of the planar nanophotonic microlens 151 may also be shifted in the direction in which light is incident. For example, in the edge of the pixel array 1100, the planar nanophotonic microlens 151 may be shifted toward the center portion of the pixel array 1100, and the refractive index peak region of the planar nanophotonic microlens 151 may also be shifted toward the center portion of the pixel array 1100. For example, the planar nanophotonic microlens 151 disposed at the right edge of the pixel array 1100 and the refractive index peak region of the planar nanophotonic microlens 151 may be shifted in a left direction, and the planar nanophotonic microlens 151 disposed at the left edge of the pixel array 1100 and the refractive index peak region of the planar nanophotonic microlens 151 may be shifted in a right direction. Accordingly, a boundary between the planar nanophotonic microlenses 151 arranged at the edge of the pixel array 1100 may not coincide with a boundary between the corresponding light sensing cells and a boundary between the corresponding color filters. In this case, the total area of the planar nanophotonic microlens array 150 may be less than the total area of the pixel array 1100, the total area of the sensor substrate 110, or the total area of the color filter layer 140.

FIG. 3 illustrates that the planar nanophotonic microlenses 151 arranged at the outermost as an example, but the planar nanophotonic microlenses 151 arranged between the center portion and the edge of the pixel array 1100 may also be shifted toward the center portion of the pixel array 1100. A distance at which the planar nanophotonic microlens 151 and the refractive index peak region of the planar nanophotonic microlens 151 are shifted may be determined according to a CRA of incident light. When the CRA of the incident light increases, the distance at which the planar nanophotonic microlens 151 and the refractive index peak region of the planar nanophotonic microlens 151 are shifted increases. Accordingly, as the planar nanophotonic microlens 151 moves away from the center portion of the pixel array 1100, the distance at which the planar nanophotonic microlens 151 and the refractive index peak region of the planar nanophotonic microlens 151 are shifted may gradually increase.

According to another example embodiment, the pixel array 1100 may split into a plurality of regions according to the distance from the center portion, and the distance at which the planar nanophotonic microlens 151 and the refractive index peak region of the planar nanophotonic microlens 151 are shifted may be changed step by step according to the split regions. In this case, the planar nanophotonic microlenses 151 arranged in the same region of the pixel array 1100 may be shifted by the same distance. The refractive index peak regions of the planar nanophotonic microlenses 151 arranged in the same region of the pixel array 1100 may also be shifted by the same distance.

Figure 8:
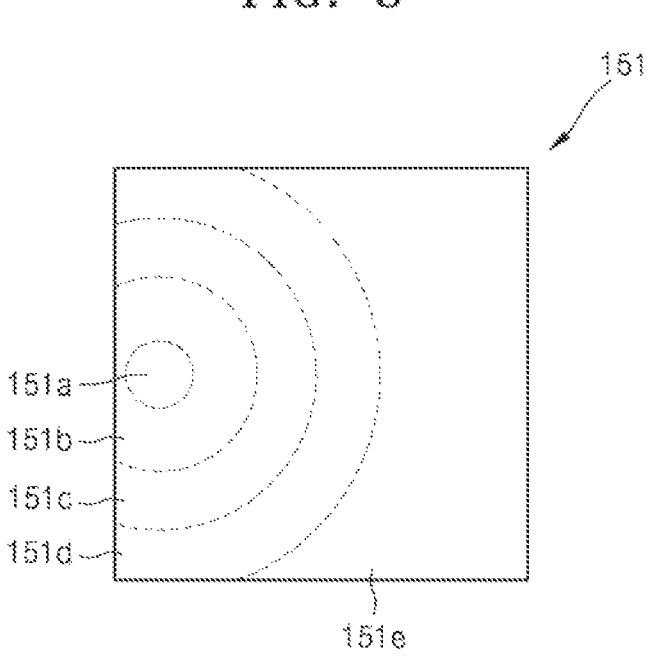
FIG. 8 illustrates an example of an effective refractive index distribution of the planar nanophotonic microlens shown in FIG. 7A.

FIG. 8 illustrates an example of an effective refractive index distribution of the planar nanophotonic microlens 151 shown in FIG. 7A. Referring to FIG. 8, the planar nanophotonic microlens 151 disposed at the edge of the pixel array 1100 may include the first region 151a disposed out of the center, the second region 151b surrounding the first region 151a, the third region 151c surrounding the second region 151b, the fourth region 151d surrounding the third region 151c, and the fifth region 151e surrounding the fourth region 151d. The first region 151a to the fifth region 151e may be arranged in a concentric circle shape by a position deviating from the center of the planar nanophotonic microlens 151 as the origin. As described above, the planar nanophotonic microlens 151 may have the effective refractive index distribution in which an effective refractive index gradually decreases from the first region 151a to the fifth region 151e. Therefore, the planar nanophotonic microlens 151 may have an asymmetrical effective refractive index distribution with respect to the center, and a refractive index peak region of the planar nanophotonic microlens 151 is positioned deviating from the center of the planar nanophotonic microlens 151.

A position of the first region 151a may be different according to a relative position of the planar nanophotonic microlens 151 with respect to the pixel array 1100. As the planar nanophotonic microlens 151 moves away from the center portion of the pixel array 1100, the position of the first region 151a may be further away from the center of the planar nanophotonic microlens 151. The first region 151a may also be shifted toward the center portion of the pixel array 1100. For example, the first region 151a may be shifted in a left direction from the center of the planar nanophotonic microlens 151 disposed at the right edge of the pixel array 1100.

Figure 7B:
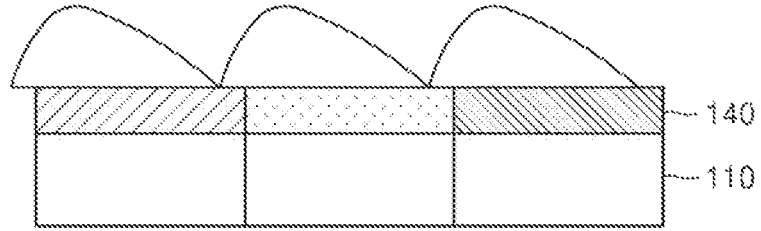
FIG. 7B illustrates an example of a spherical microlens equivalent to a planar nanophotonic microlens shown in FIG. 7A.

FIG. 7B illustrates an example of a spherical microlens equivalent to the planar nanophotonic microlens 151 shown in FIG. 7A. When the planar nanophotonic microlens 151 shown in FIG. 7A has the effective refractive index distribution shown in FIG. 8, the same optical effect as that an optical axis of the equivalent spherical microlens is shifted from the center of a light sensing cell and a color filter corresponding to the spherical microlens may be obtained.

In addition, the equivalent spherical microlens may have an asymmetrical lens surface with respect to the optical axis. The optical axis of the equivalent spherical microlens as well as the equivalent spherical microlens itself may also be shifted with respect to the corresponding light sensing cell and color filter. In this case, light incident obliquely on the pixel array 1100 may pass through the planar nanophotonic microlens 151 and the color filter layer 140 to be approximately perpendicularly incident on the sensor substrate 110. In addition, the planar nanophotonic microlens 151 may condense light toward an approximate center of the corresponding light sensing cell.

The above-described planar nanophotonic microlens array 150 has a planar nanostructure, and thus an optical curvature profile of the lens surface may be more easily determined compared to that of a spherical microlens array. For example, the planar nanophotonic microlens 151 having a desired effective refractive index distribution may be more easily designed by differently selecting widths and pitches of the low refractive index nanostructure 151L and the high refractive index nanostructure 151H according to concentric regions within each planar nanophotonic microlens 151. Accordingly, the planar nanophotonic microlens 151 having an optimal shape in accordance with a CRA of the incident light incident on the pixel array 1100 of an image sensor may be more easily designed and manufactured. As described above, the planar nanophotonic microlens array 150 may also change an incident angle of the incident light incident at a great CRA at the edge of the pixel array 1100 of the image sensor to be close to 90 degrees. In particular, the planar nanophotonic microlens array 150 may include various types of the planar nanophotonic microlenses 151 in consideration of changes in the CRA according to various positions on the pixel array 1100 of the image sensor. Accordingly, the sensitivity of pixels positioned at the edge of the pixel array 1100 of the image sensor may be improved similarly to the sensitivity of pixels positioned at the center portion of the pixel array 1100.

FIG. 5 illustrates the low refractive index nanostructure 151L and the high refractive index nanostructure 151H having a ring shape, but embodiments are not necessarily limited thereto. For example, FIGS. 9 to 11 are plan views illustrating examples of various shapes of the planar nanophotonic microlenses 151.

Figure 9:
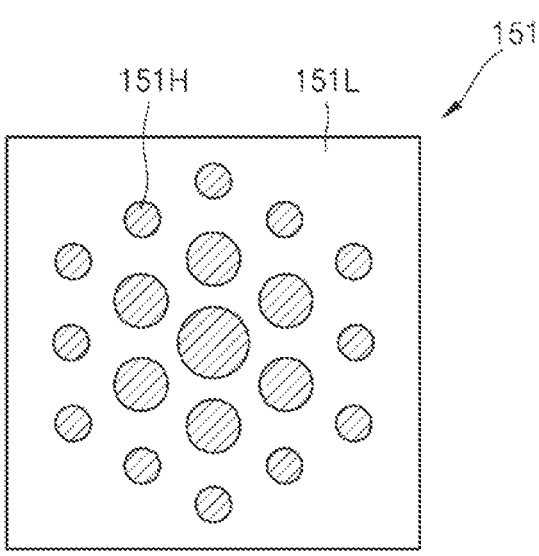
FIGS. 9, 10, and 11 are plan views illustrating examples of various shapes of planar nanophotonic microlenses according to another example embodiment.

Referring to FIG. 9, the planar nanophotonic microlens 151 may include the plurality of high refractive index nanostructures 151H having a nanopost shape. In this case, a proportion of the plurality of high refractive index nanostructures 151H may be the highest in a refractive index peak region of the planar nanophotonic microlens 151, and as the plurality of high refractive index nanostructures 151H move away from the refractive index peak region, the proportion of the plurality of high refractive index nanostructures 151H may decrease. FIG. 9 illustrates that the plurality of high refractive index nanostructures 151H are in a circular shape, but the plurality of high refractive index nanostructures 151H may be in, for example, an elliptical or polygonal shape. In addition, FIG. 9 illustrates that dimensions such as the diameter of the plurality of high refractive index nanostructures 151H are large in the refractive index peak region, and dimensions of the plurality of high refractive index nanostructures 151H are smaller toward the periphery, but embodiments not necessarily limited thereto. For example, the dimensions of the plurality of high refractive index nanostructures 151H may be the same, and the density of the plurality of high refractive index nanostructures 151H may decrease from the refractive index peak region toward the periphery.

Figure 10:
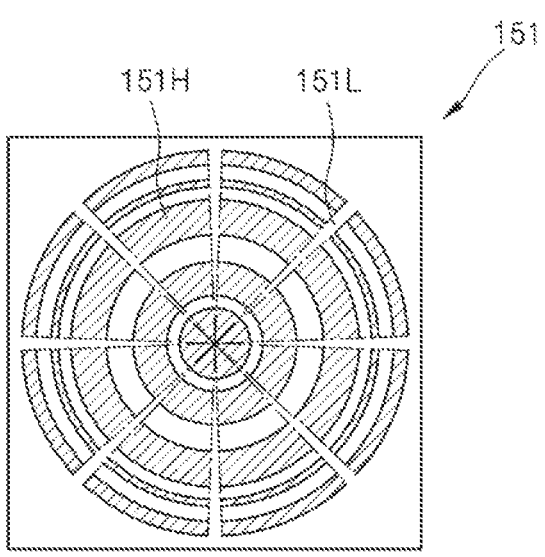

Referring to FIG. 10, the planar nanophotonic microlens 151 may also include the plurality of high refractive index nanostructures 151H split in a circumferential direction. Each of the high refractive index nanostructures 151H may be in an arc shape. Even in this case, a proportion of the plurality of high refractive index nanostructures 151H may be designed to be high in a refractive index peak region of the planar nanophotonic microlens 151, and as the plurality of high refractive index nanostructures 151H move away from the refractive index peak region, the proportion of the plurality of high refractive index nanostructures 151H may be designed to decrease.

Figure 11:
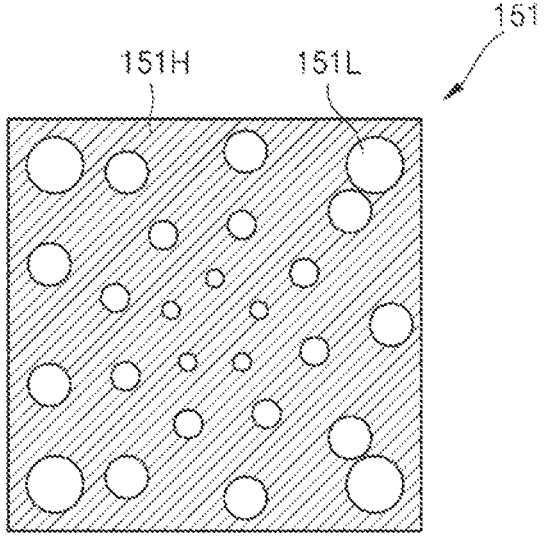

Referring to FIG. 11, the planar nanophotonic microlens 151 may also include one high refractive index nanostructure 151H in the form of a flat plate and the plurality of low refractive index nanostructures 151L in the form of a hole. To this end, a plurality of holes may be formed by etching the high refractive index nanostructures 151H, and a low refractive index material may be filled in the holes. According to another example embodiment, the holes may not be filled and be empty. In this case, the low refractive index nanostructure 151L may include air. Although diameters of all the holes in the planar nanophotonic microlens 151 may be the same, the diameters of the holes may increase as the holes move away from the refractive index peak region. The number of the holes and/or the diameters of the holes may be small in the refractive index peak region so that a proportion of the high refractive index nanostructures 151H is high, and as the holes move away from the refractive index peak region, the number of the holes and/or the diameters of the holes may increase so that the proportion of the high refractive index nanostructures 151H decreases.

Figure 12:
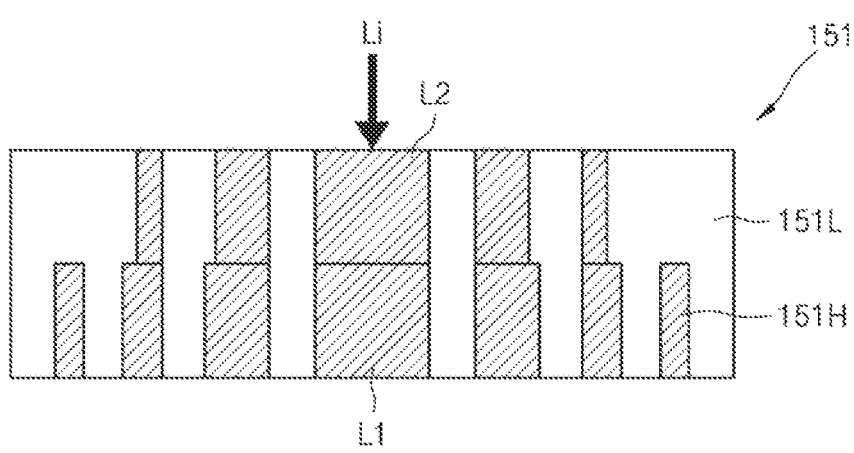
FIGS. 12 and 13 are cross-sectional views illustrating examples of a shape of a planar nanophotonic microlens according to another example embodiment.
Figure 13:
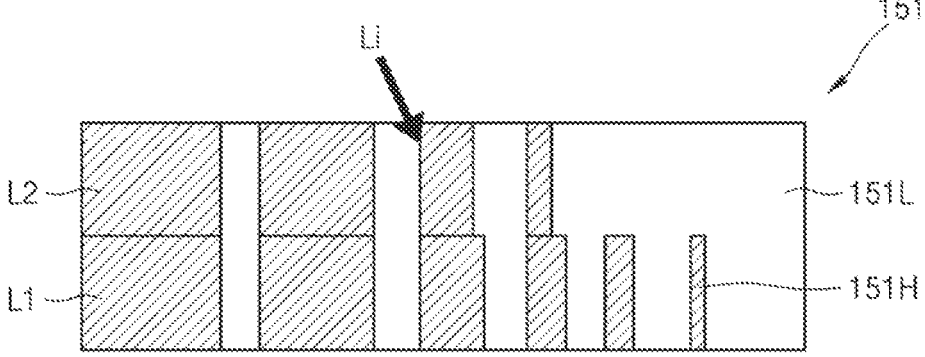

FIGS. 12 and 13 are cross-sectional views illustrating examples of a shape of the planar nanophotonic microlens 151 according to another example embodiment. As shown in FIGS. 12 and 13, the planar nanophotonic microlens 151 may have a multilayer structure. For example, the planar nanophotonic microlens 151 may include first layers L1 and second layers L2 stacked on the first layers L1. Each of the first layer L1 and the second layer L2 may include the high refractive index nanostructure 151H and the low refractive index nanostructure 151L, and patterns of the high refractive index nanostructure 151H and the low refractive index nanostructure 151H of the first layer L1 may be different from patterns of the high refractive index nanostructure 151H and the low refractive index nanostructure 151H of the second layer L2. An effective refractive index of the planar nanophotonic microlens 151 having the multilayer structure for each region may be determined by putting together the high refractive index nanostructures 151H in the first layer L1 and the second layer L2 and the low refractive index nanostructures 151L in the first layer L1 and the second layer L2.

Referring to FIG. 12, both the first layer L1 and the second layer L2 may have a symmetrical shape with respect to the center of the planar nanophotonic microlens 151 disposed at the center portion of the pixel array 1100 on which incident light Li is perpendicularly incident. The high refractive index nanostructures 151H in the first layer L1 and the second layer L2 may have the same width at the center of the planar nanophotonic microlens 151, but a width of the high refractive index nanostructure 151H of the second layer L2 on which light is incident first may be less than a width of the high refractive index nanostructure 151H of the first layer L1 disposed therebelow at the periphery. In addition, the effective refractive index of the planar nanophotonic microlens 151 considered by putting together the first layer L1 and the second layer L2 may be the highest near the center of the planar nanophotonic microlens 151 and may gradually decrease toward the periphery of the refractive index peak region.

Referring to FIG. 13, both the first layer L1 and the second layer L2 may also have an asymmetrical shape with respect to the center of the planar nanophotonic microlens 151 disposed at the periphery of the pixel array 1100 on which the incident light Li is obliquely incident. For example, the refractive index peak region of the planar nanophotonic microlens 151 may be shifted toward a direction in which the light is incident. The effective refractive index of the planar nanophotonic microlens 151 considered by putting together the first layer L1 and the second layer L2 may be the highest in the shifted refractive index peak region and may gradually decrease toward the periphery of the refractive index peak region. In addition, the high refractive index nanostructures 151H in the first layer L1 and the second layer L2 may have the same width in the refractive index peak region of the planar nanophotonic microlens 151, but a width of the high refractive index nanostructure 151H of the second layer L2 may be less than a width of the high refractive index nanostructure 151H of the first layer L1 disposed therebelow in a region deviating from the refractive index peak region.

Figure 14:
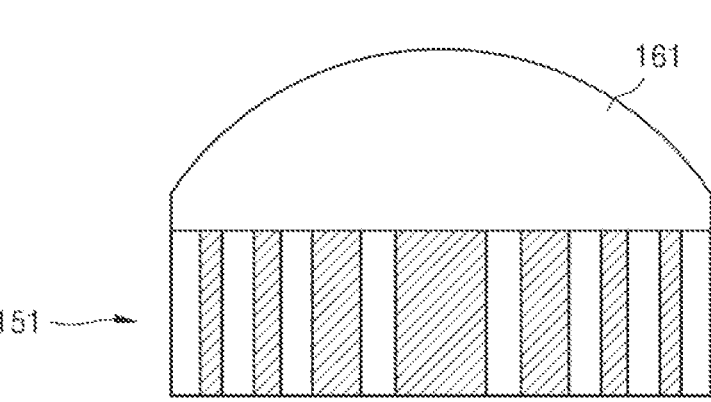
FIGS. 14, 15, and 16 are cross-sectional views illustrating examples of a shape of a planar nanophotonic microlens further including a spherical microlens according to another example embodiment.
Figure 15:
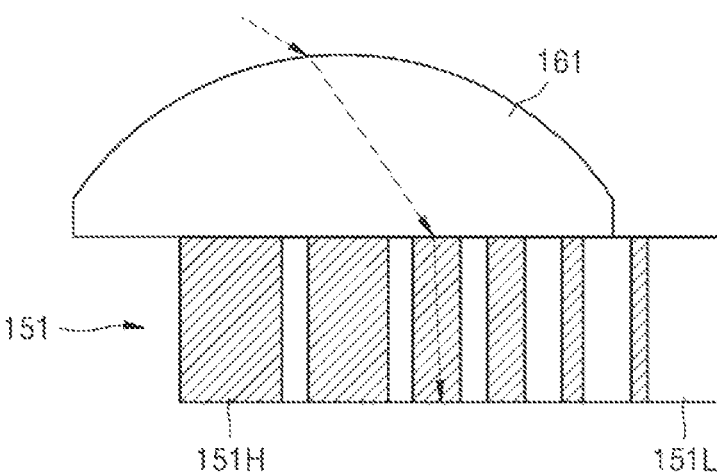
Figure 16:
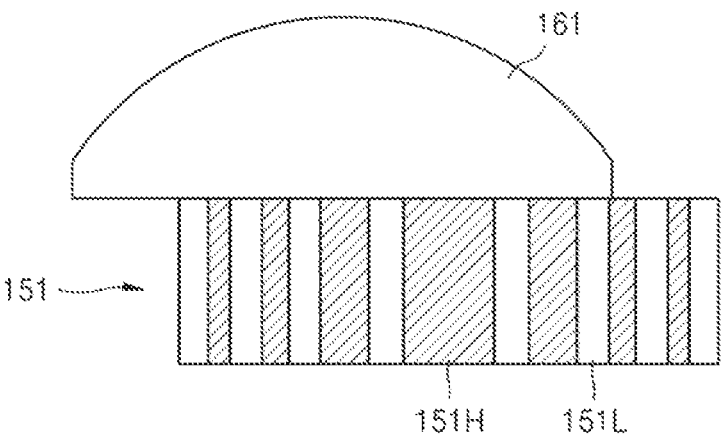

FIGS. 14 to 16 are cross-sectional views illustrating examples of a shape of the planar nanophotonic microlens 151 further including a spherical microlens 161 according to another example embodiment. Referring to FIG. 14, the pixel array 1100 of an image sensor may further include the spherical microlens 161 disposed on the planar nanophotonic microlens 151. FIG. 14 illustrates one spherical microlens 161 disposed on one planar nanophotonic microlens 151 as an example, but a plurality of spherical microlenses 161 may be two-dimensionally arranged on the plurality of planar nanophotonic microlenses 151. The planar nanophotonic microlens 151 and the spherical microlens 161 may correspond to each other one-to-one. When the spherical microlens 161 is further used, crosstalk occurring at an interface between the planar nanophotonic microlenses 151 may be prevented or reduced.

Referring to FIG. 14, a refractive index peak region of the planar nanophotonic microlense 151 and an optical axis of the spherical microlens 161 that are disposed at the center portion of the pixel array 1100 and correspond to each other may be aligned to coincide with each other. A boundary of the planar nanophotonic microlens 151 and a boundary of the spherical microlens 161 that correspond to each other may also coincide with each other.

Referring to FIG. 15, a refractive index peak region of the planar nanophotonic microlense 151 and an optical axis of the spherical microlens 161 that are disposed at the periphery of the pixel array 1100 may not coincide with each other. In addition, the spherical microlens 161 disposed on the planar nanophotonic microlens 151 may be shifted toward a direction in which light is incident with respect to the planar nanophotonic microlens 151. For example, the spherical microlens 161 is shifted in a left direction with respect to the planar nanophotonic microlens 151 corresponding thereto at the right edge of the pixel array 1100. Accordingly, the spherical microlens 161 may be shifted toward the center portion of the pixel array 1100 with respect to the planar nanophotonic microlens 151 corresponding thereto at the periphery of the pixel array 1100.

FIG. 15 illustrates that a refractive index peak region of the planar nanophotonic microlens 151 disposed at the periphery of the pixel array 1100 is shifted toward the center portion of the pixel array 1100. However, when the spherical microlens 161 is further used, the refractive index peak region of the planar nanophotonic microlens 151 disposed at the periphery of the pixel array 1100 may not be shifted. Referring to FIG. 16, the spherical microlens 161 is shifted toward the center portion of the pixel array 1100 with respect to the planar nanophotonic microlens 151. The planar nanophotonic microlens 151 below the spherical microlens 161 has a refractive index peak region that is not shifted. For example, the refractive index peak region of the planar nanophotonic microlens 151 is positioned at the center of the planar nanophotonic microlens 151. Even though the refractive index peak region of the planar nanophotonic microlens 151 is not shifted, the incident light may be incident on the center of a light sensing cell at a reduced incident angle due to the shifted spherical microlens 161.

FIGS. 17 to 20 are cross-sectional views illustrating the pixel array 1100 of an image sensor according to another example embodiment. Referring to FIGS. 17 to 20, the pixel array 1100 of the image sensor may further include a transparent dielectric layer 170 having a thickness that increases from the center portion of the pixel array 1100 to the periphery.

Figure 17:
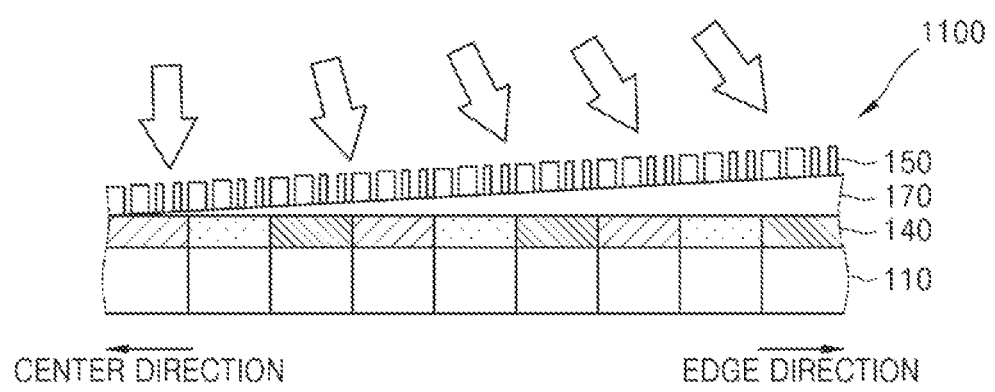
FIGS. 17, 18, 19, and 20 are cross-sectional views illustrating a pixel array of an image sensor according to another example embodiment.

Referring to FIG. 17, the transparent dielectric layer 170 may be disposed between the sensor substrate 110 and the planar nanophotonic microlens array 150, in particular, between the color filter layer 140 and the planar nanophotonic microlens array 150. The transparent dielectric layer 170 may have an inclined upper surface so that the thickness of the transparent dielectric layer 170 gradually increases from the center portion of the pixel array 1100 to the periphery. FIG. 17 illustrates that an upper surface of the transparent dielectric layer 170 is in a flat plate shape having a constant inclination angle, but the upper surface of the transparent dielectric layer 170 may be in a curved shape in which an inclination angle increases as a CRA increases. The transparent dielectric layer 170 may be disposed over the entire region of the pixel array 1100 but may be disposed only on a partial peripheral region of the pixel array 1100. For example, the transparent dielectric layer 170 may not be disposed in the center portion of the pixel array 1100 where the sensitivity of a pixel does not significantly deteriorate due to the CRA.

A plurality of planar nanophotonic microlenses 151 may be arranged at an angle on the inclined upper surface of the transparent dielectric layer 170. Since the planar nanophotonic microlenses 151 are arranged at an angle, an incident angle of incident light incident on the planar nanophotonic microlens 151 may be smaller than the CRA. In particular, when the transparent dielectric layer 170 has a curved upper surface whose inclination angle increases as the CRA increases, the incident light may be incident on all the planar nanophotonic microlenses 151 at an almost constant angle.

Figure 18:
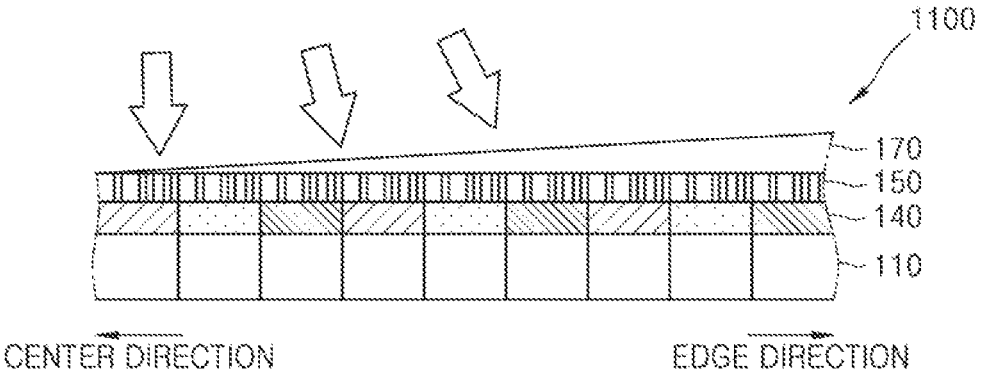

Referring to FIG. 18, the transparent dielectric layer 170 having the inclined upper surface may be disposed on the planar nanophotonic microlens array 150. Due to the inclined upper surface of the transparent dielectric layer 170, the incident angle of incident light incident on the upper surface of the transparent dielectric layer 170 may be smaller than the CRA at the periphery of the pixel array 1100. In addition, because the light is refracted by the transparent dielectric layer 170, the incident angle of the incident light incident on the planar nanophotonic microlenses 151 disposed below the transparent dielectric layer 170 may be further reduced.

Figure 19:
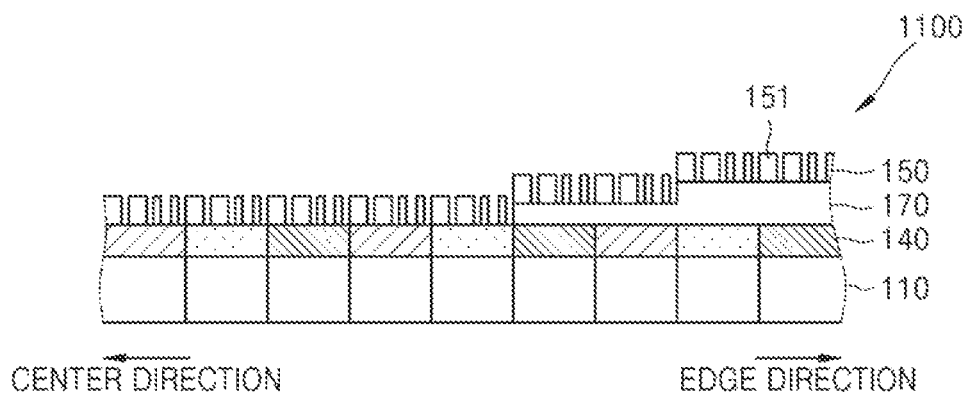
Figure 20:
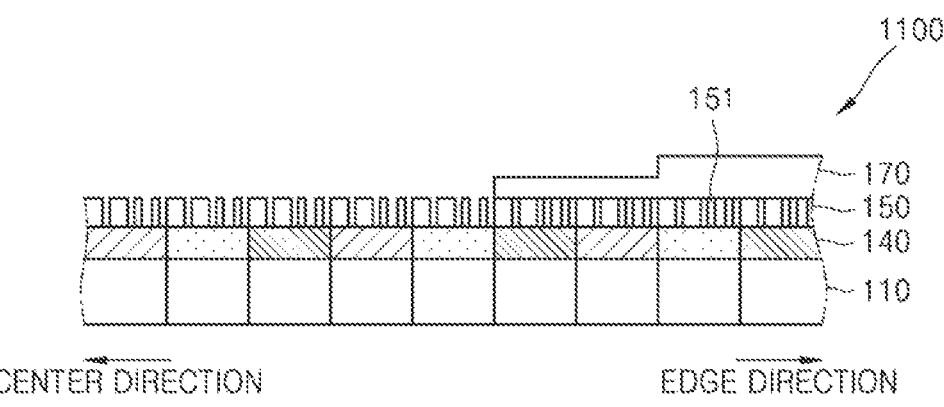

Referring to FIGS. 19 and 20, the transparent dielectric layer 170 may have a stair shape in which a thickness of the transparent dielectric layer 170 discontinuously increases from the center portion of the pixel array 1100 to the periphery. As shown in FIG. 19, the transparent dielectric layer 170 having the stair shape may be disposed between the color filter layer 140 and the planar nanophotonic microlens array 150. In addition, as shown in FIG. 20, the transparent dielectric layer 170 having the stair shape may be disposed on the planar nanophotonic microlens array 150 opposite to the color filter layer 140. Because the light is refracted by the transparent dielectric layer 170, an incident angle of incident light incident on the planar nanophotonic microlens array 150 or the color filter layer 140 may be reduced. In addition, FIGS. 19 and 20 illustrate that the upper surface of the transparent dielectric layer 170 is parallel to a horizontal plane, but each stage of the transparent dielectric layer 170 may have an inclined upper surface so that the thickness of the transparent dielectric layer 170 gradually increases from the center portion of the pixel array 1100 to the periphery.

Figure 21:
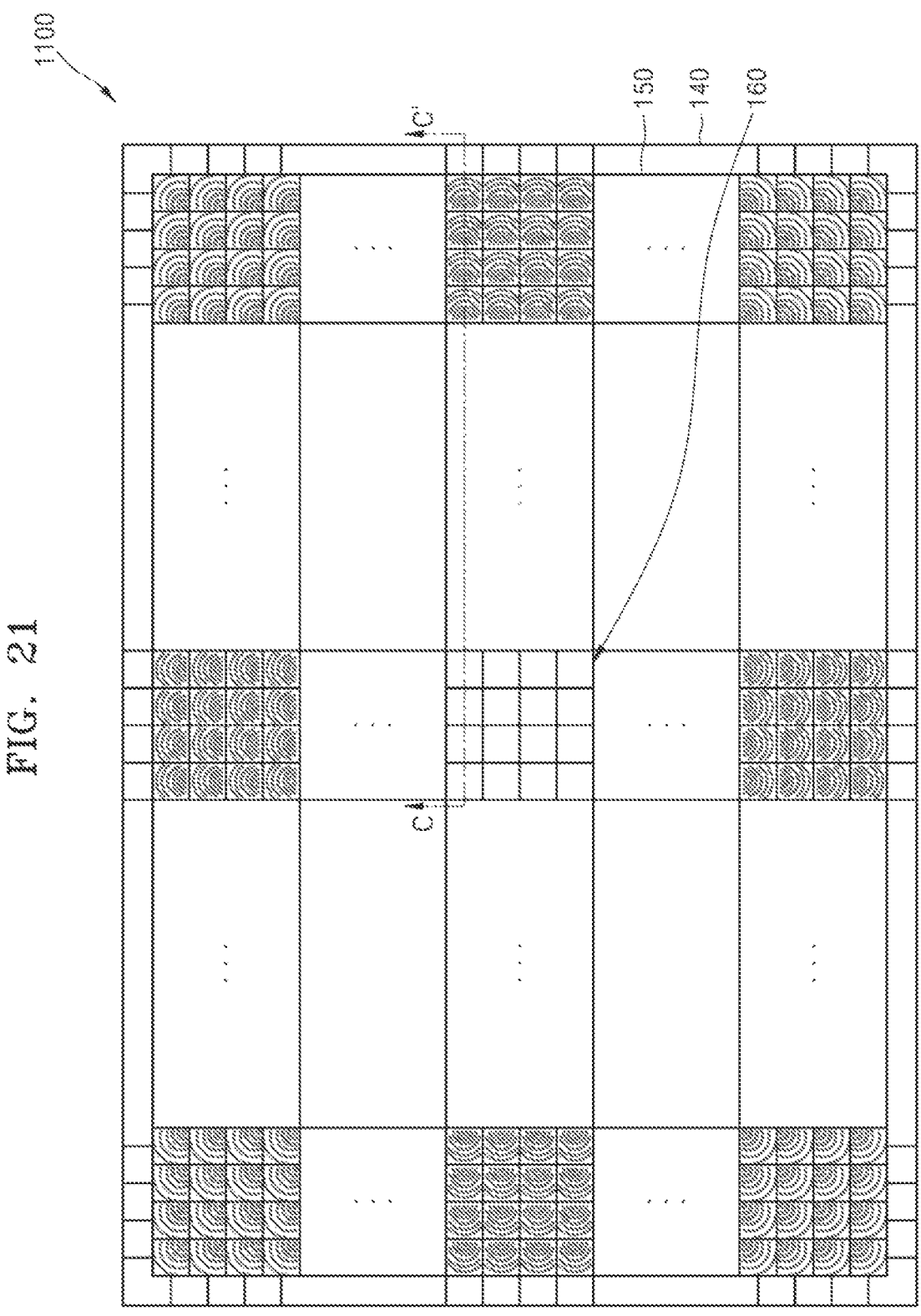
FIG. 21 is a plan view illustrating a pixel array of an image sensor according to another example embodiment.

FIG. 21 is a plan view illustrating the pixel array 1100 of an image sensor according to another example embodiment. Referring to FIG. 21, the pixel array 1100 may include a spherical microlens array 160 disposed at the center portion and the planar nanophotonic microlens array 150 disposed at the periphery. The planar nanophotonic microlens 151 does not exist at the center portion of the pixel array 1100 having a small CRA, and only the general spherical microlens array 160 may be disposed. For example, only the general spherical microlens array 160 may be disposed in a region where the CRA is less than 30 degrees, and the planar nanophotonic microlens array 150 may be disposed in a region where the CRA is equal to or more than 30 degrees.

Figure 22:
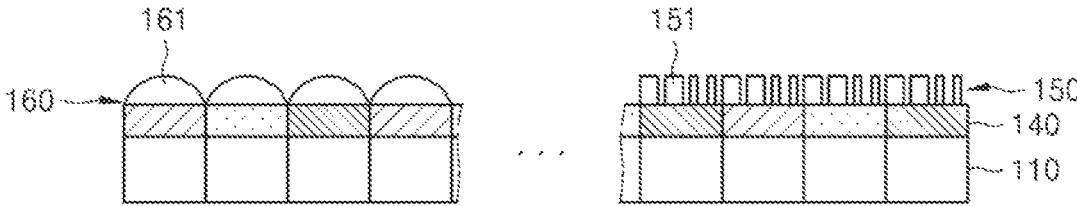
FIG. 22 is a cross-sectional view taken along line C-C' showing an example of the pixel array of the image sensor shown in FIG. 21.

FIG. 22 is a cross-sectional view taken along line C-C' showing an example of the pixel array 1100 of the image sensor shown in FIG. 21. Referring to FIG. 22, the spherical microlens array 160 and the planar nanophotonic microlens array 150 may be arranged on the same plane. For example, both the spherical microlens array 160 including a plurality of spherical microlenses 161 and the planar nanophotonic microlens array 150 including a plurality of planar nanophotonic microlenses 151 may be arranged on the color filter layer 140.

Figure 23:
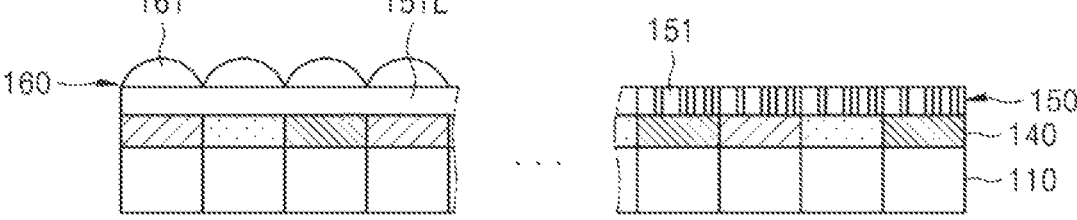
FIG. 23 is a cross-sectional view taken along line C-C' showing another example of the pixel array of the image sensor shown in FIG. 21.

FIG. 23 is a cross-sectional view taken along line C-C' showing another example of the pixel array 1100 of the image sensor shown in FIG. 21. Referring to FIG. 23, the spherical microlens array 160 and the planar nanophotonic microlens array 150 may be arranged on different planes. For example, the planar nanophotonic microlens array 150 may be disposed on the color filter layer 140. In a region within the planar nanophotonic microlens array 150 corresponding to the center portion of the pixel array 1100, the high refractive index nanostructure 151H may not exist and only the low refractive index nanostructure 151L may exist. The spherical microlens array 160 may be disposed on the low refractive index nanostructure 151L at the center portion of the pixel array 1100.

Figure 24A:
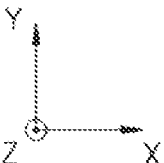

In the cross-sectional view of the pixel array 1100 shown in FIG. 4A, the first color filter 141, the second color filter 142, and the third color filter 143 are sequentially arranged in a horizontal direction as an example, but embodiments are not necessarily limited thereto. An arrangement of a plurality of pixels sensing light of different wavelengths may be implemented in various ways in the pixel array 1100. FIGS. 24A to 24C show examples of various pixel arrangements of the pixel array 1100.

First, FIG. 24A shows a Bayer pattern that is generally adopted in the image sensor 1000. Referring to FIG. 24A, one unit pattern includes four quadrant regions, and first through fourth quadrants may be a blue pixel B, a green pixel G, a red pixel R, and a green pixel G, respectively. The unit patterns are repeatedly and two-dimensionally arranged in a first direction (X direction) and a second direction (Y direction). For example, two green pixels G are arranged in one diagonal direction and one blue pixel B and one red pixel R are arranged in another diagonal direction in a unit pattern of a 2×2 array. In the entire pixel arrangement, a first row in which a plurality of green pixels G and a plurality of blue pixels B are alternately arranged in the first direction and a second row in which a plurality of red pixels R and a plurality of green pixels G are alternately arranged in the first direction are repeatedly arranged in the second direction.

The arrangement of the pixel array 1100 may vary, in addition to the Bayer pattern. For example, referring to FIG. 24B, a CYGM arrangement, in which a magenta pixel M, a cyan pixel C, a yellow pixel Y, and a green pixel G configure one unit pattern, may be used. Referring to FIG. 24C, an RGBW arrangement, in which a green pixel G, a red pixel R, a blue pixel, and a white pixel W configure one unit pattern, may also be used. The unit pattern may have a 3×2 array. In addition to the above examples, the pixels of the pixel array 1100 may be arranged in various ways according to color characteristics of the image sensor 1000. Hereinafter, it will be described that the pixel array 1100 of the image sensor 1000 has the Bayer pattern, but an operating principle also applies to other types of pixel arrangements than the Bayer pattern.

Figure 25A:
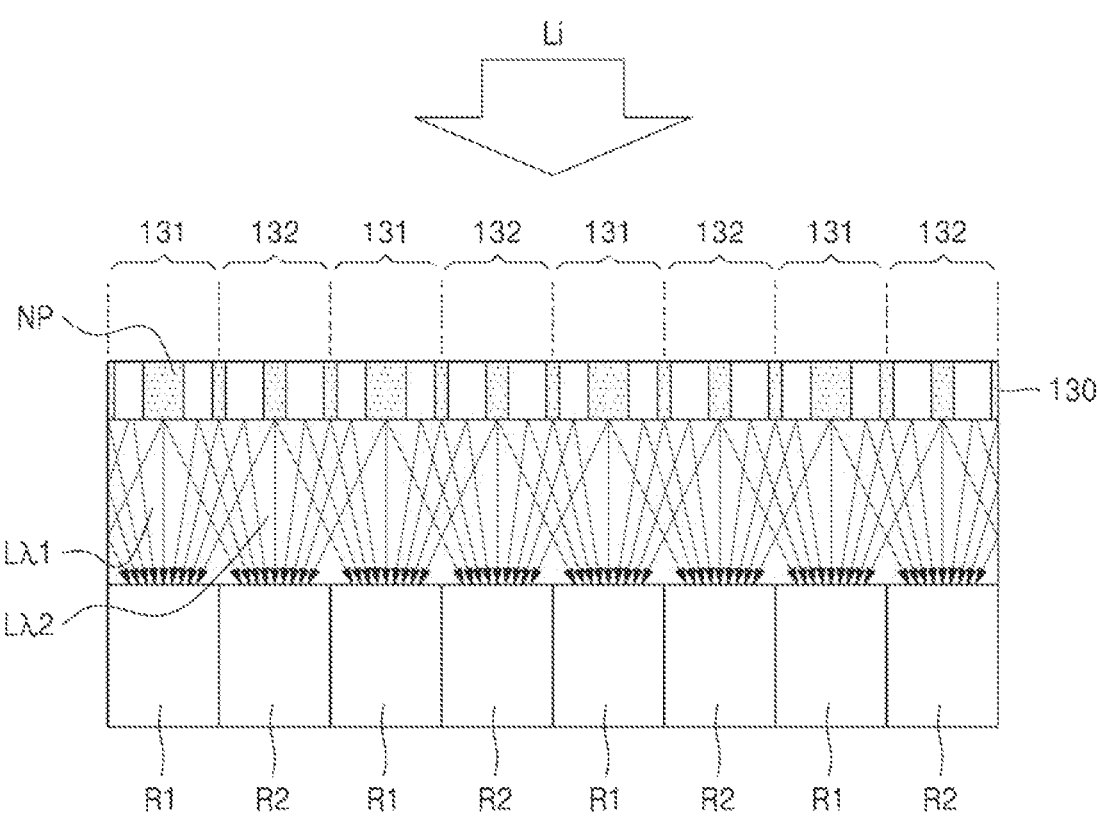
FIGS. 25A and 25B are conceptual diagrams showing a structure and an operation of a color separating lens array according to an example embodiment.
Figure 25A:
Figure 25B:
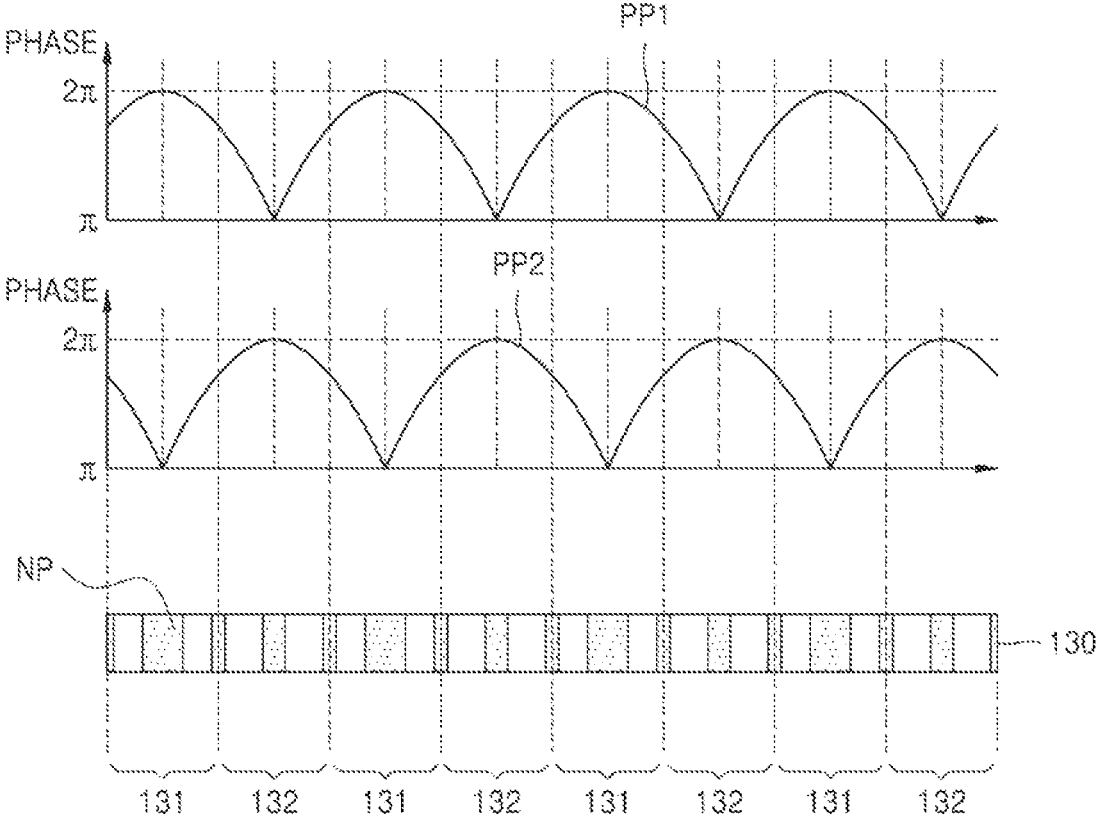
Figure 25B:

In the above-described example embodiments, it has been described that the color filter layer 140 is used for color separation of incident light, but a color separating lens array condensing light of a color corresponding to each pixel using a nanopattern may be used together with the color filter layer 140 or solely without the color filter layer 140. FIGS. 25A and 25B are conceptual diagrams showing a structure and an operation of a color separating lens array 130 according to an example embodiment.

Referring to FIG. 25A, the color separating lens array 130 may include nanoposts NP that change a phase of the incident light Li differently according to an incidence position, and may be divided into a first region 131 corresponding to a first target region R1 on which first wavelength light Lλ1 included in the incident light Li is condensed, and a second region 132 corresponding to a second target region R2 on which second wavelength light Lλ2 included in the incident light Li is condensed. Each of the first region 131 and the second region 132 may include one or a plurality of nanoposts NP. The first region 131 and the second region 132 may respectively face the first target region R1 and the second target region R2.

The color separating lens array 130 may form different phase profiles in the first wavelength light Lλ1 and the second wavelength light Lλ2 included in the incident light Li so that the first wavelength light Lλ1 may be condensed on the first target region R1 and the second wavelength light Lλ2 may be condensed on the second target region R2.

For example, referring to FIG. 25B, the color separating lens array 130 may allow the first wavelength light Lλ1 to have a first phase profile PP1 and the second wavelength light Lλ2 to have a second phase profile PP2 at a position right after passing through the color separating lens array 130, i.e., at a lower surface position of the color separating lens array 130, so that the first wavelength light Lλ1 and the second wavelength light Lλ2 may be condensed on the respective corresponding first and second target regions R1 and R2. Specifically, the first wavelength light Lλ1 passing through the color separating lens array 130 may have the phase profile PP1 that is the largest at the center of the first region 131, and is reduced in a direction away from the center of the first region 131, that is, in a direction of the second region 132. This phase profile may be similar to a phase profile of light converging to a point through a convex lens, for example, a microlens having a convex center, and the first wavelength light Lλ1 may be condensed on the first target region R1. In addition, the second wavelength light Lλ2 passing through the color separating lens array 130 may have the phase profile PP2 that is the largest at the center of the second region 132, and is reduced in a direction away from the center of the second region 132, that is, in a direction of the first region 131, and may be condensed on the second target region R2.

Because the refractive index of a material depends on the wavelength of reacting light, the color separating lens array 130 may provide different phase profiles with respect to the first wavelength light Lλ1 and the second wavelength light Lλ2, as shown in FIG. 25B. For example, because the same material has a different refractive index according to the wavelength of light reacting to the material and a phase delay experienced by light when passing through the material is also different for each wavelength, a different phase profile may be formed for each wavelength. For example, the refractive index of the first region 131 with respect to the first wavelength light Lλ1 may be different from the refractive index of the first region 131 with respect to the second wavelength light Lλ2, and the phase delay experienced by the first wavelength light Lλ1 passing through the first region 131 and the phase delay experienced by the second wavelength light Lλ2 passing through the first region 131 may be different from each other, and thus, the color separating lens array 130 designed considering the characteristics of light may provide different phase profiles with respect to the first wavelength light Lλ1 and the second wavelength light Lλ2.

The color separating lens array 130 may include the nanoposts NP arranged in a specific rule so that the first wavelength light Lλ1 and the second wavelength light Lλ2 have first and second phase profiles PP1 and PP2, respectively. Here, the rule may be applied to parameters, such as the shape of the nanoposts NP, sizes (width and height), a distance between the nanoposts NP, and the arrangement form thereof, and these parameters may be determined according to a phase profile to be implemented through the color separating lens array 130.

A rule in which the nanoposts NP are arranged in the first region 131, and a rule in which the nanoposts NP are arranged in the second region 132 may be different from each other. For example, the shape, size, space, and/or arrangement of the nanoposts NP included in the first region 131 may be different from the shape, size, space, and/or arrangement of the nanoposts NP included in the second region 132.

The cross-sectional diameters of the nanoposts NP may have sub-wavelength dimensions. Here, the sub-wavelength refers to a wavelength less than a wavelength band of light to be branched. The nanoposts NP may have dimensions less than a shorter wavelength among first and second wavelengths. When the incident light Li is a visible ray, the cross-sectional diameters of the nanoposts NP may have dimensions less than 400 nm, 300 nm, or 200 nm. The heights of the nanoposts NP may be 500 nm to 1500 nm, and may be larger than the cross-sectional diameters thereof. The nanoposts NP may be a combination of two or more posts stacked in a height direction (Z direction).

The nanoposts NP may include a material having a higher refractive index than that of a peripheral material For example, the nanoposts NP may include c-Si, p-Si, a-Si, and a Group III-V compound semiconductor (gallium phosphide (GaP), gallium nitride (GaN), gallium arsenide (GaAs), etc.), silicon carbide (SiC), titanium oxide ($TiO_2$), silicon nitride (SiN), and/or a combination thereof. The nanoposts NP having a difference in a refractive index from the refractive index of the peripheral material may change a phase of light that passes through the nanoposts NP. This is caused by a phase delay due to the shape dimension of the sub-wavelength of the nanoposts NP, and a degree of the phase delay may be determined by detailed shape dimensions, arrangement types, etc. of the nanoposts NP. The peripheral material of the nanoposts NP may include a dielectric material having a lower refractive index than that of the nanoposts NP, for example, $SiO_2$ or air.

The first wavelength and the second wavelength may be in a wavelength band of visible rays, but are not limited thereto. The first wavelength and the second wavelength may be in a variety of wavelengths according to the arrangement rule of the nanoposts NP. Although two wavelengths are branched and condensed, incident light may be branched into three or more directions according to wavelengths and condensed.

Hereinafter, an example in which the color separating lens array 130 described above is applied to the pixel array 1100 of the image sensor 1000 will be described below.

Figure 26A:
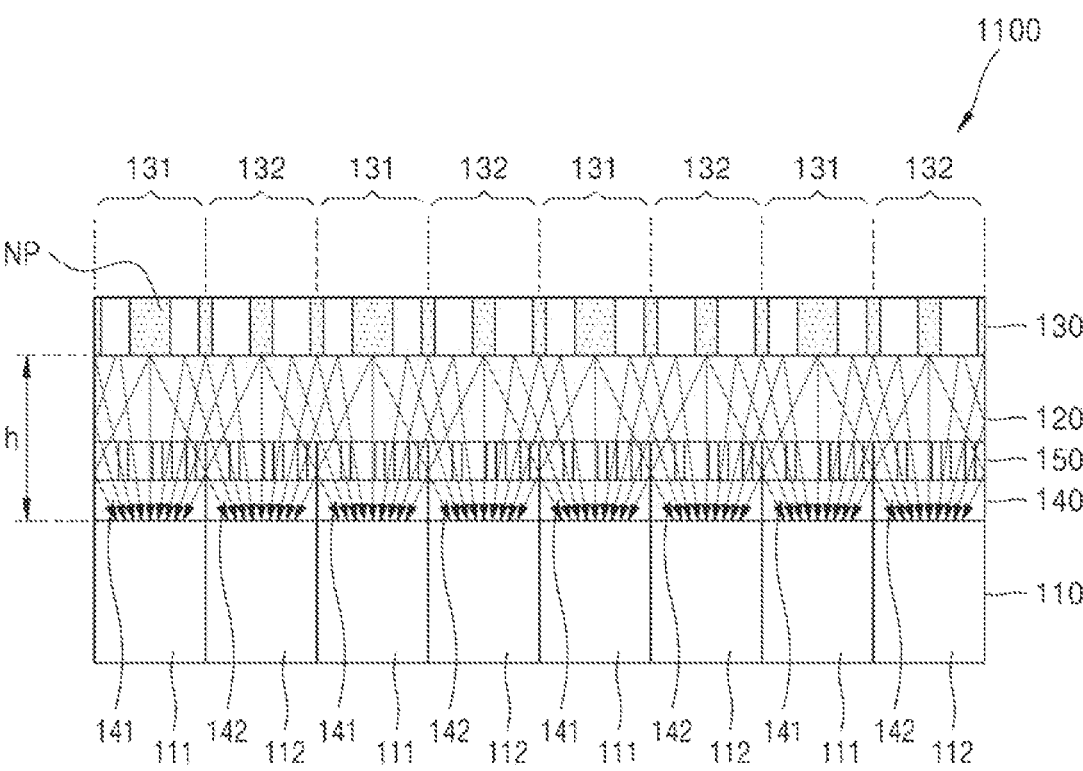
FIGS. 26A and 26B are schematic cross-sectional views of a pixel array of an image sensor according to an example embodiment.
Figure 26A:
Figure 26B:
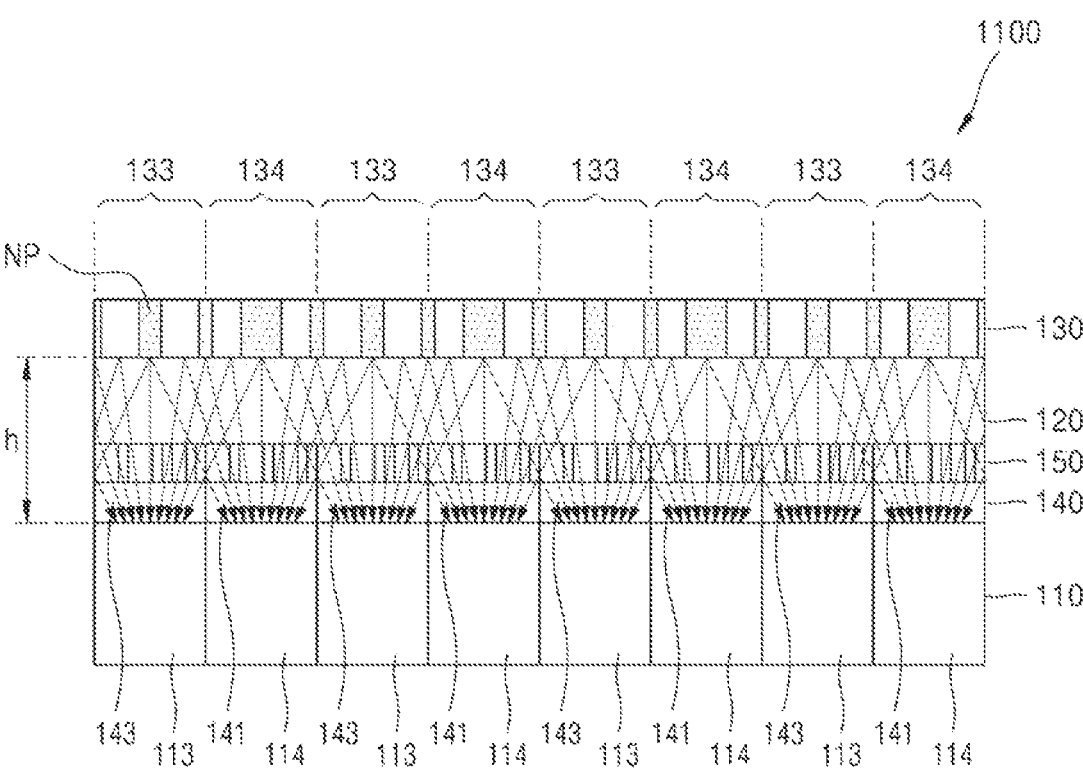
Figure 26B:
Figure 27A:
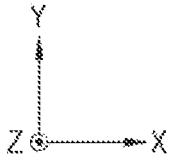
FIG. 27A is a plan view showing an arrangement of light sensing cells.
Figure 27B:
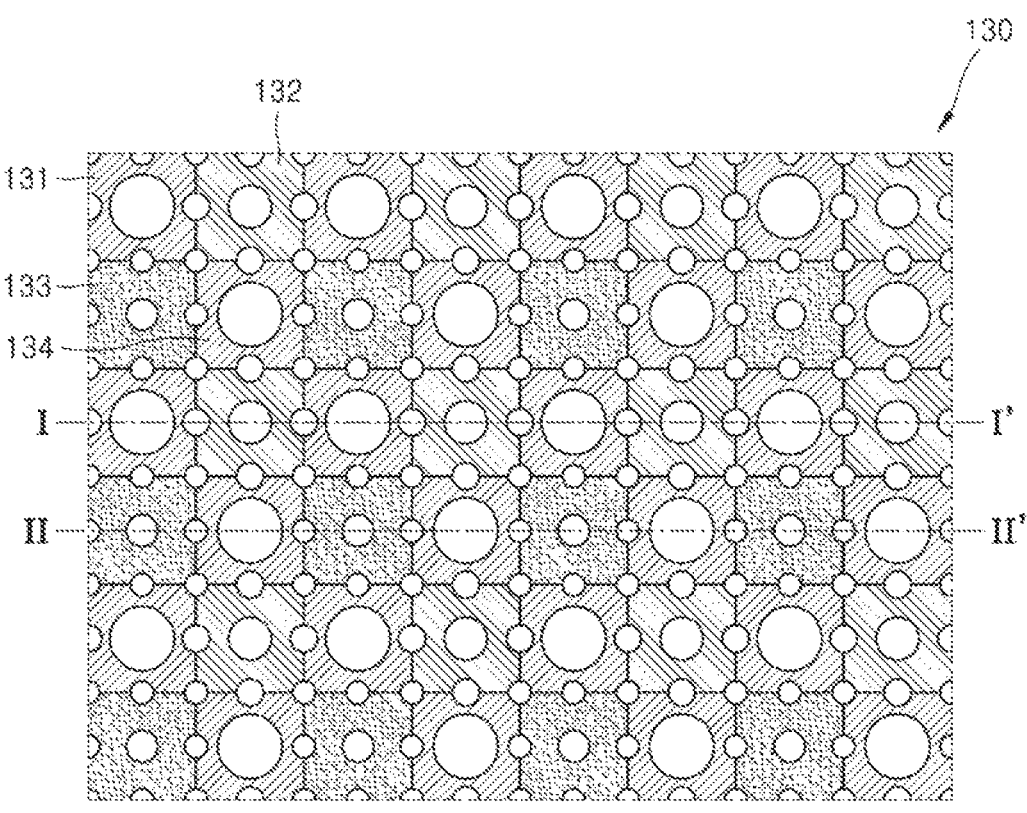
FIG. 27B is a plan view showing an example of an arrangement of nanoposts of a color separating lens array.
Figure 27B:
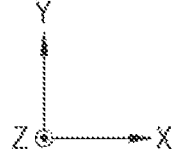
Figure 27C:
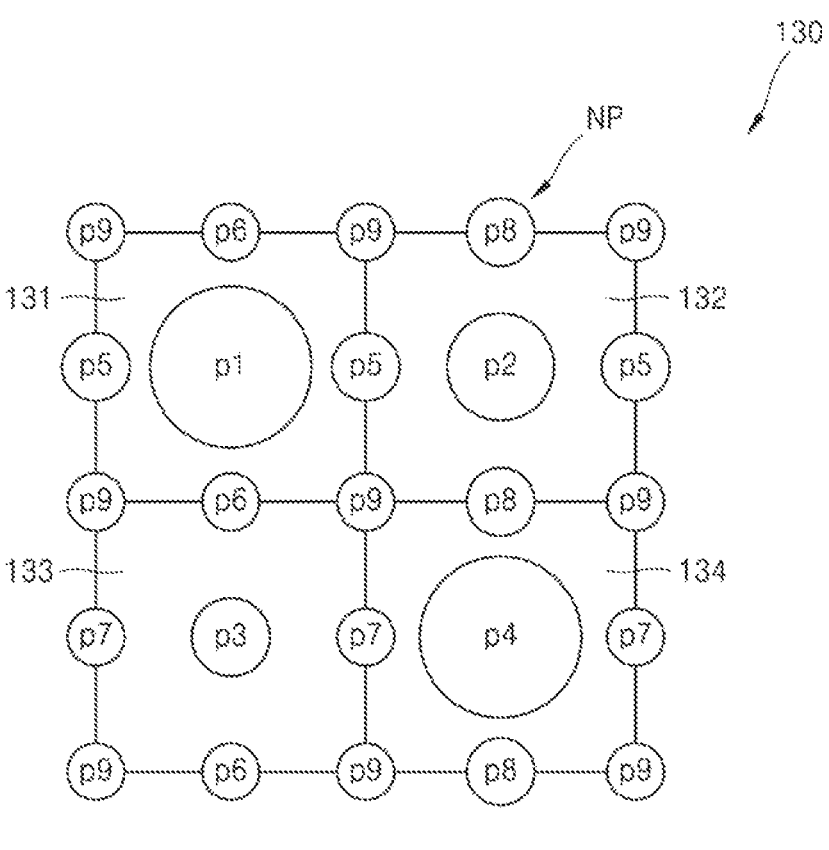
FIG. 27C is a detailed and enlarged plan view of a part of FIG. 27B.
Figure 27C:

FIGS. 26A and 26B are schematic cross-sectional views of the pixel array 1100 of an image sensor according to an example embodiment. FIG. 27A is a schematic plan view showing an arrangement of light sensing cells 111, 112, 113, and 114, FIG. 27B is a plan view showing an example of an arrangement of the nanoposts NP of the color separating lens array 130, and FIG. 27C is a detailed and enlarged plan view of a part of FIG. 27B.

Referring to FIGS. 26A and 26B, the pixel array 1100 may include the sensor substrate 110 including the plurality of light sensing cells 111, 112, 113, and 114 sensing light, the color filter layer 140 disposed on the sensor substrate 110, the planar nanophotonic microlens array 150 disposed on the color filter layer 140, a transparent spacer layer 120 disposed on the planar nanophotonic microlens array 150, and the color separating lens array 130 disposed on the spacer layer 120.

As shown in FIG. 26A, the first and second sensing cells 111 and 112 may be alternately arranged in the first direction (X direction), and in a cross-section in which a Y direction position is different from FIG. 26A, as shown in FIG. 26B, the third and fourth light sensing cells 113 and 114 may be alternately arranged. As shown in FIG. 26A, the first and second color filters 141 and 142 may also be alternately arranged in the X direction), and in a cross-section in which a Y direction position is different from FIG. 26A, as shown in FIG. 26B, the third and first color filters 143 and 141 may be alternately arranged. FIG. 27A shows an arrangement of the light sensing cells 111, 112, 113, and 114 when the pixel array 1100 has the Bayer pattern as shown in FIG. 24A. This arrangement is for individually sensing incident light with a unit pattern such as the Bayer pattern. For example, the first and fourth light sensing cells 111 and 114 arranged to face the first color filter 141 may sense first wavelength light, the second light sensing cell 112 arranged to face the second color filter 142 may sense second wavelength light, and the third light sensing cell 113 arranged to face the third color filter 143 may sense third wavelength light. Hereinafter, as an example, the first wavelength light is illustrated as green light, the second wavelength light is illustrated as blue light, and the third wavelength light is illustrated as red light, and the first and fourth light sensing cells 111 and 114 may correspond to a green pixel G, the second light sensing cell 112 may correspond to a blue pixel B, and the third light sensing cell 113 may correspond to a red pixel R. A separator for separating cells may be further formed in a boundary between cells.

The spacer layer 120 may be disposed between the sensor substrate 110 and the color separating lens array 130 to maintain a gap between the sensor substrate 110 and the color separating lens array 130 to be constant. The spacer layer 120 may include a transparent material with respect to the visible ray, for example, a dielectric material having a lower refractive index than that of the nanoposts NP and a low absorption coefficient in the visible ray band, for example, $SiO_2$, siloxane-based spin on glass (SOG), etc. The planar nanophotonic microlens array 150 may be regarded as a structure buried in the spacer layer 120. The thickness h of the spacer layer 120 may be selected to be within the range of $h_t - p \leq h \leq h_t + p$. In this regard, when a theoretical thickness $h_t$ of the spacer layer 120 may be expressed by Equation 1 below when a refractive index of the spacer layer 120 with respect to a wavelength $\lambda_0$ is n, a pitch of a light sensing cell is p.

$$h_t = \frac{np^2}{\lambda_0} - \frac{\lambda_0}{4n} \qquad \text{[Equation 1]}$$

Here, the theoretical thickness $h_t$ of the spacer layer 120 may refer to a focal length at which light having a wavelength of $\lambda_0$ is condensed onto an upper surface of the light sensing cells 111, 112, 113, and 114 by the color separating lens array 130. $\lambda_0$ may be a reference wavelength for determining the thickness h of the spacer layer 120, and the thickness of the spacer layer 120 may be designed with respect to 540 nm, which is the central wavelength of green light.

The color separating lens array 130 may be supported by the spacer layer 120 and may include the nanoposts NPs that change the phase of incident light and dielectrics, such as air or $SiO_2$, disposed between the nanoposts NPs and having refractive indexes lower than those of the nanoposts NP.

Referring to FIG. 27B, the color separating lens array 130 may be divided into first to fourth regions 131, 132, 133, and 134 respectively corresponding to the first to fourth light sensing cells 111, 112, 113, and 114 of FIG. 27A. The first to fourth regions 131, 132, 133, and 134 may be disposed to face the first to fourth light sensing cells 111, 112, 113, and 114, respectively. For example, the first region 131 of the color separating lens array 130 may be disposed to correspond to the first light sensing cell 111, the second region 132 may be disposed to correspond to the second light sensing cell 112, the third region 133 may be disposed to correspond to the third light sensing cell 113, and the fourth region 134 may be disposed to correspond to the fourth light sensing cell 114. The first to fourth regions 131, 132, 133, and 134 may be two-dimensionally arranged in the first direction (X direction) and the second direction (Y direction) so that a first row in which the first and second regions 131 and 132 are alternately arranged, and a second row in which the third and fourth regions 133 and 134 are alternately arranged are alternately repeated to each other. The color separating lens array 130 may also include a plurality of two-dimensionally arranged unit patterns like a light sensing cell array of the sensor substrate 110, and each unit pattern may include the first to fourth regions 131, 132, 133 and 134 arranged in a 2×2 form.

FIGS. 26A and 26B show a structure in which the first to fourth regions 131, 132, 133, and 134 and the first to fourth light sensing cells 111, 112, 113, and 114 have the same size and face each other in a vertical direction as an example, but the color separating lens array 130 may be divided into a plurality of regions defined in other forms, such as a region condensing first wavelength light, a region condensing second wavelength light, etc.

The color separating lens array 130 may include the nanoposts NP of which size, shape, space and/or arrangement are determined so that the first wavelength light is branched and condensed on the first light sensing cell 111 and the fourth light sensing cell 114, the second wavelength light is branched and condensed on the second light sensing cell 112, and the third wavelength light is branched and condensed on the third light sensing cell 113. The thickness (Z direction) of the color separating lens array 130 may be similar to the heights of the nanoposts NP, and may be about 500 nm to about 1500 nm.

Referring to FIG. 27B, the first to fourth regions 131, 132, 133, and 134 may include the nanoposts NP each having a cylindrical shape of a circular cross-section. The nanoposts NP having different cross-sectional areas from one another are arranged on the center portion of each of the first to fourth regions 131, 132, 133, and 134. The nanoposts NP may be also arranged on the center of a boundary between pixels and a crossing point of the pixel boundaries. The cross-sectional area of the nanoposts NP arranged at the boundary between pixels may be less than those of the nanoposts NP arranged at the center portion of the pixel.

FIG. 27C is a detailed view of the arrangement of the nanoposts NP in partial regions of FIG. 27B, that is, the first to fourth regions 131, 132, 133, and 134 constituting the unit pattern. In FIG. 27C, the nanoposts NP are indicated as p1 to p9 according to detailed positions thereof in the unit pattern. Referring to FIG. 27C, from among the nanoposts NP, a nanopost p1 on the center portion of the first region 131 and a nanopost p4 on the center portion of the fourth region 134 have larger cross-sectional areas than those of a nanopost p2 on the center portion of the second region 132 or a nanopost p3 on the center portion of the third region 133, and the nanopost p2 on the center portion of the second region 132 has a larger cross-sectional area than that of the nanopost p3 on the center portion of the third region 133. However, this is merely an example, and if necessary, the nanoposts NP having various shapes, sizes, and arrangements may be applied.

The nanoposts NP included in the first and fourth regions 131 and 134 corresponding to the green pixel G may have different distribution rules in the first direction (X direction) and the second direction (Y direction). For example, the nanoposts NP arranged in the first and fourth regions 131 and 134 may have different size arrangements in the first direction (X direction) and the second direction (Y direction). As shown in FIG. 27C, from among the nanoposts NP, a cross-sectional area of a nanopost p5 positioned at a boundary between the first region 131 and the second region 132 that is adjacent to the first region 131 in the first direction (X direction) is different from that of a nanopost p6 positioned at a boundary between the first region 131 and the third region 133 that is adjacent to the first region 131 in the second direction (Y direction). Likewise, a cross-sectional area of a nanopost p7 at the boundary between the fourth region 134 and the third region 133 that is adjacent to the fourth region 134 in the first direction (X direction) is different from that of a nanopost p8 positioned at the boundary between the fourth region 134 and the second region 132 that is adjacent to the fourth region 134 in the second direction (Y direction).

The nanoposts NP arranged in the second region 132 corresponding to the blue pixel B and the third region 133 corresponding to the red pixel R may have symmetrical distribution rules in the first direction (X direction) and the second direction (Y direction). As shown in FIG. 27C, from among the nanoposts NP, in the second region 132, the cross-sectional area of the nanoposts p5 at a boundary between adjacent pixels in the first direction (X direction) and the cross-sectional areas of the nanoposts p8 at a boundary between adjacent pixels in the second direction (Y direction) are the same as each other, and in the same manner, in the third region 133, the cross-sectional areas of the nanoposts p7 at a boundary between adjacent pixels in the first direction (X direction) and the cross-sectional areas of the nanoposts p6 at a boundary between the adjacent pixels in the second direction (Y direction) are the same as each other.

In addition, the nanoposts p9 at four corners in each of the first to fourth regions 131, 132, 133, and 134, that is, points where the four regions cross one another, have the same cross-sectional areas from one another.

The above distribution is caused by the pixel arrangement in the Bayer pattern. Adjacent pixels to the blue pixel B and the red pixel R in the first direction (X direction) and the second direction (Y direction) are the green pixels G, whereas the adjacent pixel to the green pixel G corresponding to the first region 131 in the first direction (X direction) is the blue pixel B and the adjacent pixel to the green pixel G in the second direction (Y direction) is the red pixel R. In addition, the adjacent pixel to the green pixel G corresponding to the fourth region 134 in the first direction (X direction) is the red pixel R and the adjacent pixel to the green pixel G in the second direction (Y direction) is the blue pixel B. In addition, the green pixels G corresponding to the first and fourth regions 131 and 134 are adjacent to the same pixels, for example, the green pixels G in four diagonal directions, the blue pixel B corresponding to the second region 132 is adjacent to the same pixels, for example, the red pixels R in four diagonal directions, and the red pixel R corresponding to the third region 133 is adjacent to the same pixels, for example, the blue pixels B in four diagonal directions. Therefore, in the second and third regions 132 and 133 respectively corresponding to the blue pixel B and the red pixel R, the nanoposts NP may be arranged in the form of 4-fold symmetry, and in the first and fourth regions 131 and 134 corresponding to the green pixels G, the nanoposts NP may be arranged in the form of 2-fold symmetry. In particular, the first region 131 and the fourth region 134 are rotated by a 90° angle with respect to each other.

The nanoposts NP of FIGS. 27B and 27C have symmetrical circular cross-sectional shapes. However, some nanoposts having asymmetrical cross-sectional shapes may be included. For example, the first and fourth regions 131 and 134 corresponding to the green pixel G may employ the nanoposts having an asymmetrical cross-sectional shape that have different widths in the first direction (X direction) and the second direction (Y direction), and the second and third regions 132 and 133 corresponding to the blue pixel B and the red pixel R may employ the nanoposts having a symmetrical cross-sectional shape that have identical widths in the first direction (X direction) and the second direction (Y direction).

The arrangement rule of the color separating lens array 130 is an example for implementing the phase profile in which light having a first wavelength is branched and condensed onto the first and fourth light sensing cells 111 and 114, light having a second wavelength is branched and condensed onto the second light sensing cell 112, and light having a third wavelength is branched and condensed onto the third light sensing cell 113, and this arrangement rule is not limited to the illustrated patterns.

Figure 28A:
FIG. 28A shows the phase profiles of first and second wavelength light passing through a color separating lens array along line I-I' of FIG. 27B.
Figure 28B:
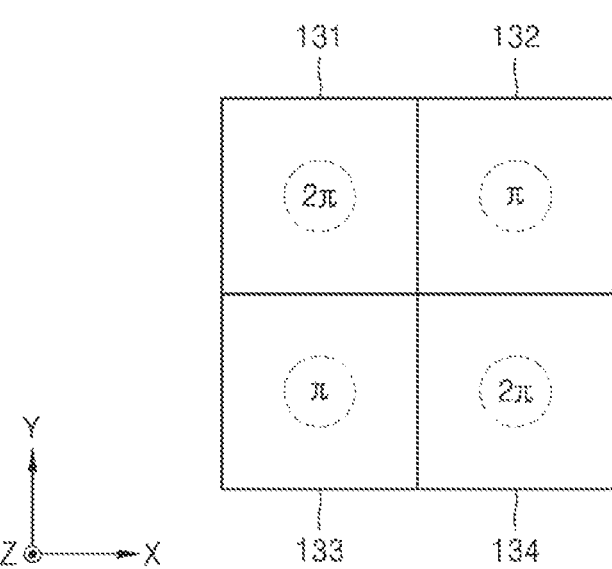
FIG. 28B shows a phase of the first wavelength light passing through the color separating lens array at the center of first to fourth regions.
Figure 28C:
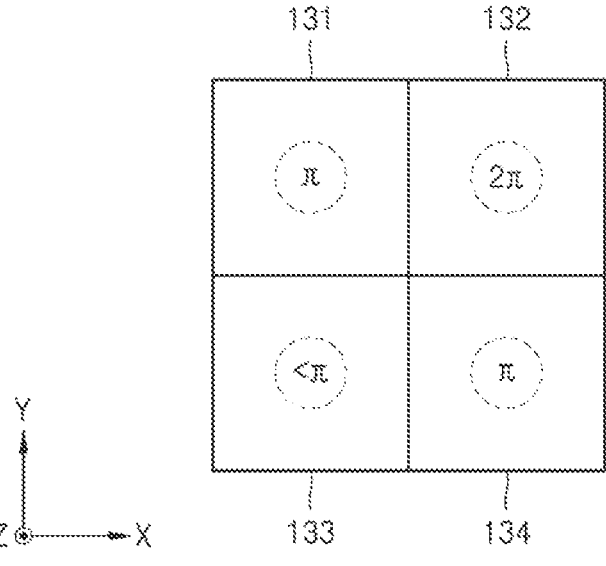
FIG. 28C shows a phase of the second wavelength light passing through the color separating lens array at the center of the first to fourth regions.

FIG. 28A shows the phase profiles PP1 and PP2 of first and second wavelength light passing through the color separating lens array 130 along line I-I' of FIG. 27B, FIG. 28B shows a phase of the first wavelength light passing through the color separating lens array 130 at the center of the first to fourth regions 131, 132, 133 and 134, and FIG. 28C shows a phase of the second wavelength light passing through the color separating lens array 130 at the center of the first to fourth regions 131, 132, 133, and 134. The phase profiles PP1 and PP2 of the first and second wavelength light illustrated in FIG. 28A are the same as the phase profiles PP1 and PP2 of the light of the first and second wavelengths described with reference to FIG. 25B.

Referring to FIGS. 28A and 28B, the first wavelength light passing through the color separating lens array 130 may have the phase profile PP1 that is the largest at the center of the first region 131, and is reduced in a direction away from the center of the first region 131. For example, the phase of the first wavelength may be the largest at the center of the first region 131, may be gradually reduced in the form of a concentric circle away from the center of the first region 131, may be the smallest at the center of the second and third regions 132 and 133 in the X and Y directions, and may be the smallest at a contact point between the first region 131 and the fourth region 134 in the diagonal direction, at a position right after passing through the color separating lens array 130, at a lower surface position of the color separating lens array 130 or at an upper surface of the spacer layer 120. When $2\pi$ is determined with respect to the phase of the first wavelength light emitted from the center of the first region 131, light of the phase which is $0.9\pi$ to $1.1\pi$ at the center of the second and third regions 132 and 133, of the phase which is $2\pi$ at the center of the fourth region 134, and of the phase which is $1.1\pi$ to $1.5\pi$ at the contact point between the first region 131 and the fourth region 134 may be emitted. The first phase profile PP1 may not mean that a phase delay amount of the light passing through the center of the first region 131 is the largest. When the phase of the light passing through the first region 131 is determined as $2\pi$, a phase value of light passing through another position (when the phase delay is larger than $2\pi$) may be a value remaining by removing by $2n\pi$, that is, a profile of a wrapped phase. For example, when the phase of light passing through the first region 131 is $2\pi$, and the phase of light passing through the center of the second region 132 is $3\pi$, the phase in the second region 132 may be $\pi$ remaining by removing $2\pi$ (when n=1) from $3\pi$.

Referring to FIGS. 28A and 28C, the second wavelength light passing through the color separating lens array 130 may have the phase profile PP2 that is the largest at the center of the second region 132 and is reduced in a direction away from the center of the second region 132. Specifically, the phase of the second wavelength may be the largest at the center of the second region 132, may be gradually reduced in the form of a concentric circle away from the center of the second region 132, may be the smallest at the center of the first and fourth regions 131 and 134 in the X and Y directions, and may be the smallest at the center of the third region 133 in the diagonal direction, at a position right after passing through the color separating lens array 130. When the phase of the second wavelength light at the center of the second region 132 is $2\pi$, the phase of the second wavelength light may be $0.9\pi$ to $1.1\pi$ at the center of the first and fourth regions 131 and 134, and may be a value less than $\pi$, for example, $0.2\pi$ to $0.9\pi$, at the center of the third region 133.

Figures 28D, 28E:
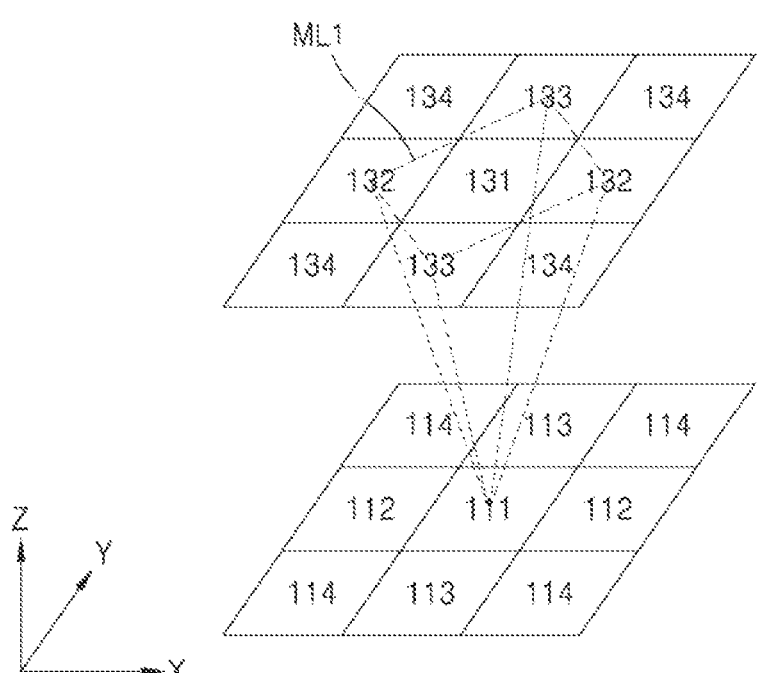
FIG. 28D shows an example of a traveling direction of first wavelength light incident on a first region of a color separating lens array of FIGS. 28A and 28B and the periphery thereof.
FIG. 28E shows an example of a microlens array equivalent to the color separating lens array with respect to the first wavelength light.

FIG. 28D shows an example of a traveling direction of the first wavelength light incident on the first region 131 of the color separating lens array 130 of FIGS. 28A and 28B and the periphery thereof, and FIG. 28E shows an example of a microlens array equivalent to the color separating lens array 130 with respect to the first wavelength light.

The first wavelength light incident on the periphery of the first region 131 is condensed on the first light sensing cell 111 by the color separating lens array 130 as shown in FIG. 28D, and the first wavelength light from the first to third regions 131, 132, and 133 is incident on the first light sensing cell 111. The phase profile of the first wavelength light described with respect to FIGS. 28A and 28B is similar to a phase profile of light passing through a virtual first microlens ML1 by connecting the centers of two second regions 132 and two third regions 133 adjacent to the first region 131 with one side facing each other. Accordingly, as shown in FIG. 28E, the color separating lens array 130 may be equivalent to an array of the plurality of first microlenses ML1 arranged based on the first region 131 with respect to the first wavelength light incident on the periphery of the first region 131. Because each of the equivalent first microlenses ML1 has a larger area than the corresponding first light sensing cell 111, not only the first wavelength light incident on the first region 131 but also the first wavelength light incident on the second and third regions 132 and 133 may also be condensed on the first light sensing cell 111. The area of the first microlens ML1 may be 1.2 times to 2 times larger than the area of the corresponding first light sensing cell 111.

Figure 28F:
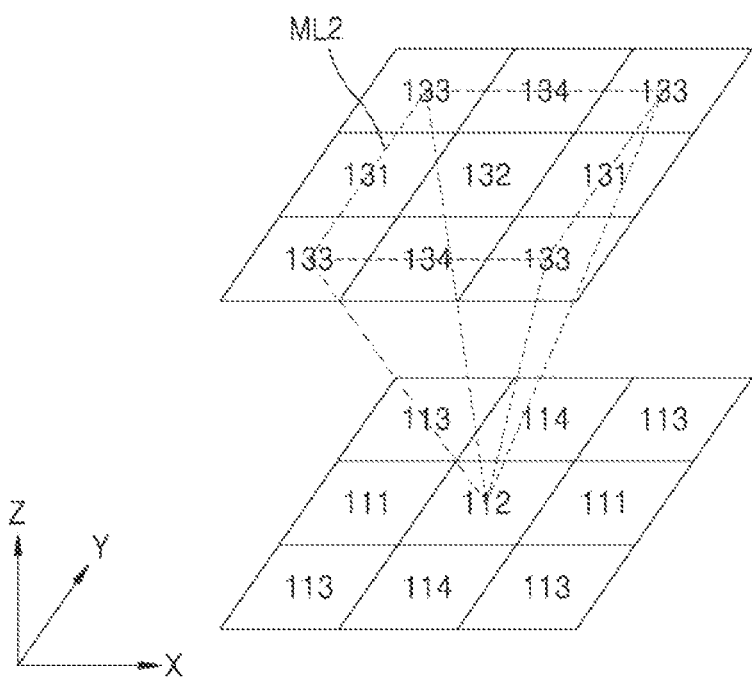
FIG. 28F shows an example of a traveling direction of second wavelength light incident on a second region of the color separating lens array of FIGS. 28A and 28B and the periphery thereof.
Figure 28G:
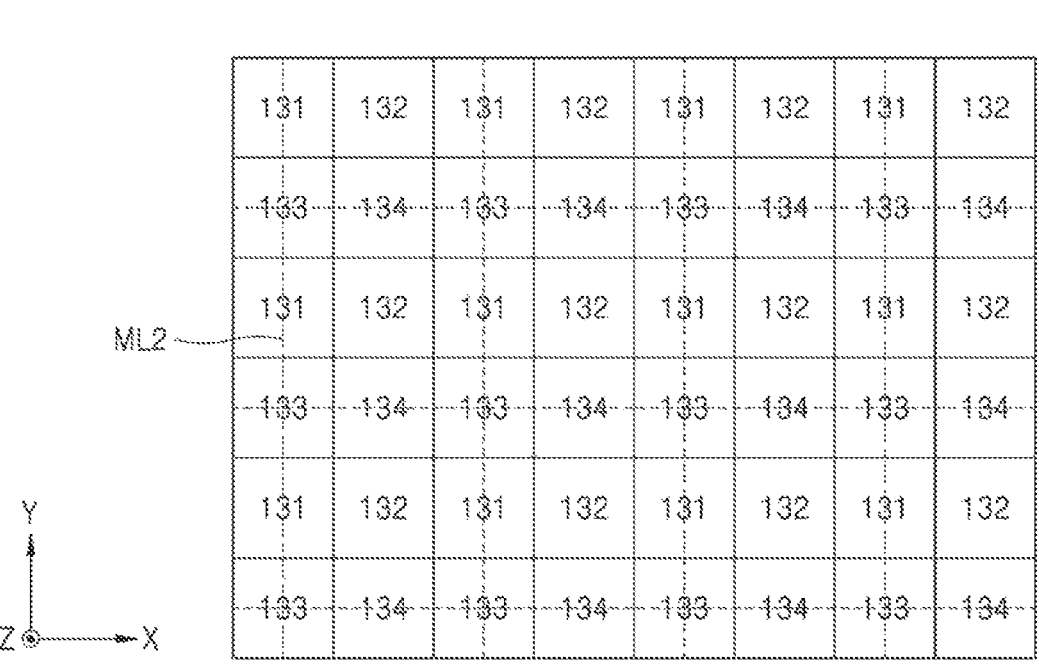
FIG. 28G shows an example of a microlens array equivalent to the color separating lens array with respect to the second wavelength light.

FIG. 28F shows an example of a traveling direction of the second wavelength light incident on the second region 132 of the color separating lens array 130 of FIGS. 28A and 28B and the periphery thereof, and FIG. 28G shows an example of a microlens array equivalent to the color separating lens array 130 with respect to the second wavelength light.

The second wavelength light is condensed on the second light sensing cell 112 by the color separating lens array 130 as shown in FIG. 28F, and the second wavelength light from the first to fourth regions 131, 132, 133, and 134 is incident on the second light sensing cell 112. The phase profile of the second wavelength light described above with reference to FIGS. 28A and 28C is similar to a phase profile of light passing through a virtual second microlens ML2 by connecting the centers of four third regions 133 adjacent to the second region 132 with vertexes facing each other. Accordingly, as shown in FIG. 28G, the color separating lens array 130 may be equivalent to an array of the plurality of second microlenses ML2 arranged based on the second region 132 with respect to the second wavelength light. Because each of the second micro lenses ML2 is larger than the corresponding second light sensing cell 112, not only the second wavelength light incident in a direction of the second light sensing cell 112 but also the second wavelength light incident in directions of the first, third, and fourth light sensing cells 111, 113, and 114 may also be condensed on the second light sensing cell 112. The area of the second microlens ML2 may be 1.5 to 4 times larger than the area of the corresponding second light sensing cell 112.

Figure 29A:
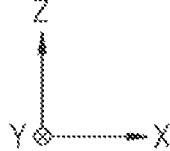
FIG. 29A shows phase profiles of first and third wavelength light passing through the color separating lens array along line II-II' of FIG. 27B.
Figure 29B:
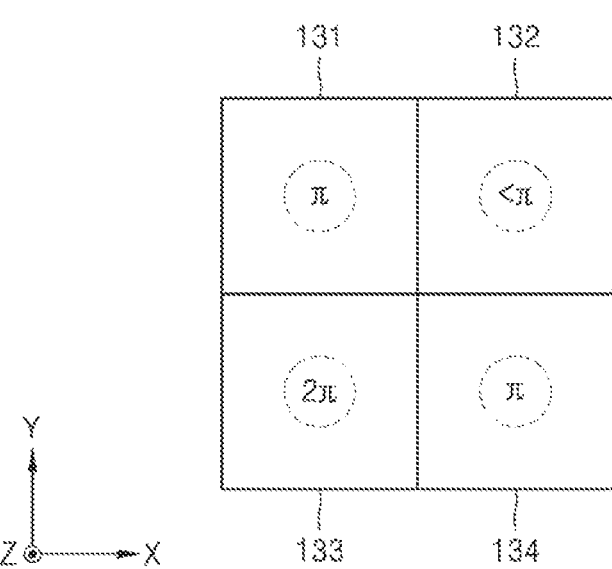
FIG. 29B shows a phase of the third wavelength light passing through a color separating lens array at the center of first to fourth regions.
Figure 29C:
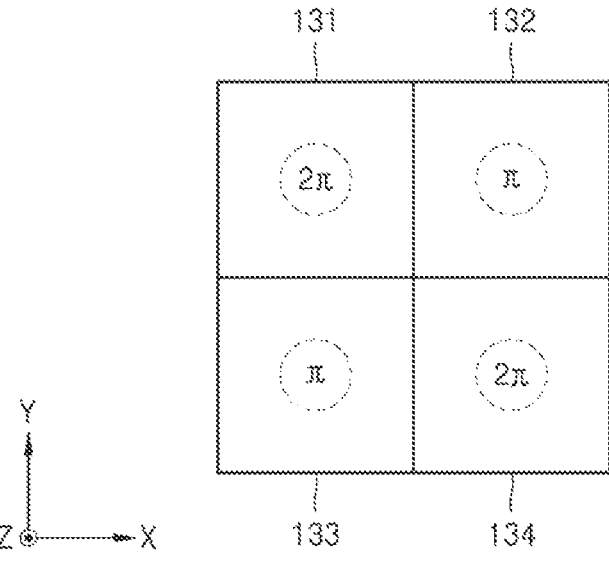
FIG. 29C shows a phase of the first wavelength light passing through the color separating lens array at the center of the first to fourth regions.

FIG. 29A shows phase profiles PP4 and PP3 of first and third wavelength light passing through the color separating lens array 130 along line II-II' of FIG. 27B, FIG. 29B shows a phase of the third wavelength light passing through the color separating lens array 130 at the center of the first to fourth regions 131, 132, 133, and 134, and FIG. 29C shows a phase of the first wavelength light passing through the color separating lens array 130 at the center of the first to fourth regions 131, 132, 133, and 134.

Referring to FIGS. 29A and 29B, the third wavelength light passing through the color separating lens array 130 may have the third phase profile PP3 similar to that of the second wavelength light with respect to the second region 132 described above. The phase profile PP3 may be the largest at the center of the third region 133 and reduced in a direction away from the center of the third region 133. Specifically, the phase of the third wavelength light may be the largest at the center of the third region 133, may be gradually reduced in the form of a concentric circle away from the center of the third region 133, may be the smallest at the center of the first and fourth regions 131 and 134 in the X and Y directions, and may be the smallest at the center of the second region 132 in the diagonal direction, at a position right after passing through the color separating lens array 130. When the phase of the third wavelength light at the center of the third region 133 is $2\pi$, the phase of the third wavelength light may be $0.9\pi$ to $1.1\pi$ at the center of the first and fourth regions 131 and 134, and may be a value less than $\pi$, about $0.2\pi$ to $0.9\pi$, at the center of the second region 132.

Figures 29D, 29E:
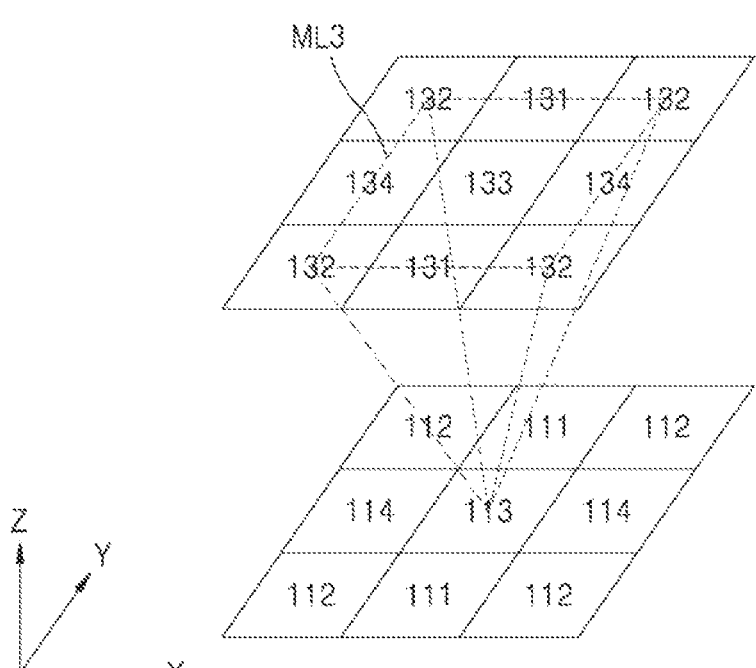
FIG. 29D shows an example of a traveling direction of third wavelength light incident on a third region of the color separating lens array of FIGS. 29A and 29B and the periphery thereof.
FIG. 29E shows an example of a microlens array equivalent to the color separating lens array with respect to the third wavelength light.

FIG. 29D shows an example of a traveling direction of the third wavelength light incident on the third region 133 of the color separating lens array 130 of FIGS. 29A and 29B and the periphery thereof, and FIG. 29E shows an example of a microlens array equivalent to the color separating lens array 130 with respect to the third wavelength light.

The third wavelength light is condensed by the color separating lens array 130 to the third light sensing cell 113 as shown in FIG. 29D, and the third wavelength light from the first to fourth regions 131, 132, 133, and 134 is incident on the third light sensing cell 113. The phase profile of the third wavelength light described above with reference to FIGS. 29A and 29B is similar to a phase profile of light passing through a virtual third microlens ML3 by connecting the centers of four second regions 132 adjacent to the third region 133 with vertexes facing each other. Therefore, as shown in FIG. 29E, the color separating lens array 130 may be equivalent to an array of the plurality of third microlenses ML3 arranged based on the third light sensing cell 113 with respect to the third wavelength light. Because the area of each of the third microlenses ML3 is larger than that of the corresponding third light sensing cell 113, not only the third wavelength light incident in a direction of the third light sensing cell 113 but also the third wavelength light incident in directions of the first, second, and fourth light sensing cells 111, 112, and 114 may also be condensed on the third light sensing cell 113. The area of the third microlens ML3 may be 1.5 to 4 times larger than the area of the corresponding third light sensing cell 113.

Referring to FIGS. 29A and 29C, the first wavelength light incident on the periphery of the fourth region 134 may have a fourth phase profile PP4 similar to that of the first wavelength light with respect to the first region 131 described above. The phase profile may be the largest at the center of the fourth region 134 and reduced in a direction away from the center of the fourth region 134. The phase of the first wavelength light with respect to the fourth region 134 may be the largest at the center of the fourth region 134, may be gradually reduced in the form of a concentric circle away from the center of the fourth region 134, may be the smallest at the center of the second and third regions 132 and 133 in the X and Y directions, and may be the smallest at a contact point of the first region 131 and the fourth region 134 in the diagonal direction, at a position right after passing through the color separating lens array 130. When the phase of the first wavelength light is $2\pi$ at the center of the fourth region 134, the phase of the first wavelength light may be $0.9\pi$ to $1.1\pi$ at the center of the second and third regions 132 and 133, $2\pi$ at the center of the first region 131, and $1.1\pi$ to $1.5\pi$ at the contact point of the first region 131 and the fourth region 134.

Figures 29F, 29G:
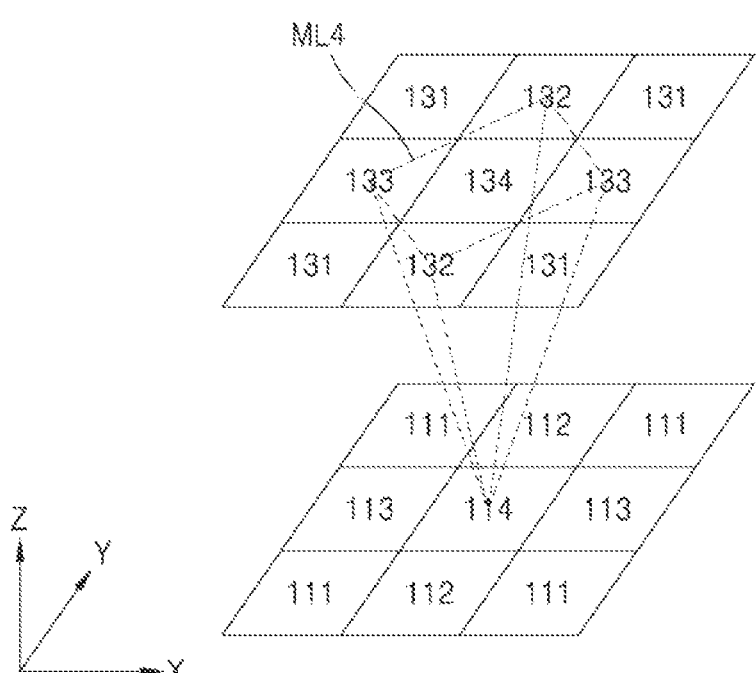
FIG. 29F shows an example of a traveling direction of first wavelength light incident on a fourth region of the color separating lens array of FIGS. 29A and 29B and the periphery thereof.
FIG. 29G shows an example of a microlens array equivalent to the color separating lens array with respect to the first wavelength light.

FIG. 29F shows an example of a traveling direction of the first wavelength light incident on the fourth region 134 of the color separating lens array 130 of FIGS. 29A and 29B and the periphery thereof, and FIG. 29G shows an example of a microlens array equivalent to the color separating lens array 130 with respect to the first wavelength light. The first wavelength light is condensed on the two light sensing cells, that is, the first and fourth light sensing cells 111 and 114, and the phase profile and the travel direction of the first wavelength light incident on the fourth region 134 are similar to the phase profile and the travel direction of the first wavelength light incident on the first region 131, and thus, redundant descriptions thereof are omitted.

Referring to FIG. 29F, the first wavelength light incident on the periphery of the fourth region 134 is condensed by the color separating lens array 130 to the fourth light sensing cell 114, and the first wavelength light from the second to fourth regions 132, 133, and 134 is incident on the fourth light sensing cell 114. As shown in FIG. 29G, the color separating lens array 130 may be equivalent to an array of the plurality of fourth microlenses ML4 arranged based on the fourth light sensing cell 114 with respect to the first wavelength light incident on the periphery of the fourth region 134.

Figure 30A:
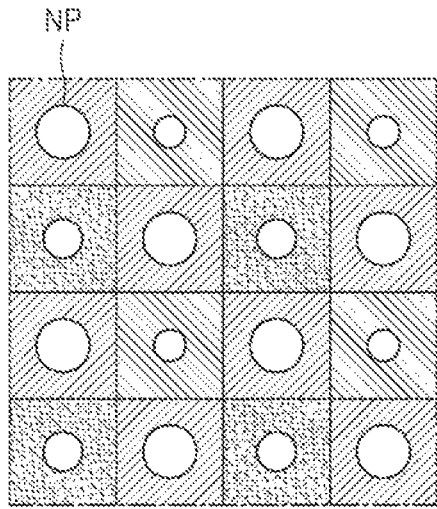
FIGS. 30A, 30B, and 30C are plan views illustrating changes in the arrangement type of nanoposts of a color separating lens array according to positions on a pixel array.
Figure 30B:
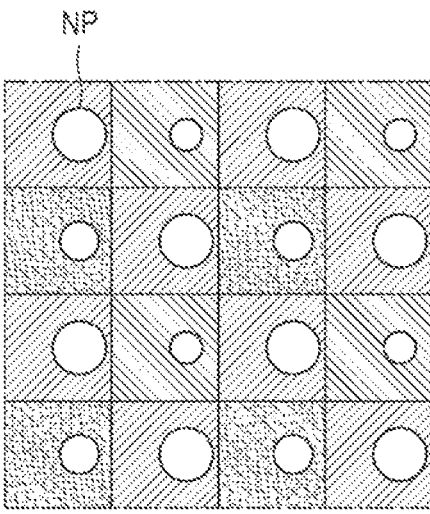
Figure 30C:
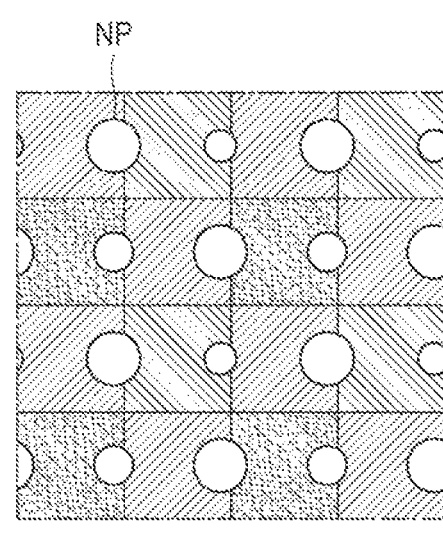

The color separating lens array 130 also operates efficiently with respect to light incident in a specific angular range, but color separation performance may deteriorate when an incident angle is away from the specific angular range. Accordingly, the arrangement shape of the nanoposts of the color separating lens array 130 may be differently designed in consideration of a CRA of the incident light that varies according to a position on the pixel array 1100. FIGS. 30A to 30C are plan views illustrating changes in the arrangement type of the nanoposts NP of the color separating lens array 130 according to positions on the pixel array 1100. In particular, FIG. 30A shows the positions of the nanoposts NP disposed at the center portion of the pixel array 1100, FIG. 30B shows the positions of the nanoposts NP disposed between the center portion and the edge of the pixel array 1100, and FIG. 30C shows the positions of the nanoposts NP disposed at the edge of the pixel array 1100. FIGS. 30A to 30C are not intended to limit a specific arrangement of the nanoposts NP, but only conceptually illustrate changes in relative positions of the nanoposts NP according to the positions on the pixel array 1100.

As shown in FIGS. 30A to 30C, a first region, a second region, a third region, and a fourth region of the color separating lens array 130 may be shifted and positioned further away from pixels or light sensing cells corresponding thereto from the center portion to the edge of the pixel array 1100. For example, positions of the first region, the second region, the third region, and the fourth region of the color separating lens array 130 may coincide with positions of a green pixel, a blue pixel, a red pixel, and a green pixel respectively corresponding thereto (or positions of light sensing cells respectively corresponding thereto) at the center portion of the pixel array 1100, the center portion of the color separating lens array 130, or the center portion of the sensor substrate 110. As the first region, the second region, the third region, and the fourth region move away from the center portion of the pixel array 1100, the center portion of the color separating lens array 130, or the center portion of the sensor substrate 110, the first region, the second region, the third region, and the fourth region of the color separating lens array 130 may be shifted and positioned further away from positions of the green pixel, the blue pixel, the red pixel, and the green pixel respectively corresponding thereto (or positions of light sensing cells respectively corresponding thereto). Degrees at which the first region, the second region, the third region, and the fourth region of the color separating lens array 130 are shifted may be determined by a CRA of light incident on the color separating lens array 130. In particular, the first region, the second region, the third region, and the fourth region of the color separating lens array 130 may be shifted in a direction of the center portion of the pixel array 1100 with respect to a first light sensing cell, a second light sensing cell, a third light sensing cell, and a fourth light sensing cell respectively corresponding thereto at the periphery of the pixel array 1100, the periphery of the color separating lens array 130, or the periphery of the sensor substrate 110.

According to example embodiments, it has been described that the center portion of the pixel array 1100 is the actual center portion of the pixel array 1100, the pixel array 1100 includes the planar nanophotonic microlens array 150, the color separating lens array 130, and the sensor substrate 110 that are arranged to face each other, the center portion of the pixel array 1100 may also be the center portion of the planar nanophotonic microlens array 150, the center portion of the color separating lens array 130, or the center portion of the sensor substrate 110. Similarly, hereinafter, the periphery/edge of the pixel array 1100 may mean the periphery/edge of the planar nanophotonic microlens array 150, the periphery/edge of the color separating lens array 130, or the periphery/edge of the sensor substrate 110.

Figure 31:
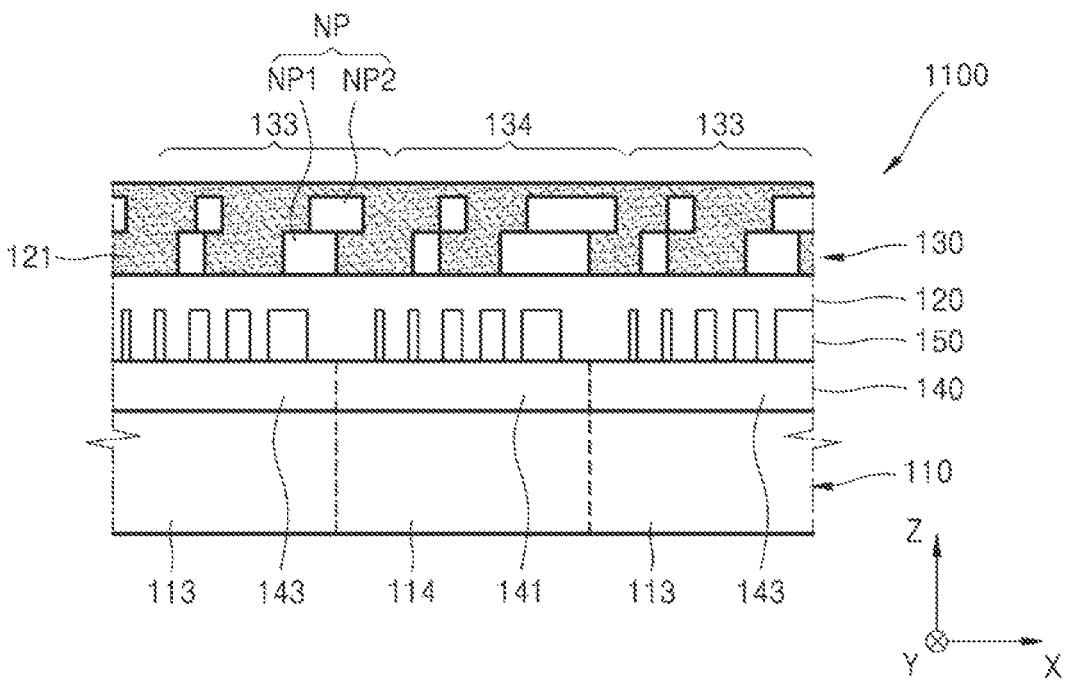
FIG. 31 is a cross-sectional view illustrating a structure of a pixel array of an image sensor according to another example embodiment.

FIG. 31 is a cross-sectional view illustrating a structure of the pixel array 1100 of an image sensor according to another example embodiment. Referring to FIG. 31, the pixel array 1100 is different from the above-described example embodiments in that the pixel array 1100 includes the color separating lens array 130 including the nanoposts NPs stacked in two stages. The nanoposts NP may include a first nanopost NP1 disposed on the spacer layer 120, and a second nanopost NP2 disposed on the first nanopost NP1. The second nanoposts NP2 may be shifted in an inclination direction of light with respect to the first nanopost NP1. For example, when light incident on the color separating lens array 130 is inclined from right to left, the second nanopost NP2 may be shifted to the right with respect to the first nanopost NP1. When the light incident on the color separating lens array

130 is inclined from left to right, the second nanopost NP2 may be shifted to the left with respect to the first nanopost NP1.

Considering the CRA of light incident on the pixel array 1100, the second nanopost NP2 may also be shifted in a direction of the center portion of the pixel array 1100 with respect to the first nanopost NP1. For example, the second nanopost NP2 from the center portion of the pixel array 1100 to the left edge may be further shifted to the right with respect to the first nanopost NP1, and the second nanopost NP2 from the center portion of the pixel array 1100 to the right edge may be further shifted to the left with respect to the first nanopost NP1.

Similarly, the third region 133 and the fourth region 134 of the color separating lens array 130 are shifted in the direction of the center portion of the pixel array 1100 with respect to a red pixel (or the third light sensing cell 113) and a green pixel (or the fourth light sensing cell 114) respectively corresponding thereto. For example, the third region 133 and the fourth region 134 of the color separating lens array 130 from the center portion of the pixel array 1100 to the left edge may be further shifted to the right with respect to the red pixel and the green pixel respectively corresponding thereto. A first region and a second region arranged in another cross-section of the color separating lens array 130 may also be shifted in the direction of the center portion of the pixel array 1100 with respect to a green pixel (or a first light sensing cell) and a blue pixel (or a second light sensing cell) respectively corresponding thereto.

In particular, the third region 133 and the fourth region 134 of the color separating lens array 130 may be shifted to respectively condense red light and green light on the center portion of the third light sensing cell 113 and the center portion of the fourth light sensing cell 114 respectively corresponding thereto. A distance s at which the third region 133 and the fourth region 134 of the color separating lens array 130 are shifted may be determined according to, for example, Equation 2 below.

$$s = d \times \tan(CRA') \qquad \text{[Equation 2]}$$

In Equation 2, d denotes a shortest distance or spacing between a lower surface of the color separating lens array 130 and an upper surface of the sensor substrate 110, and CRA' denotes an incident angle of light incident on the sensor substrate 110. In addition, CRA' may be determined according to Equation 3 below.

$$CRA' = \sin^{-1}(\sin CRA \times n) \qquad \text{[Equation 3]}$$

In Equation 3, CRA is an incident angle of light incident on the color separating lens array 130, and n denotes an average refractive index of materials arranged between the color separating lens array 130 and the sensor substrate 110. Accordingly, the distance s at which the third region 133 and the fourth region 134 of the color separating lens array 130 are shifted from pixels corresponding thereto may be determined according to the incident angle of the light incident on the color separating lens array 130 and the average refractive index of the materials arranged between the separation lens array 130 and the sensor substrate 110.

Figure 32:
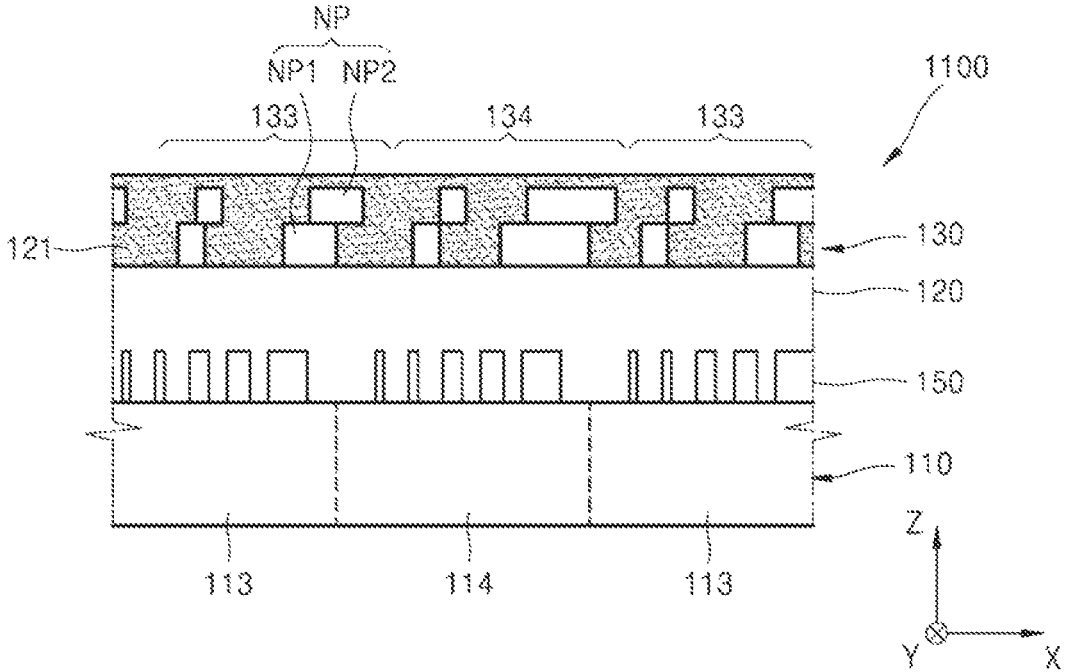
FIG. 32 is a cross-sectional view illustrating a structure of a pixel array of an image sensor according to another example embodiment.

FIG. 32 is a cross-sectional view illustrating a schematic structure of the pixel array 1100 of the image sensor 1000 according to another example embodiment. When the color separating lens array 130 is used, loss due to the color filter layer 140 is reduced, thereby improving the light use efficiency of the image sensor 1000. In addition, when the color separating lens array 130 and the color filter layer 140 are used together, high color purity may be achieved. If sufficient color separation occurs by the color separating lens array 130 to achieve high color purity, as shown in FIG. 32, the color filter layer 140 may be omitted. The configuration shown in FIG. 32 is the same as the configuration shown in FIG. 31 except that the color filter layer 140 is omitted.

Figure 33:
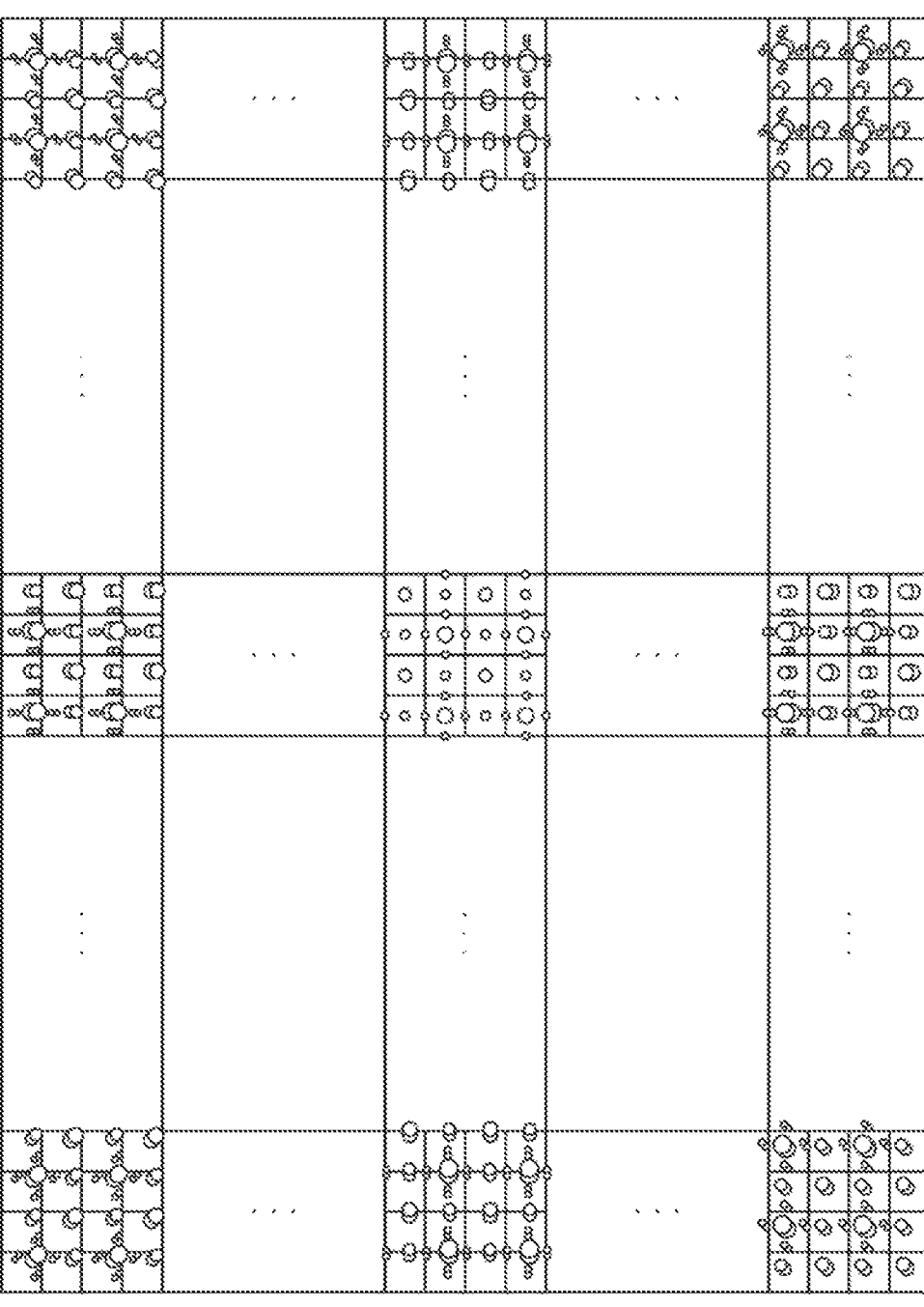
FIG. 33 is a plan view showing an example of a shift shape of nanoposts two-dimensionally arranged in a color separating lens array.

FIG. 33 is a plan view showing an example of a shift shape of the nanoposts NP1 and NP2 two-dimensionally arranged in the color separating lens array 130. Referring to FIG. 33, at the center portion of the pixel array 1100, the second nanopost NP2 of the color separating lens array 130 is not shifted with respect to the first nanopost NP1. At the periphery of the pixel array 1100, the second nanopost NP2 of the color separating lens array 130 is shifted toward the center portion of the pixel array 1100 with respect to the first nanopost NP1. Accordingly, the total area of the color separating lens array 130 may be less than the total area of the pixel array 1100 or the total area of the sensor substrate 110. The total area of the color separating lens array 130 may also be substantially equal to the total area of the planar nanophotonic microlens array 150.

The color separating lens array 130 shown in FIG. 27B is only one example, and various types of color separating lens array 130 may be designed according to the color characteristics of an image sensor, the pixel pitch, the incidence angle of the incident light, etc. In addition, it has been described that the color separating lens array 130 includes a plurality of cylindrical nanoposts NP that are apart from each other, but embodiments are not limited thereto.

Figure 34A:
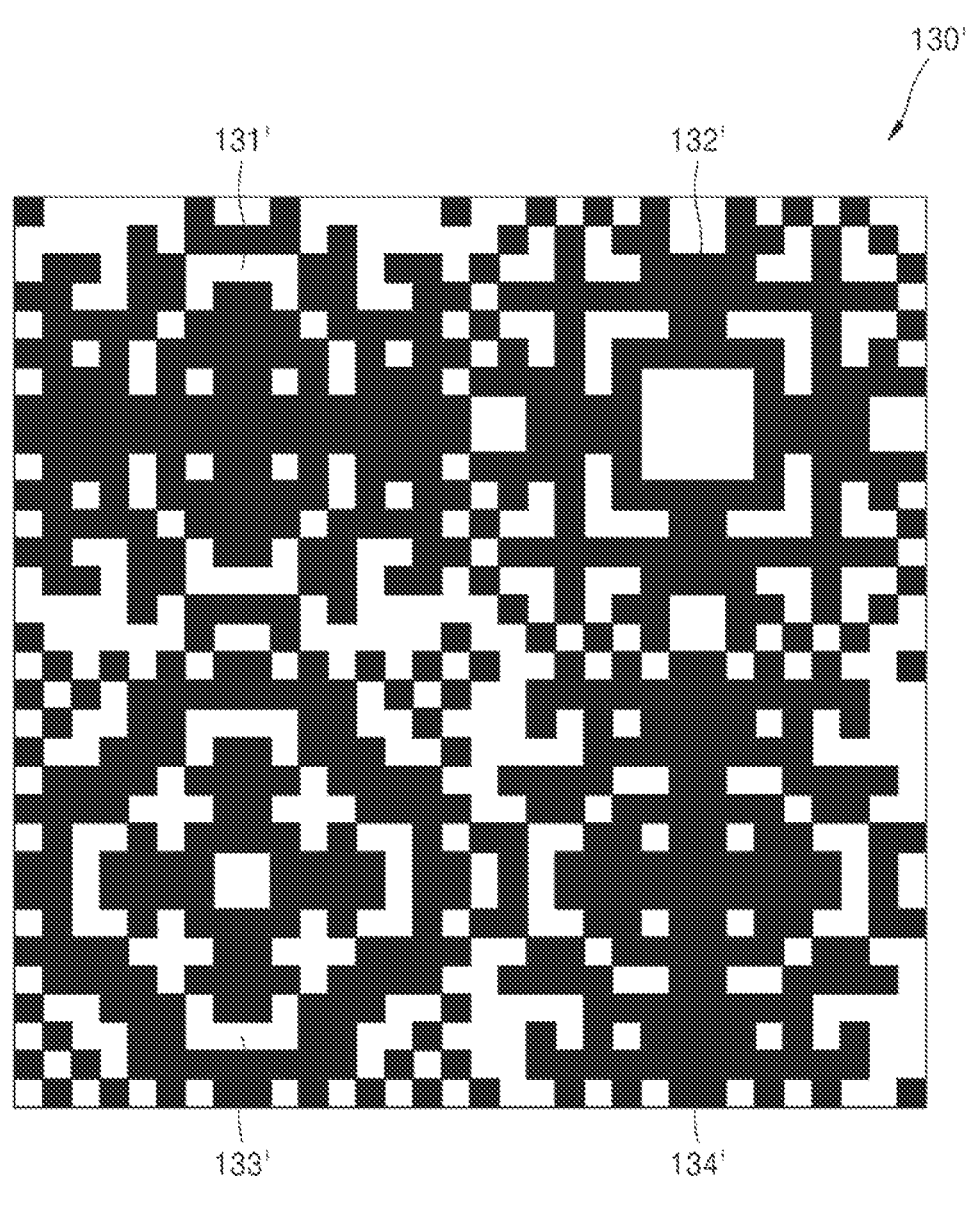
FIGS. 34A and 34B are plan views showing examples of unit patterns of color separating lens arrays according to another example embodiment that may be applied to an image sensor of a Bayer pattern type.
Figure 34A:
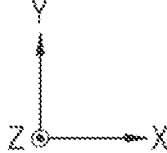
Figure 34B:
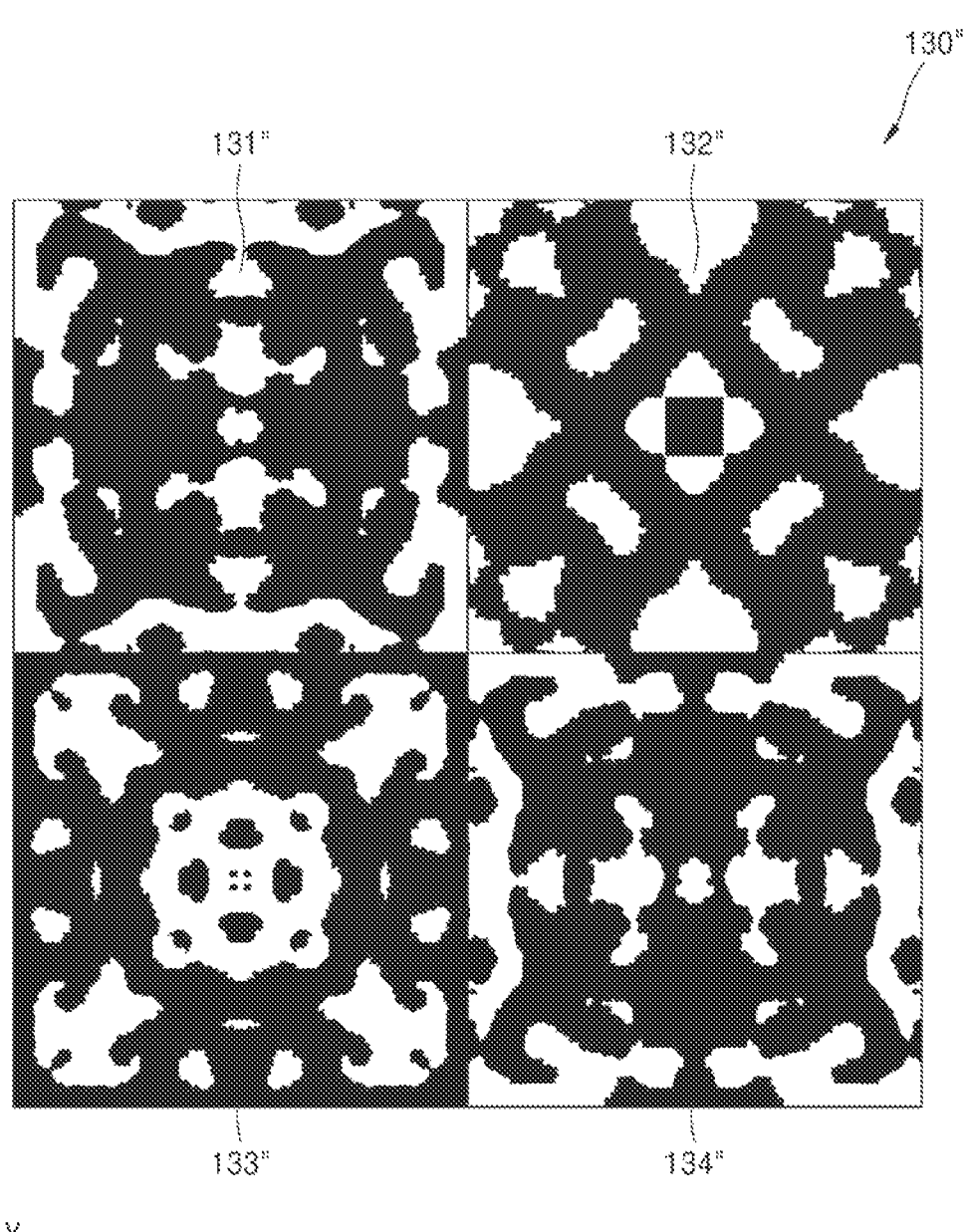
Figure 34B:
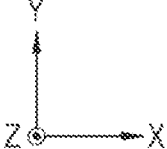

For example, FIGS. 34A and 34B are plan views respectively showing examples of unit patterns of color separating lens arrays 130' and 130" according to another example embodiment that may be applied to an image sensor of a Bayer pattern type. Referring to FIG. 34A, the color separating lens array 130' may include first to fourth regions 131', 132', 133', and 134' in a digitized binary form in a 16×16 rectangular arrangement. The unit pattern of the color separating lens array 130' has a 32×32 rectangular shape. Referring to FIG. 34B, each of first to fourth regions 131", 132", 133", and 134" of the color separating lens array 130" is in the form of a continuous curve that is not digitized. A rule applied to the first to fourth regions 131', 132', 133', 134', 131", 132", 133", and 134" of the color separating lens arrays 130' and 130" shown in FIGS. 34A and 34B is the same as a rule applied to the first to fourth regions 131, 132, 133, and 134 of the color separating lens array 130.

The color separating lens arrays 130' and 130" satisfying the phase profiles and performance of the color separating lens array 130 described above may be automatically designed through various types of computer simulations. For example, the structures of the first to fourth regions 131', 132', 133', 134', 131", 132", 133", and 134" may be optimized through a nature-inspired algorithm such as a genetic algorithm, a particle swarm optimization algorithm, an ant colony optimization algorithm, etc., or a reverse design based on an adjoint optimization algorithm.

The first to fourth patterns of the first to fourth regions 131', 132', 133', 134', 131", 132", 133", and 134" may be optimized while evaluating performances of candidate color separating lens arrays based on evaluation factors such as color separation spectrum, optical efficiency, signal-to-noise ratio, etc. when designing the color separating lens arrays 130' and 130". For example, the patterns of the first to fourth regions 131', 132', 133', 134', 131", 132", 133", and 134" may be optimized in a manner that when a target numerical value of each evaluation factor is determined in advance, the sum of the differences from the target numerical values of evaluation factors is minimized. According to another example embodiment, the performance may be indexed for each evaluation factor, and the patterns of the first to fourth regions 131', 132', 133', 134', 131", 132", 133", and 134" may be optimized so that a value representing the performance may be maximized.

In the image sensor 1000 including the color separating lens arrays 130, 130' and 130" described above, because light loss caused by a color filter, for example, an organic color filter rarely occurs, a sufficient light intensity may be provided to pixels even when sizes of the pixels are reduced. Therefore, an ultra-high resolution, ultra-small, and highly sensitive image sensor having hundreds of millions of pixels or more may be manufactured. Such an ultra-high resolution, ultra-small, and highly sensitive image sensor may be employed in various high-performance optical devices or high-performance electronic devices. For example, the electronic devices may include, for example, smart phones, personal digital assistants (PDAs), laptop computers, personal computers (PCs), a variety of portable devices, electronic devices, surveillance cameras, medical camera, automobiles, Internet of Things (IoT), other mobile or non-mobile computing devices and are not limited thereto.

In addition to the image sensor 1000, the electronic device may further include a processor controlling the image sensor, for example, an application processor (AP), to drive an operating system or an application program through the processor and control a plurality of hardware or software components, and perform various data processing and operations. The processor may further include a graphic processing unit (GPU) and/or an image signal processor. When the processor includes the image signal processor, an image (or video) obtained by the image sensor may be stored and/or output using the processor.

Figure 35:
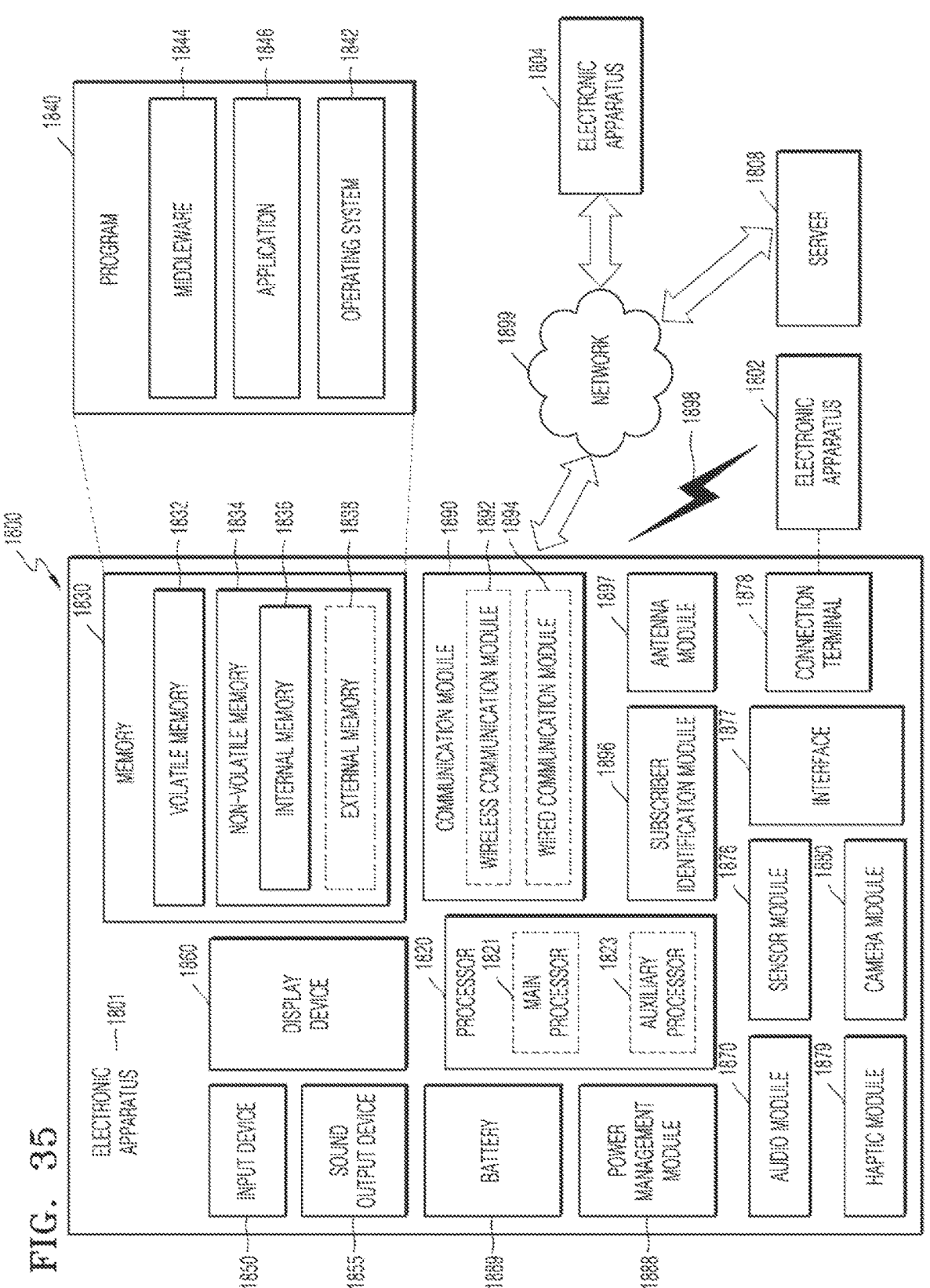
FIG. 35 is a block diagram of an example showing an electronic device including an image sensor according to example embodiments.

FIG. 35 is a block diagram of an example showing an electronic device 1801 including the image sensor 1000 according to an example embodiment. Referring to FIG. 35, in a network environment 1800, the electronic device 1801 may communicate with another electronic device 1802 through a first network 1898 (a short-range wireless communication network, etc.) or communicate with another electronic device 1804 and/or a server 1808 through a second network 1899 (a remote wireless communication network, etc.) The electronic device 1801 may communicate with the electronic device 1804 through the server 1808. The electronic device 1801 may include a processor 1820, a memory 1830, an input device 1850, a sound output device 1855, a display apparatus 1860, an audio module 1870, a sensor module 1876, an interface 1877, a haptic module 1879, a camera module 1880, a power management module 1888, a battery 1889, a communication module 1890, a subscriber identification module 1896, and/or an antenna module 1897. The electronic device 1801 may omit some (the display apparatus 1860, etc.) of the components or may further include other components. One or more of the components may be implemented as an integrated circuit. For example, the sensor module 1876 (a fingerprint sensor, an iris sensor, an illumination sensor, etc.) may be embedded in the display apparatus 1860 (a display, etc.)

The processor 1820 may be configured to execute software (a program 1840, etc.) to control one or a plurality of components (hardware or software components) of the electronic device 1801, the components being connected to the processor 1820, and to perform various data processing or calculations. As part of the data processing or calculations, the processor 1820 may be configured to load a command and/or data received from other components (the sensor module 1876, the communication module 1890, etc.) into the volatile memory 1832, process the command and/or the data stored in a volatile memory 1832, and store resultant data in a nonvolatile memory 1834. The processor 1820 may include a main processor 1821 (a central processing unit (CPU), an application processor (AP), etc.) and an auxiliary processor 1823 (a graphics processing unit (GPU), an image signal processor, a sensor hub processor, a communication processor, etc.) which may independently operate or operate with the main processor 1821. The auxiliary processor 1823 may use less power than the main processor 1821 and may perform specialized functions.

When the main processor 1821 is in an inactive state (a sleep state), the auxiliary processor 1823 may take charge of an operation of controlling functions and/or states related to one or more components (the display apparatus 1860, the sensor module 1876, the communication module 1890, etc.) from among the components of the electronic device 1801, or when the main processor 1821 is in an active state (an application execution state), the auxiliary processor 1823 may perform the same operation along with the main processor 1821. The auxiliary processor 1823 (the image signal processor, the communication processor, etc.) may be realized as part of other functionally-related components (the camera module 1880, the communication module 1890, etc.)

The memory 1830 may store various data required by the components (the processor 1820, the sensor module 1876, etc.) of the electronic device 1801. The data may include, for example, software (the program 1840, etc.), input data and/or output data of a command related to the software. The memory 1830 may include the volatile memory 1832 and/or the nonvolatile memory 1834.

The program 1840 may be stored in the memory 1830 as software, and may include an operating system 1842, middleware 1844, and/or an application 1846.

The input device 1850 may receive a command and/or data to be used by the components (the processor 1820, etc.) of the electronic device 1801 from the outside of the electronic device 1801. The input device 1850 may include a microphone, a mouse, a keyboard, and/or a digital pen (a stylus pen, etc.)

The sound output device 1855 may output a sound signal to the outside of the electronic device 1801. The sound output device 1855 may include a speaker and/or a receiver. The speaker may be used for a general purpose, such as multimedia playing or recording playing, and the receiver may be used to receive an incoming call. The receiver may be coupled to the speaker as part of the speaker or may be realized as a separate device.

The display apparatus 1860 may visually provide information to the outside of the electronic device 1801. The display apparatus 1860 may include a display, a hologram device, or a controlling circuit for controlling a projector and a corresponding device. The display apparatus 1860 may include touch circuitry configured to sense a touch operation and/or sensor circuitry (a pressure sensor, etc.) configured to measure an intensity of a force generated by the touch operation.

The audio module 1870 may convert sound into an electrical signal or an electrical signal into sound. The audio module 1870 may obtain sound via the input device 1850 or may output sound via the sound output device 1855 and/or a speaker and/or a headphone of an electronic device (the electronic device 1802, etc.) directly or wirelessly connected to the electronic device 1801.

The sensor module 1876 may sense an operation state (power, temperature, etc.) of the electronic device 1801 or an external environmental state (a user state, etc.) and generate electrical signals and/or data values corresponding to the sensed state. The sensor module 1876 may include a gesture sensor, a gyro-sensor, an atmospheric sensor, a magnetic sensor, an acceleration sensor, a grip sensor, a proximity sensor, a color sensor, an infrared (IR) sensor, a biometric sensor, a temperature sensor, a humidity sensor, and/or an illumination sensor.

The interface 1877 may support one or a plurality of designated protocols to be used for the electronic device 1801 to be directly or wirelessly connected to another electronic device (the electronic device 1802, etc.) The interface 1877 may include a high-definition multimedia interface (HDMI) interface, a universal serial bus (USB) interface, an SD card interface, and/or an audio interface.

A connection terminal 1878 may include a connector, through which the electronic device 1801 may be physically connected to another electronic device (the electronic device 1802, etc.) The connection terminal 1878 may include an HDMI connector, a USB connector, an SD card connector, and/or an audio connector (a headphone connector, etc.)

A haptic module 1879 may convert an electrical signal into a mechanical stimulus (vibration, motion, etc.) or an electrical stimulus which is recognizable to a user via haptic or motion sensation. The haptic module 1879 may include a motor, a piezoelectric device, and/or an electrical stimulus device.

The camera module 1880 may capture a still image and a video. The camera module 1880 may include a lens assembly including one or a plurality of lenses, the image sensor 1000 of FIG. 1, image signal processors, and/or flashes. The lens assemblies included in the camera module 1880 may collect light emitted from an object, an image of which is to be captured.

The power management module 1888 may manage power supplied to the electronic device 1801. The power management module 8388 may be realized as part of a power management integrated circuit (PMIC).

The battery 1889 may supply power to the components of the electronic device 1801. The battery 1889 may include a non-rechargeable primary battery, rechargeable secondary battery, and/or a fuel battery.

The communication module 1890 may support establishment of direct (wired) communication channels and/or wireless communication channels between the electronic device 1801 and other electronic devices (the electronic device 1802, the electronic device 1804, the server 1808, etc.) and communication performance through the established communication channels. The communication module 1890 may include one or a plurality of communication processors separately operating from the processor 1820 (an application processor, etc.) and supporting direct communication and/or wireless communication. The communication module 1890 may include a wireless communication module 1892 (a cellular communication module, a short-range wireless communication module, a global navigation satellite system (GNSS) communication module, and/or a wired communication module 1894 (a local area network (LAN) communication module, a power line communication module, etc.) From these communication modules, a corresponding communication module may communicate with other electronic devices through a first network 1898 (a short-range wireless communication network, such as Bluetooth, Wifi direct, or infrared data association (IrDa)) or a second network 1899 (a remote communication network, such as a cellular network, the Internet, or a computer network (LAN, WAN, etc.)) Various types of communication modules described above may be integrated as a single component (a single chip, etc.) or realized as a plurality of components (a plurality of chips). The wireless communication module 1892 may identify and authenticate the electronic device 1801 within the first network 1898 and/or the second network 1899 by using subscriber information (international mobile subscriber identification (IMSI), etc.) stored in the subscriber identification module 1896.

The antenna module 1897 may transmit a signal and/or power to the outside (other electronic devices, etc.) or receive the same from the outside. The antenna may include an emitter including a conductive pattern formed on a substrate (a printed circuit board (PCB), etc.) The antenna module 1897 may include an antenna or a plurality of antennas. When the antenna module 1897 includes a plurality of antennas, an appropriate antenna which is suitable for a communication method used in the communication networks, such as the first network 1898 and/or the second network 1899, may be selected. Through the selected antenna, signals and/or power may be transmitted or received between the communication module 1890 and other electronic devices. In addition to the antenna, another component (a radio frequency integrated circuit (RFIC), etc.) may be included in the antenna module 1897.

One or more of the components of the electronic device 1801 may be connected to one another and exchange signals (commands, data, etc.) with one another, through communication methods performed among peripheral devices (a bus, general purpose input and output (GPIO), a serial peripheral interface (SPI), a mobile industry processor interface (MIPI), etc.)

The command or the data may be transmitted or received between the electronic device 1801 and another external electronic device 1804 through the server 1808 connected to the second network 1899. Other electronic devices 1802 and 1804 may be electronic devices that are homogeneous or heterogeneous types with respect to the electronic device 1801. All or part of operations performed in the electronic device 1801 may be performed by one or a plurality of the other electronic devices 1802, 1804, and 1808. For example, when the electronic device 1801 has to perform a function or a service, instead of directly performing the function or the service, the one or a plurality of other electronic devices may be requested to perform part or all of the function or the service. The one or a plurality of other electronic devices receiving the request may perform an additional function or service related to the request and may transmit a result of the execution to the electronic device 1801. To this end, cloud computing, distribution computing, and/or client-server computing techniques may be used.

Figure 36:
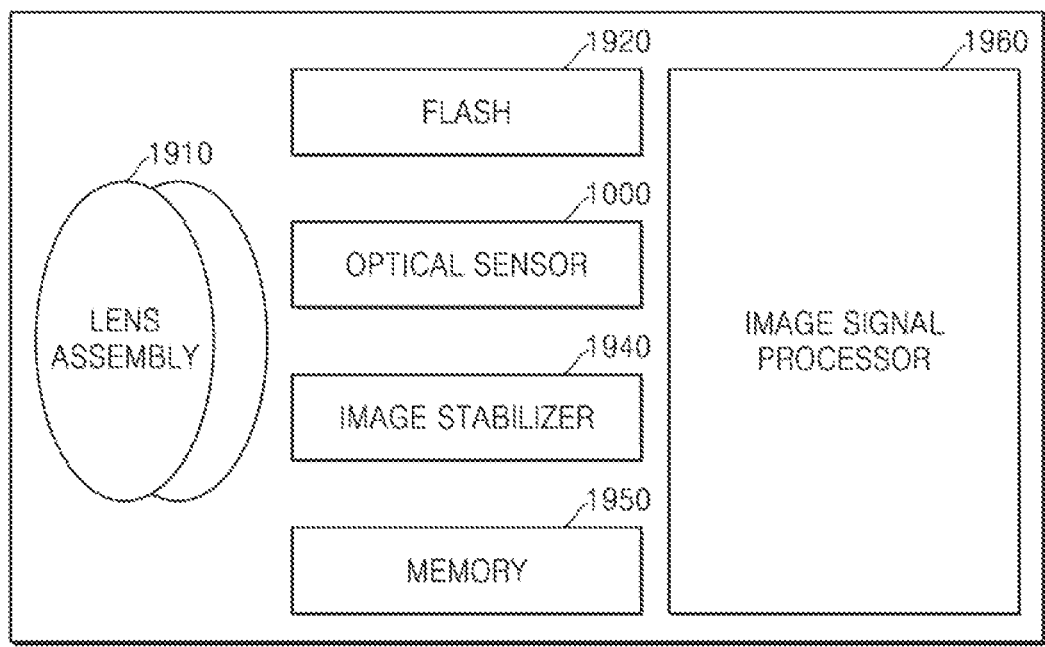
FIG. 36 is a block diagram showing a camera module of FIG. 35.

FIG. 36 is a block diagram showing the camera module 1880 of FIG. 35. Referring to FIG. 36, the camera module 1880 may include a lens assembly 1910, a flash 1920, the image sensor 1000 (see FIG. 1), an image stabilizer 1940, a memory 1950 (a buffer memory, etc.), and/or an image signal processor 1960. The lens assembly 1910 may collect light emitted from an object that is a target of image capture. The camera module 1880 may include a plurality of lens assemblies 1910, and in this case, the camera module 1880 may be a dual camera, a 360 degree camera, or a spherical camera. Some of the plurality of lens assemblies 1910 may have the same lens property (an angle of view, a focal length, AF, a F number, optical zoom, etc.), or may have different lens properties. The lens assembly 1910 may include a wide-angle lens or a telephoto lens.

The flash 1920 may emit light used to enhance light emitted or reflected from an object. The flash 1920 may include one or more light emitting diodes (red-green-blue (RGB) LED, white LED, infrared LED, ultraviolet LED, etc.), and/or a Xenon Lamp. The image sensor 1000 may be the image sensor 1000 described in FIG. 1, and may obtain an image corresponding to the object by converting the light emitted or reflected from the object and transmitted through the lens assembly 1910 into an electrical signal. The image sensor 1000 may include one or a plurality of sensors selected from image sensors having different attributes, such as an RGB sensor, a black and white (BW) sensor, an IR sensor, or a UV sensor. Each of the sensors included in the image sensor 1000 may be implemented as a charged coupled device (CCD) sensor and/or a complementary metal oxide semiconductor (CMOS) sensor.

The image stabilizer 1940 may move one or more lenses included in the lens assembly 1910 or image sensors 1000 in a specific direction in response to the movement of the camera module 1880 or the electronic apparatus 1901 including the camera module 1880 or control the operating characteristics of the image sensor 1000 (adjusting read-out timing, etc.) to compensate for a negative influence due to the movement. The image stabilizer 1940 may use a gyro sensor or an acceleration sensor disposed inside or outside the camera module 1880 to detect the movement of the camera module 1880 or the electronic apparatus 1801. The image stabilizer 1940 may be implemented optically.

The memory 1950 may store part or entire data of an image obtained through the image sensor 1000 for a next image processing operation. For example, when a plurality of images are obtained at high speed, obtained original data (Bayer-Patterned data, high-resolution data, etc.) may be stored in the memory 1950, only low-resolution images may be displayed, and then the original data of a selected (a user selection, etc.) image may be transmitted to the image signal processor 1960. The memory 1950 may be integrated into the memory 1830 of the electronic apparatus 1801, or may be configured as a separate memory that operates independently.

The image signal processor 1960 may perform image processing operations on the image obtained through the image sensor 1000 or the image data stored in the memory 1950. The image processing may include depth map generation, 3D modeling, panorama generation, feature point extraction, image synthesis, and/or image compensation (noise reduction, resolution adjustment, brightness adjustment, blurring, sharpening, softening, etc.) The image signal processor 1960 may perform control (exposure time control, read-out timing control, etc.) of components (the image sensor 1000, etc.) included in the camera module 1880. The image processed by the image signal processor 1960 may be stored again in the memory 1950 for further processing or may be provided to external components (the memory 1830, the display apparatus 1860, the electronic apparatus 1802, the electronic apparatus 1804, the server 1808, etc.) of the camera module 1880. The image signal processor 1960 may be integrated into the processor 1820 or may be configured as a separate processor that operates independently from the processor 1820. When the image signal processor 1960 is configured as the processor separate from the processor 1820, the image processed by the image signal processor 1960 may undergo additional image processing by the processor 1820 and then be displayed through the display apparatus 1860.

The electronic apparatus 1801 may include the plurality of camera modules 1880 having different properties or functions. In this case, one of the plurality of camera modules 1880 may be a wide-angle camera, and the other may be a telephoto camera. Similarly, one of the plurality of camera modules 1880 may be a front camera and the other may be a rear camera.

Figure 37:
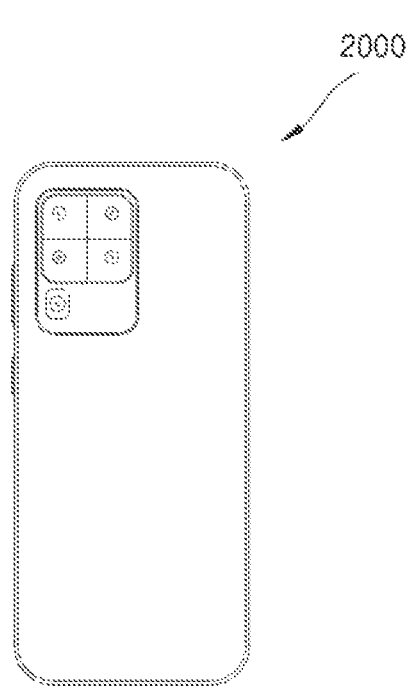
FIGS. 37, 38, 39, 40, 41, 42, 43, 44, 45, and 46 show various examples of electronic devices to which image sensors are applied according to example embodiments.
Figure 38:
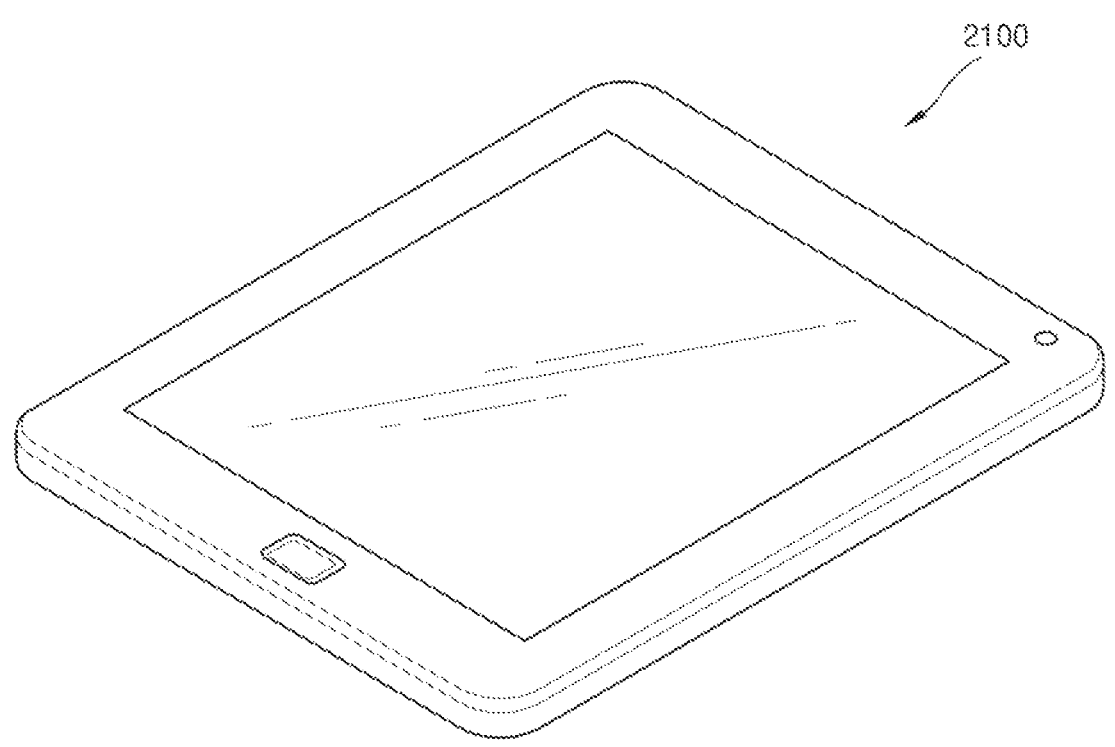
Figure 39:
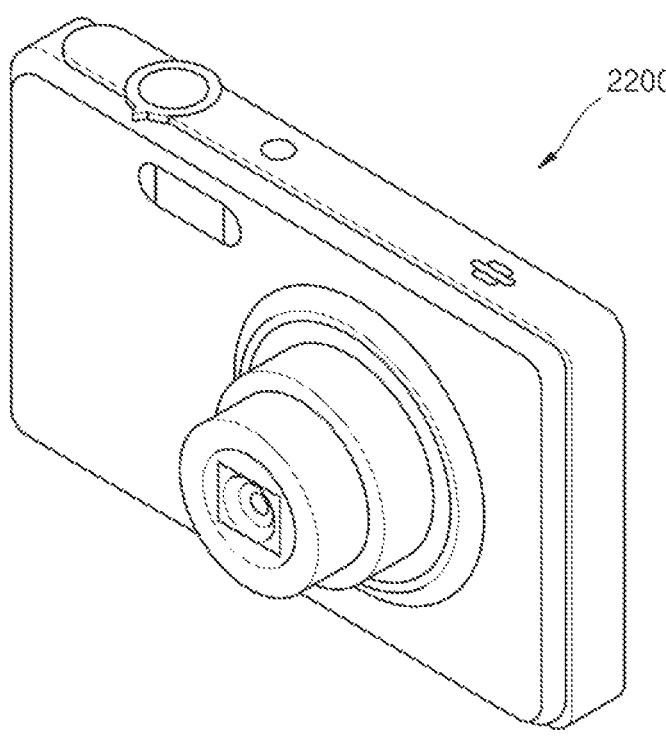
Figure 40:
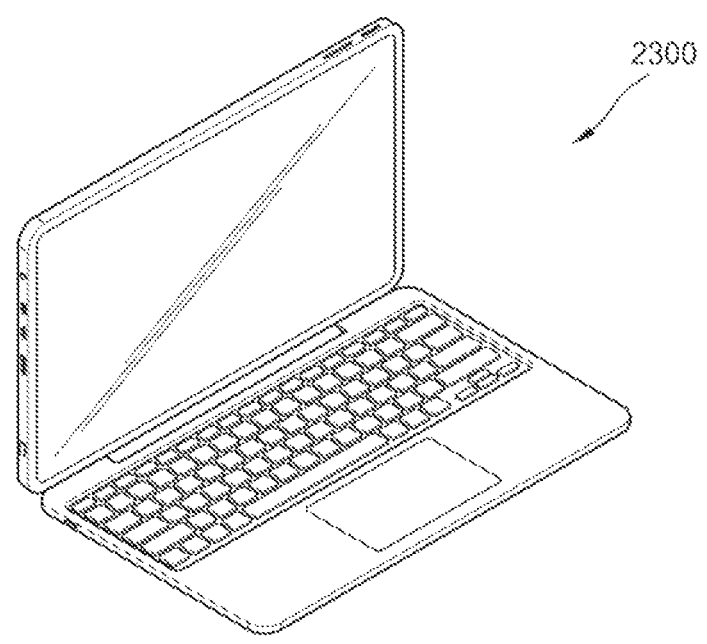
Figure 41:
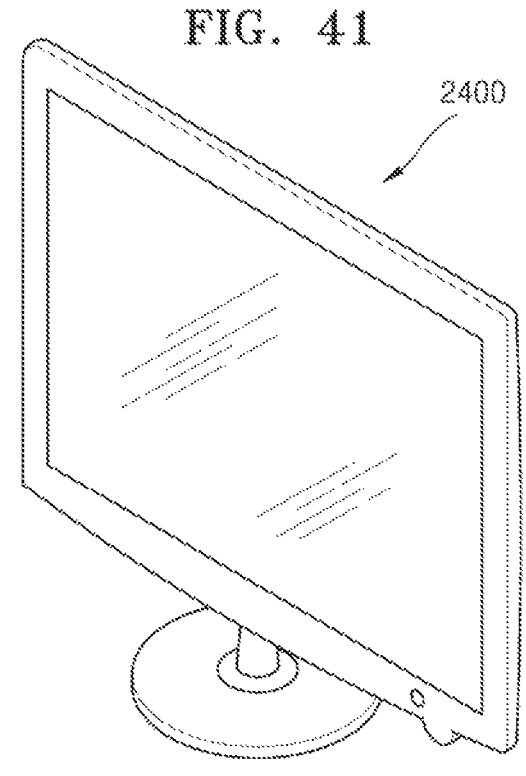

The image sensor 1000 according to the example embodiments may be applied to the mobile phone or a smartphone 2000 shown in FIG. 37, a tablet or a smart tablet 2100 shown in FIG. 38, a digital camera or a camcorder 2200 shown in FIG. 39, a laptop computer 2300 shown in FIG. 40, or a television or a smart television 2400 shown in FIG. 41, etc. For example, the smartphone 2000 or the smart tablet 2100 may include a plurality of high-resolution cameras each including a high-resolution image sensor. Depth information of objects in an image may be extracted, out condensing of the image may be adjusted, or objects in the image may be automatically identified by using the high-resolution cameras.

Figure 42:
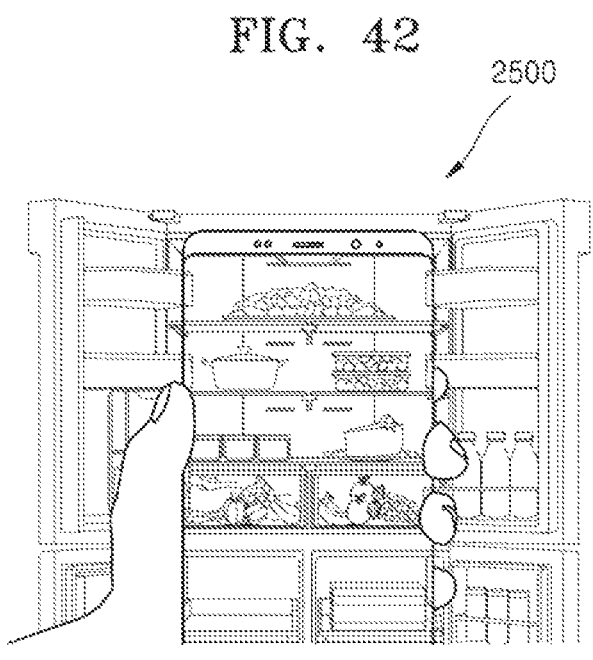
Figure 43:
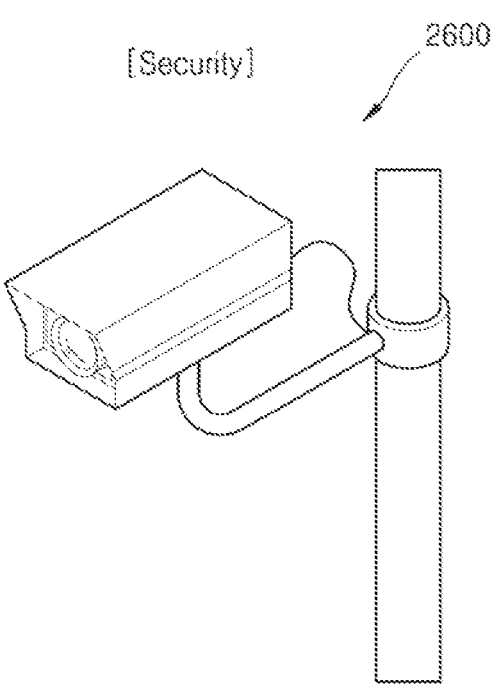
Figure 44:
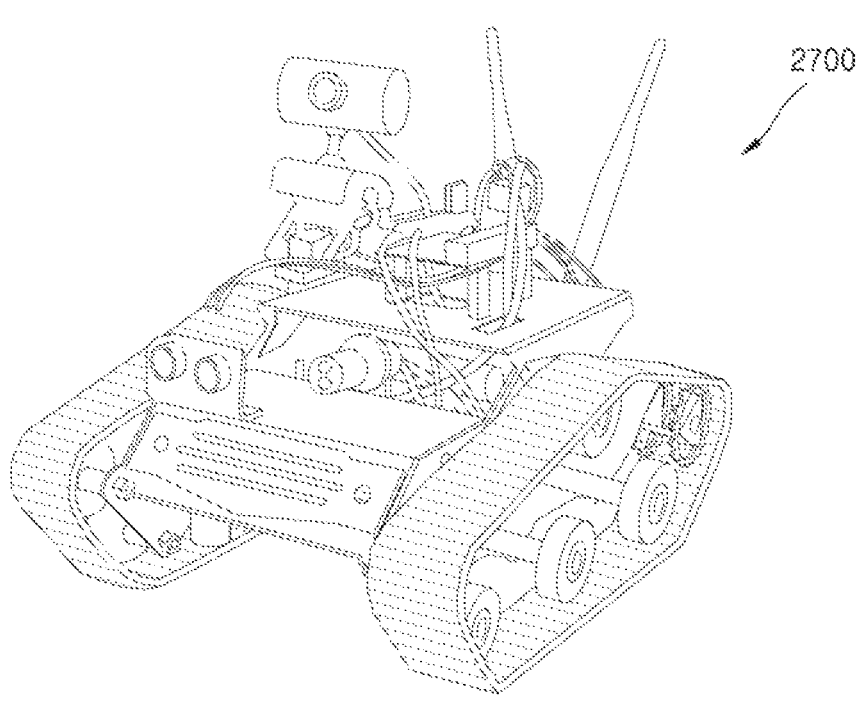
Figure 45:
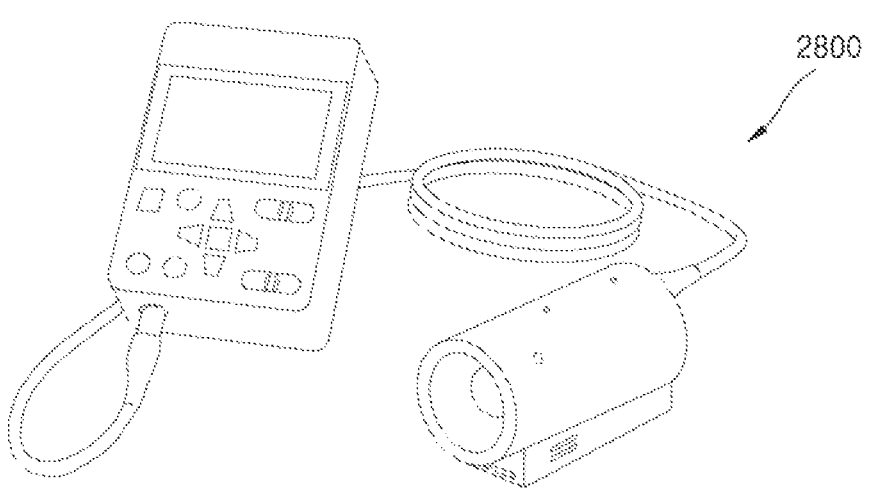

The image sensor 1000 may also be applied to a smart refrigerator 2500 shown in FIG. 42, a surveillance camera 2600 shown in FIG. 43, a robot 2700 shown in FIG. 44, a medical camera 2800 shown in FIG. 45, etc. For example, the smart refrigerator 2500 may automatically recognize food in the refrigerator by using the image sensor, and may notify the user of an existence of a certain kind of food, kinds of food put into or taken out, etc. through a smartphone. The surveillance camera 2600 may also provide an ultra-high-resolution image and may allow the user to recognize an object or a person in the image even in dark environment by using high sensitivity. The robot 2700 may be input to a disaster or industrial site that a person may not directly access, to provide the user with high-resolution images. The medical camera 2800 may provide high-resolution images for diagnosis or surgery, and may dynamically adjust a field of view.

Figure 46:
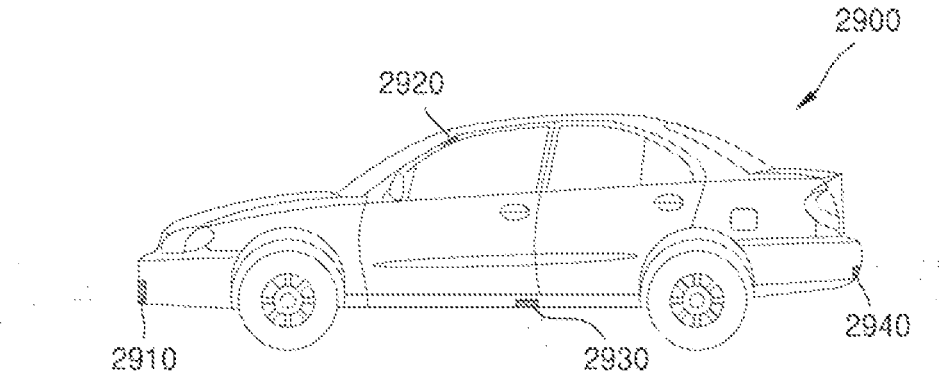

The image sensor may also be applied to a vehicle 2900 as shown in FIG. 46. The vehicle 2900 may include a plurality of vehicle cameras 2910, 2920, 2930, and 2940 arranged on various positions. Each of the vehicle cameras 2910, 2920, 2930, and 2940 may include the image sensor according to the embodiment. The vehicle 2900 may provide a driver with various information about the interior of the vehicle 2900 or the periphery of the vehicle 2900 by using the plurality of vehicle cameras 2910, 2920, 2930, and 2940, and may provide the driver with the information necessary for the autonomous travel by automatically recognizing an object or a person in the image.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:
   a sensor substrate comprising a plurality of light sensing cells configured to sense light; and
   a planar nanophotonic microlens array comprising a plurality of planar nanophotonic microlenses having a nanopattern structure configured to condense light to a corresponding light sensing cell among the plurality of light sensing cells,
   wherein each of the plurality of planar nanophotonic microlenses comprises a high refractive index nanostructure comprising a first dielectric material having a first refractive index and a low refractive index nanostructure comprising a second dielectric material having a second refractive index that is lower than the first refractive index,
   wherein an effective refractive index of each of the plurality of planar nanophotonic microlenses corresponding to a ratio of the high refractive index nanostructure to the low refractive index nanostructure is greatest in a refractive index peak region of each of the plurality of planar nanophotonic microlenses and gradually decreases toward a periphery of the refractive index peak region,
   wherein each of the plurality of planar nanophotonic microlenses comprises a first layer and a second layer provided on the first layer in a vertical direction, and a pattern of a high refractive index nanostructure and a pattern of a low refractive index nanostructure in the first layer are different from a pattern of a high refractive index nanostructure and a pattern of a low refractive index nanostructure in the second layer, and
   wherein a width of the high refractive index nanostructure in the second layer is less than a width of the high refractive index nanostructure of the first layer in a region other than the refractive index peak region in a horizontal direction, the width of the high refractive index nanostructure in the second layer gradually decreasing toward the periphery of each of the planar nanophotonic microlenses.

2. The image sensor of claim 1, wherein a boundary between the plurality of planar nanophotonic microlenses coincides with a boundary between corresponding light sensing cells at a center portion of the planar nanophotonic microlens array.

3. The image sensor of claim 1, wherein each of the plurality of planar nanophotonic microlenses at the periphery of the planar nanophotonic microlens array is shifted toward a center portion of the planar nanophotonic microlens array, and
   wherein a distance at which each of the plurality of planar nanophotonic microlenses is shifted toward the center portion of the planar nanophotonic microlens array increases as a distance of each of the plurality of planar nanophotonic microlenses from the center portion of the planar nanophotonic microlens array increases at the periphery of the planar nanophotonic microlens array.

4. The image sensor of claim 1, wherein the refractive index peak region of each of the plurality of planar nanophotonic microlenses at a center portion of the planar nanophotonic microlens array is provided at the center portion of each of the plurality of planar nanophotonic microlenses at the center portion of the planar nanophotonic microlens array.

5. The image sensor of claim 4, wherein the refractive index peak region of each of the plurality of planar nanophotonic microlenses at the periphery of the planar nanophotonic microlens array is shifted toward the center portion of the planar nanophotonic microlens array.

6. The image sensor of claim 5, wherein a distance at which the refractive index peak region of each of the plurality of planar nanophotonic microlenses at the periphery of the planar nanophotonic microlens array is shifted toward the center portion of the planar nanophotonic microlens array increases as a distance of each of the plurality of planar nanophotonic microlenses from the center portion of the planar nanophotonic microlens array increases.

7. The image sensor of claim 1, wherein each of the plurality of planar nanophotonic microlenses comprises:

a first region having a first effective refractive index;

a second region provided adjacent to the first region and having a second effective refractive index that is lower than the first effective refractive index of the first region; and a third region provided adjacent to the second region and having a third effective refractive index that is lower than the second effective refractive index of the second region, and wherein the first region, the second region, and the third region are arranged in concentric circle shapes.

8. The image sensor of claim 1, wherein each of the plurality of planar nanophotonic microlenses at a center portion of the planar nanophotonic microlens array has a symmetrical effective refractive index distribution with respect to the center portion, and each of the plurality of planar nanophotonic microlenses at the periphery of the planar nanophotonic microlens array has an asymmetrical effective refractive index distribution with respect to the center portion.

9. The image sensor of claim 1, wherein a total area of the plurality of planar nanophotonic microlenses is less than a total area of the sensor substrate.

10. The image sensor of claim 1, wherein each of the plurality of planar nanophotonic microlenses comprises a plurality of high refractive index nanostructures and a plurality of low refractive index nanostructures alternately provided with each other in a concentric circle shape, and a width of each of the plurality of high refractive index nanostructures in a diameter direction is greatest in the refractive index peak region.

11. The image sensor of claim 1, wherein each of the plurality of planar nanophotonic microlenses comprises a plurality of high refractive index nanostructures having a nanopost shape, and a proportion of the plurality of high refractive index nanostructures is greatest in the refractive index peak region.

12. The image sensor of claim 1, wherein each of the plurality of planar nanophotonic microlenses comprises a plurality of high refractive index nanostructures having an arc shape split in a circumferential direction.

13. The image sensor of claim 1, wherein each of the plurality of planar nanophotonic microlenses comprises one high refractive index nanostructure having a flat plate shape and a plurality of low refractive index nanostructures having a hole shape.

14. The image sensor of claim 1, wherein a width of the high refractive index nanostructure in the first layer and a width of the high refractive index nanostructure in the second layer in the horizontal direction are the same in the refractive index peak region of each of the plurality of planar nanophotonic microlenses.

15. The image sensor of claim 1, further comprising a spherical microlens provided on each of the plurality of planar nanophotonic microlenses.

16. The image sensor of claim 15, wherein the refractive index peak region of each of the plurality of planar nanophotonic microlenses and an optical axis of the spherical microlens that correspond to each other are aligned to coincide with each other at a center portion of the planar nanophotonic microlens array.

17. The image sensor of claim 15, wherein the spherical microlens at the periphery of the planar nanophotonic microlens array is shifted toward a center portion of the planar nanophotonic microlens array with respect to a corresponding planar nanophotonic microlens.

18. The image sensor of claim 17, wherein the refractive index peak region of each of the plurality of planar nanophotonic microlenses at the periphery of the planar nanophotonic microlens array is positioned at a center of each of the plurality of planar nanophotonic microlenses.

19. The image sensor of claim 1, further comprising a transparent dielectric layer provided between the sensor substrate and the planar nanophotonic microlens array, a thickness of the transparent dielectric layer increasing from a center portion of the planar nanophotonic microlens array to the periphery of the planar nanophotonic microlens array.

20. The image sensor of claim 19, wherein the transparent dielectric layer has an inclined upper surface such that the thickness of the transparent dielectric layer gradually increases from the center portion of the planar nanophotonic microlens array to the periphery of the planar nanophotonic microlens array, and the plurality of planar nanophotonic microlenses are provided at an angle on the inclined upper surface of the transparent dielectric layer.

21. The image sensor of claim 19, wherein the transparent dielectric layer has a stair shape in which the thickness of the transparent dielectric layer discontinuously increases from the center portion of the planar nanophotonic microlens array to the periphery of the planar nanophotonic microlens array.

22. The image sensor of claim 1, wherein a thickness of a transparent spacer layer increases from a center portion of the planar nanophotonic microlens array to the periphery of the planar nanophotonic microlens array.

23. The image sensor of claim 1, further comprising a spherical microlens array comprising a plurality of spherical microlenses provided at a center portion of the planar nanophotonic microlens array, wherein the plurality of planar nanophotonic microlenses is not provided at the center portion of the planar nanophotonic microlens array.

24. The image sensor of claim 23, wherein the spherical microlens array and the planar nanophotonic microlens array are provided on a same plane.

25. The image sensor of claim 23, wherein the low refractive index nanostructure is provided at the center portion of the planar nanophotonic microlens array, and the spherical microlens array is provided on the low refractive index nanostructure at the center portion of the planar nanophotonic microlens array.

26. The image sensor of claim 1, further comprising a color filter layer provided on the sensor substrate, wherein the color filter layer comprises a plurality of color filters configured to transmit light of a specific wavelength band and absorb or reflect light of wavelength bands other than the specific wavelength band, and wherein the planar nanophotonic microlens array is provided on the color filter layer.

27. The image sensor of claim 1, further comprising:

a transparent spacer layer provided on the planar nanophotonic microlens array; and a color separating lens array provided on the transparent spacer layer, wherein the color separating lens array is configured to change a phase of a first light of a first wavelength and a phase of a second light of a second wavelength of incident light, the first light and the second light being different from each other, such that the first light of the first wavelength and the second light of the second wavelength propagate in different directions to condense the first light of the first wavelength to a first light sensing cell among the plurality of light sensing cells and condense the second light of the second wavelength to a second light sensing cell different from the first light sensing cell among the plurality of light sensing cells.

28. An electronic device comprising:

an image sensor configured to convert an optical image into an electrical signal; and a processor configured to control an operation of the image sensor, and to store and output a signal generated by the image sensor, wherein the image sensor comprises:

a sensor substrate comprising a plurality of light sensing cells configured to sense light;

a planar nanophotonic microlens array comprising a plurality of planar nanophotonic microlenses having a nanopattern structure configured to condense light a corresponding light sensing cell among the plurality of light sensing cells;

a transparent spacer layer provided on the planar nanophotonic microlens array such that the planar nanophotonic microlens array is provided between the sensor substrate and the transparent spacer layer; and a color separating lens array provided on the transparent spacer layer, wherein each of the plurality of planar nanophotonic microlenses comprises a high refractive index nanostructure comprising a first dielectric material having a first refractive index and a low refractive index nanostructure comprising a second dielectric material having a second refractive index that is lower than the first refractive index, wherein an effective refractive index of each of the plurality of planar nanophotonic microlenses corresponding to a ratio of the high refractive index nanostructure to the low refractive index nanostructure is greatest in a refractive index peak region of each of the plurality of planar nanophotonic microlenses and gradually decreases toward a periphery of the refractive index peak region, and wherein each of the plurality of planar nanophotonic microlenses at a periphery of the planar nanophotonic microlens array is shifted toward a center portion of the planar nanophotonic microlens array.

29. An image sensor comprising:

a sensor substrate comprising a plurality of light sensing cells configured to sense light;

a planar nanophotonic microlens array comprising a plurality of planar nanophotonic microlenses having a nanopattern structure configured to condense light to a corresponding light sensing cell among the plurality of light sensing cells; and a transparent spacer layer provided on the planar nanophotonic microlens array such that the planar nanophotonic microlens array is provided between the sensor substrate and the transparent spacer layer, wherein each of the plurality of planar nanophotonic microlenses comprises a high refractive index nanostructure comprising a first dielectric material having a first refractive index and a low refractive index nanostructure comprising a second dielectric material having a second refractive index that is lower than the first refractive index, wherein an effective refractive index of each of the plurality of planar nanophotonic microlenses corresponding to a ratio of the high refractive index nanostructure to the low refractive index nanostructure is greatest in a refractive index peak region of each of the plurality of planar nanophotonic microlenses and gradually decreases toward a periphery of the refractive index peak region, wherein each of the plurality of planar nanophotonic microlenses at a periphery of the planar nanophotonic microlens array is shifted toward a center portion of the planar nanophotonic microlens array, wherein the refractive index peak region of each of the plurality of planar nanophotonic microlenses at the periphery of the planar nanophotonic microlens array is shifted toward the center portion of the planar nanophotonic microlens array, and wherein a thickness of the transparent spacer layer increases from the center portion of the planar nanophotonic microlens array to the periphery of the planar nanophotonic microlens array.

* * * * *